(12) United States Patent
Zi et al.

(10) Patent No.: US 12,174,540 B2
(45) Date of Patent: Dec. 24, 2024

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: An-Ren Zi, Hsinchu (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 185 days.

(21) Appl. No.: 17/482,112

(22) Filed: Sep. 22, 2021

(65) Prior Publication Data

US 2022/0291587 A1    Sep. 15, 2022

Related U.S. Application Data

(60) Provisional application No. 63/159,333, filed on Mar. 10, 2021.

(51) Int. Cl.
| | |
|---|---|
| G03F 7/09 | (2006.01) |
| G03F 7/004 | (2006.01) |
| G03F 7/105 | (2006.01) |
| G03F 7/11 | (2006.01) |
| H01L 21/027 | (2006.01) |
| H01L 21/308 | (2006.01) |

(52) U.S. Cl.
CPC ............ *G03F 7/094* (2013.01); *G03F 7/0045* (2013.01); *G03F 7/105* (2013.01); *G03F 7/11* (2013.01); *H01L 21/0276* (2013.01); *H01L 21/3086* (2013.01); *H01L 21/3081* (2013.01)

(58) Field of Classification Search
None
See application file for complete search history.

(56) References Cited

U.S. PATENT DOCUMENTS

| | | | |
|---|---|---|---|
| 6,664,025 B2 * | 12/2003 | Baumann | ................. G03F 7/00 430/947 |
| 8,796,666 B1 | 8/2014 | Huang et al. | |
| 9,093,530 B2 | 7/2015 | Huang et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 9,857,684 B2 | 1/2018 | Lin et al. | |

(Continued)

FOREIGN PATENT DOCUMENTS

| | | |
|---|---|---|
| CN | 110874016 A | 3/2020 |
| TW | 202018424 A | 5/2020 |

(Continued)

*Primary Examiner* — Sean M DeGuire
*Assistant Examiner* — Andrew Preston Traywick
(74) *Attorney, Agent, or Firm* — STUDEBAKER & BRACKETT PC

(57) ABSTRACT

A method for manufacturing a semiconductor device includes forming a resist structure including forming a resist layer including a resist composition over a substrate. After forming the resist layer, the resist layer is treated with an additive. The additive is one or more selected from the group consisting of a radical inhibitor, a thermal radical initiator, and a photo radical initiator.

20 Claims, 45 Drawing Sheets

(56) References Cited

U.S. PATENT DOCUMENTS

| | | |
|---|---|---|
| 9,859,206 B2 | 1/2018 | Yu et al. |
| 9,875,892 B2 | 1/2018 | Chang et al. |
| 10,073,347 B1 * | 9/2018 | Zi .................... H01L 21/6715 |
| 11,215,924 B2 | 1/2022 | Zi et al. |
| 11,605,538 B2 | 3/2023 | Zi et al. |
| 2003/0180635 A1 | 9/2003 | Baumann et al. |
| 2007/0092829 A1 * | 4/2007 | Noelscher ............ G03F 7/0035 430/270.1 |
| 2013/0224957 A1 * | 8/2013 | Kanno .................... G03F 7/11 257/632 |
| 2019/0264076 A1 * | 8/2019 | Tanabe .................... G03F 7/11 |
| 2020/0073238 A1 * | 3/2020 | Zi ............................ G03F 7/039 |
| 2020/0174374 A1 | 6/2020 | Liao et al. |
| 2021/0013034 A1 * | 1/2021 | Wu ........................ G03F 7/167 |
| 2021/0216016 A1 | 7/2021 | Tagawa |

FOREIGN PATENT DOCUMENTS

| | | |
|---|---|---|
| TW | 202024221 A | 7/2020 |
| TW | 202038011 A | 10/2020 |

\* cited by examiner

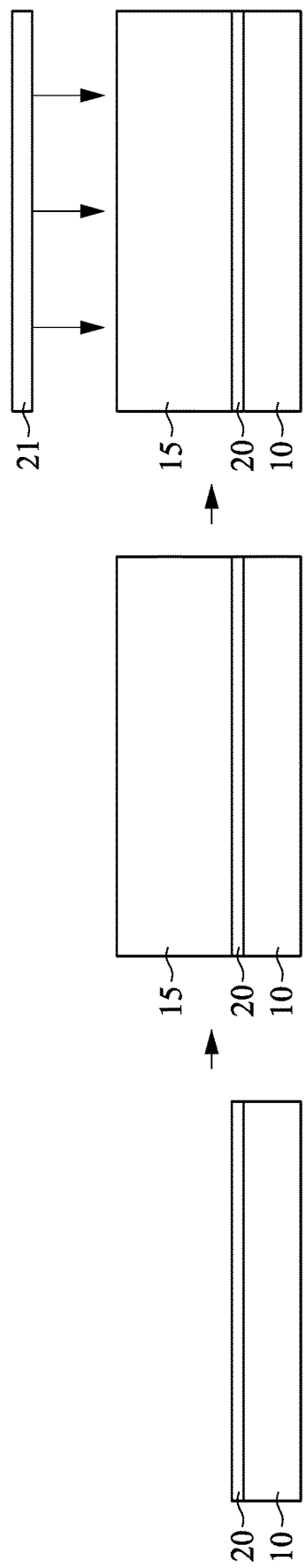

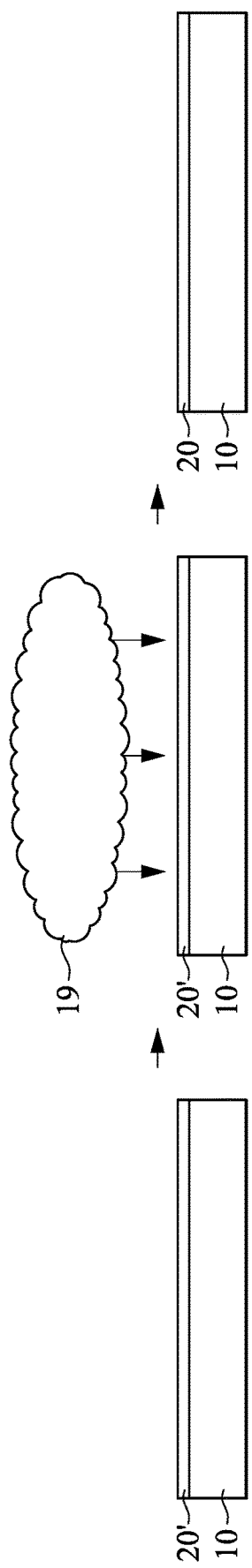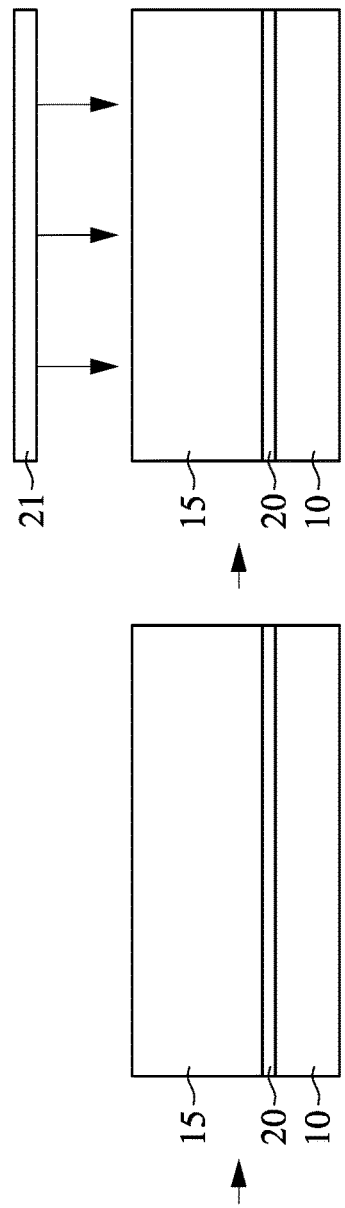

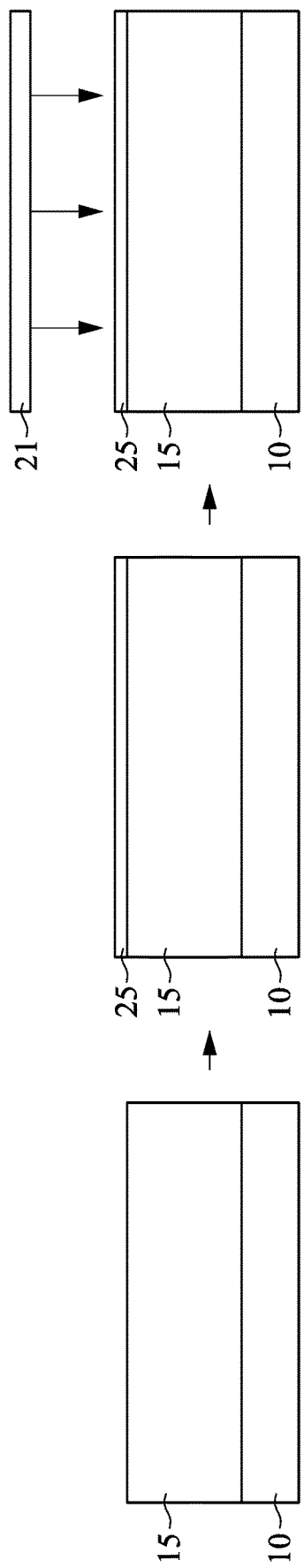

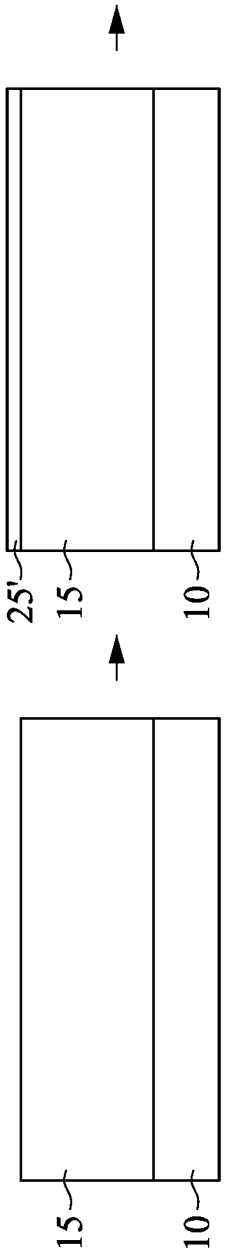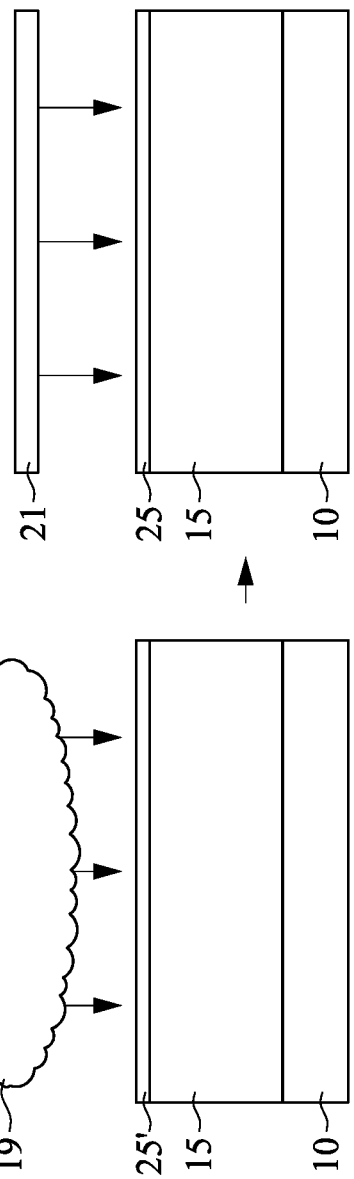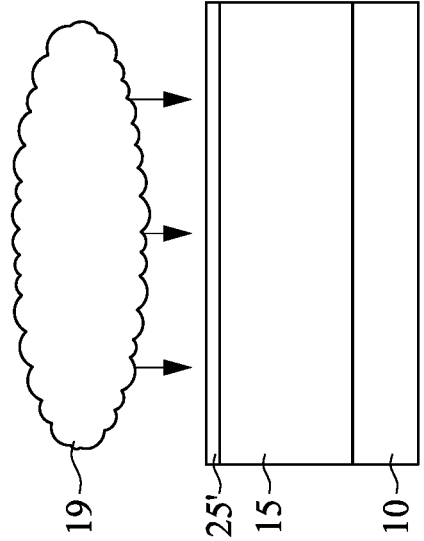

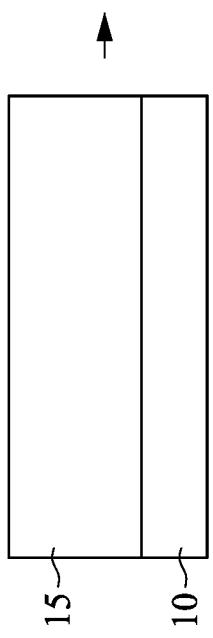
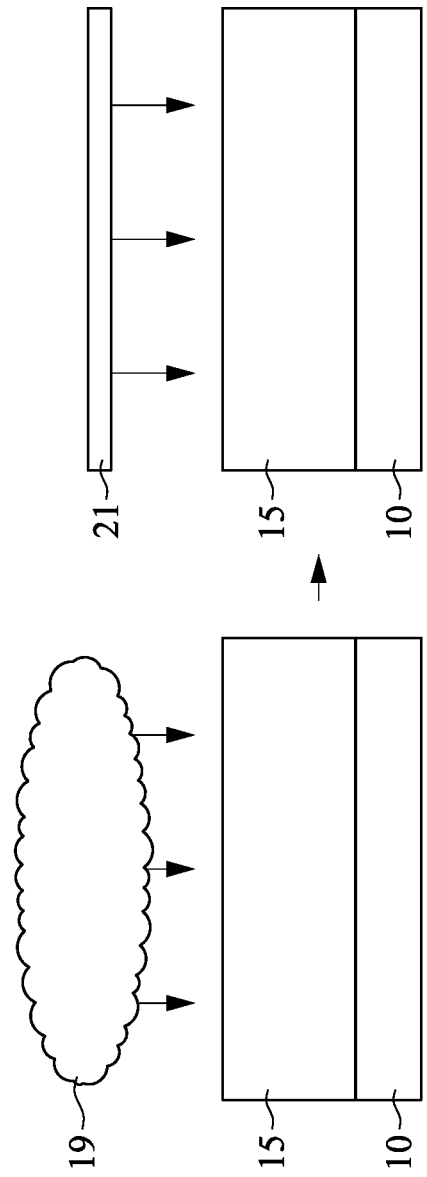
Fig. 11A
Fig. 11B
Fig. 11C

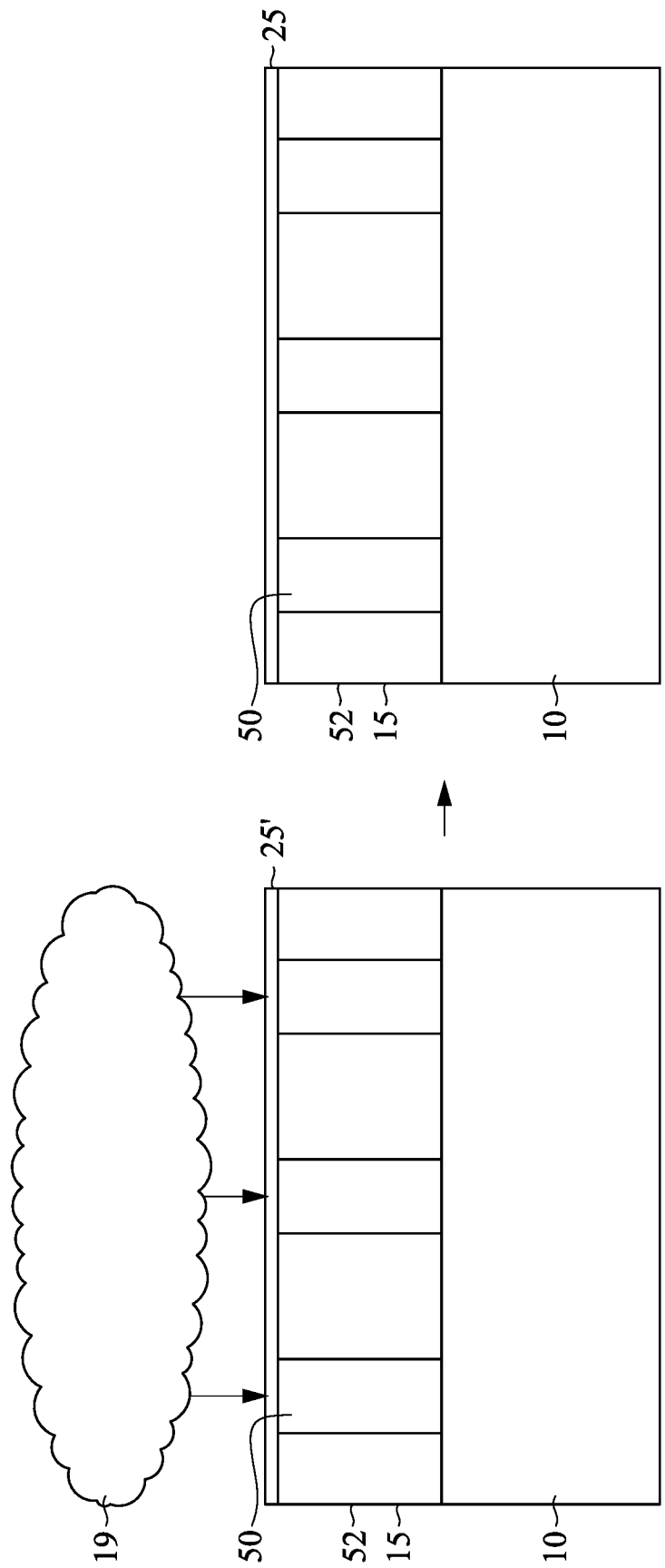

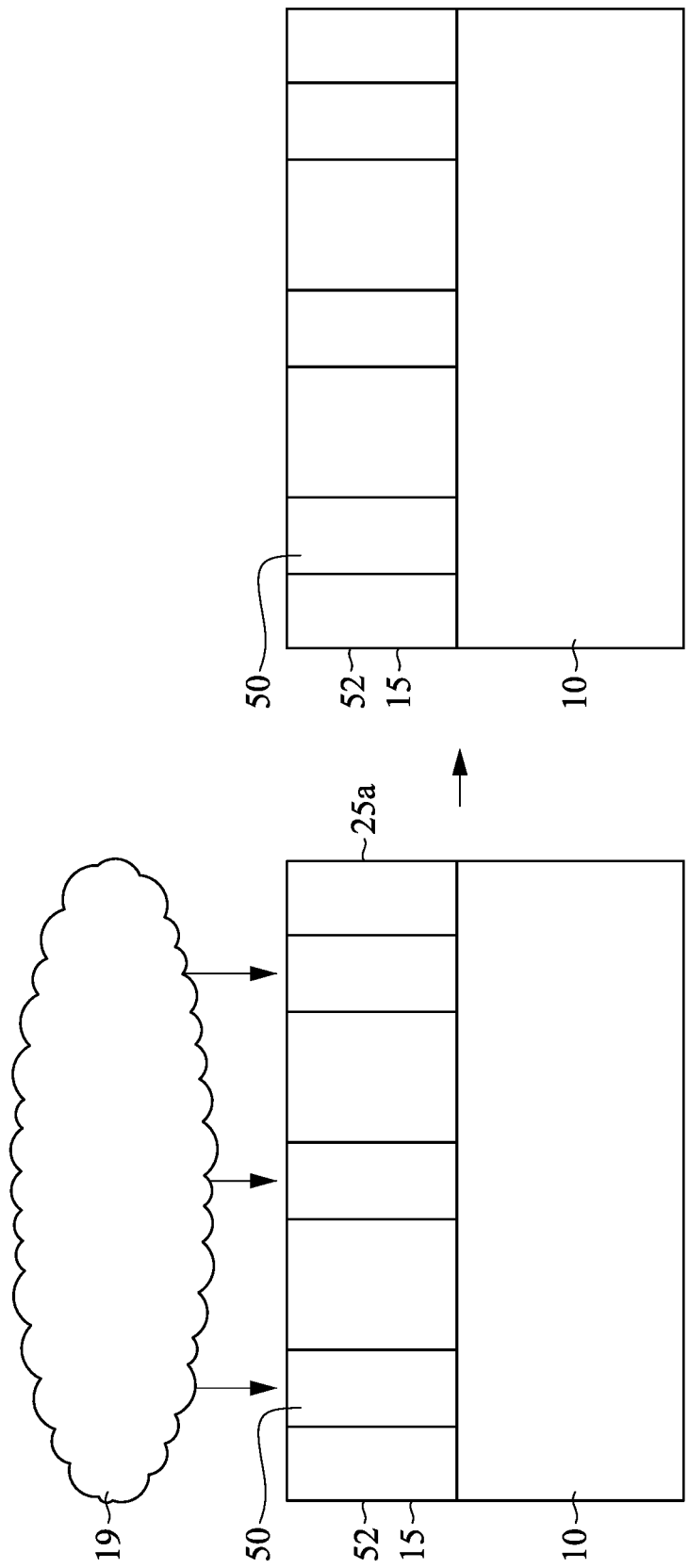

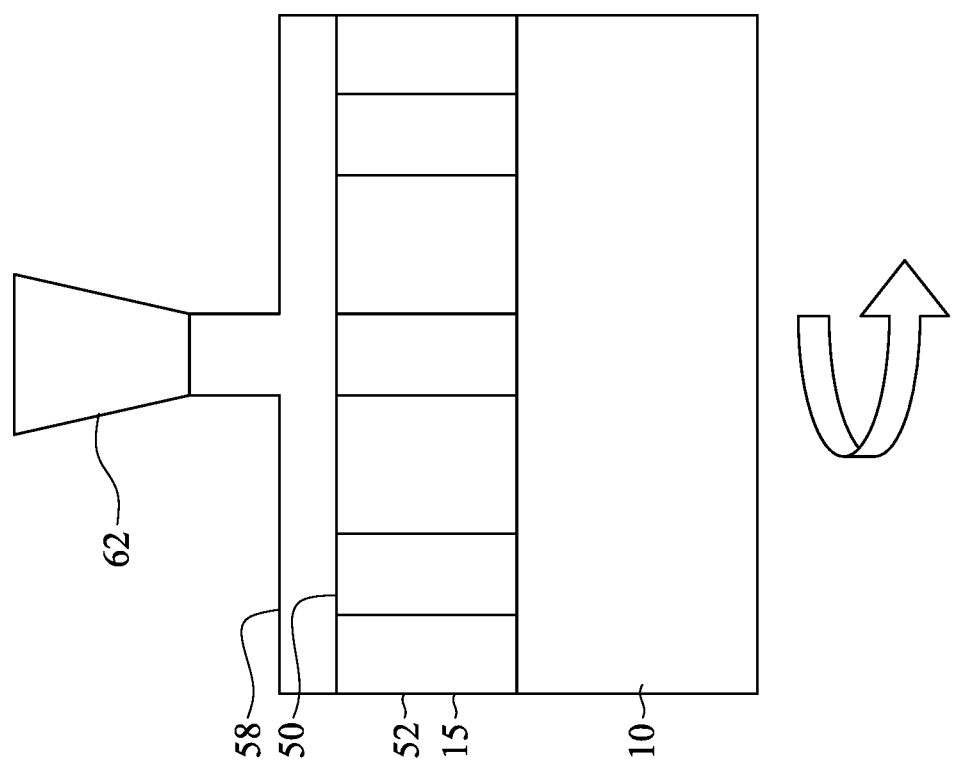

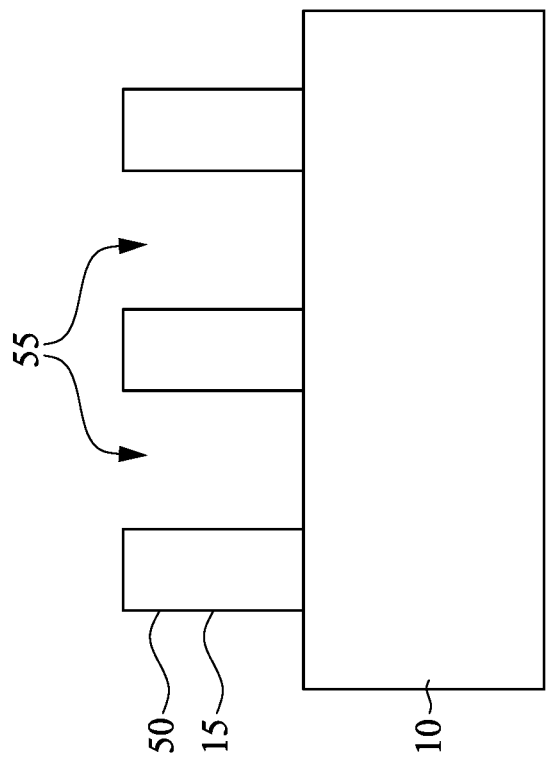
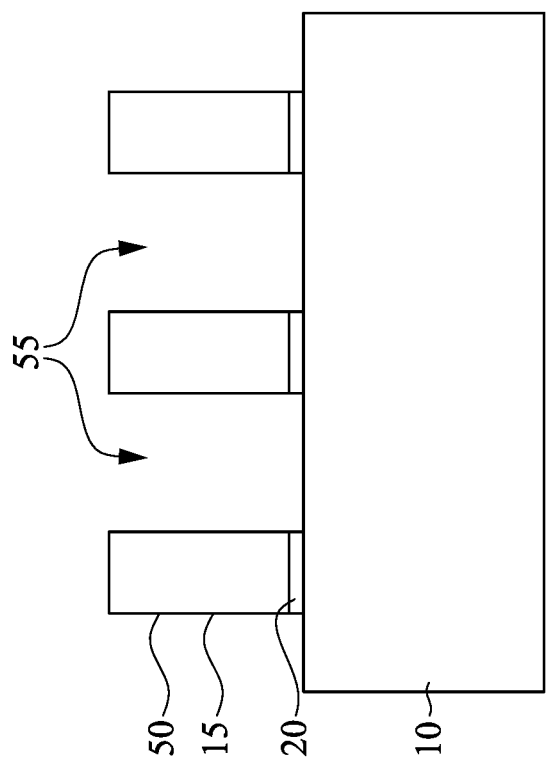
Fig. 18A
Fig. 18B

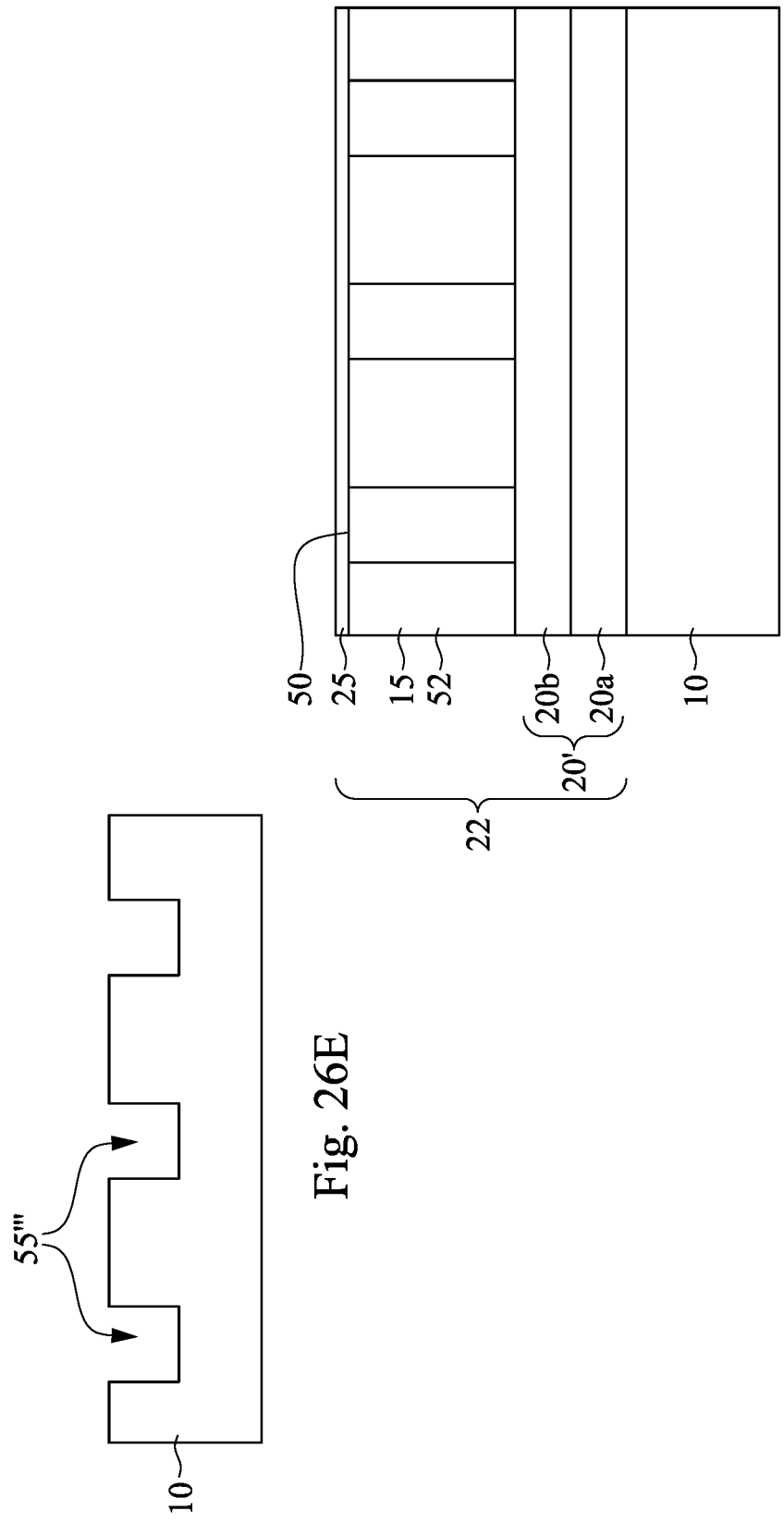

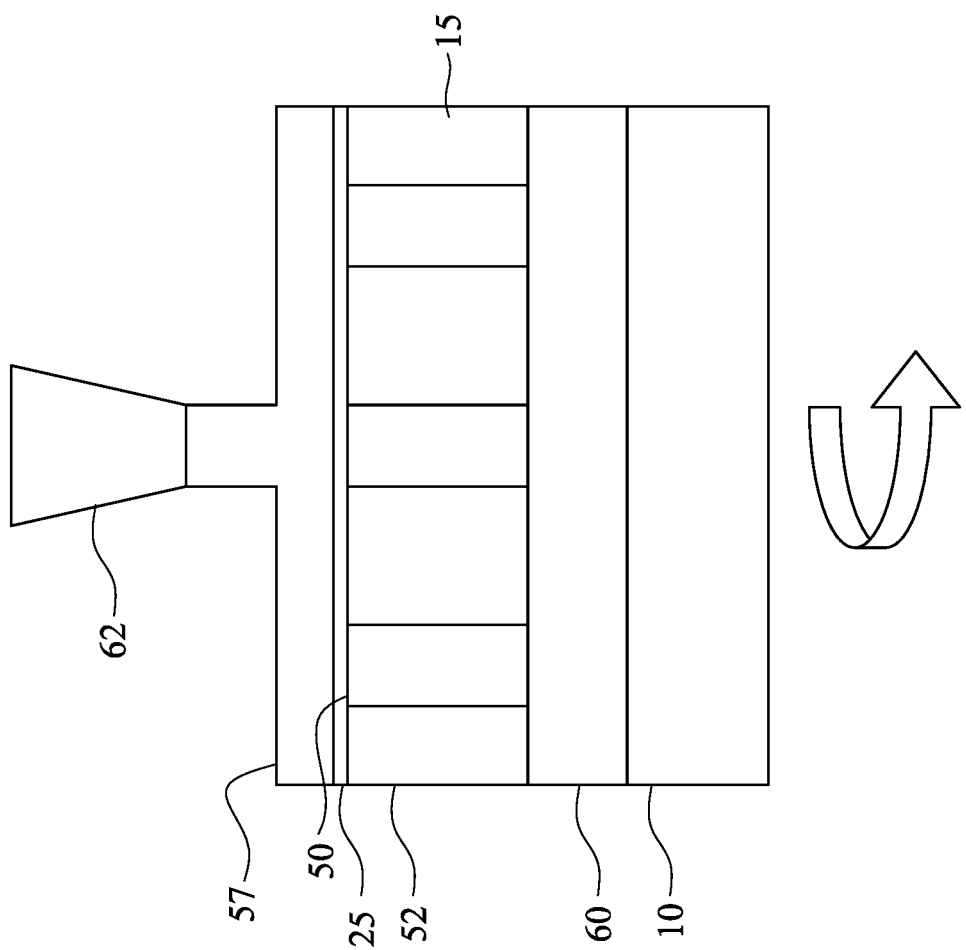

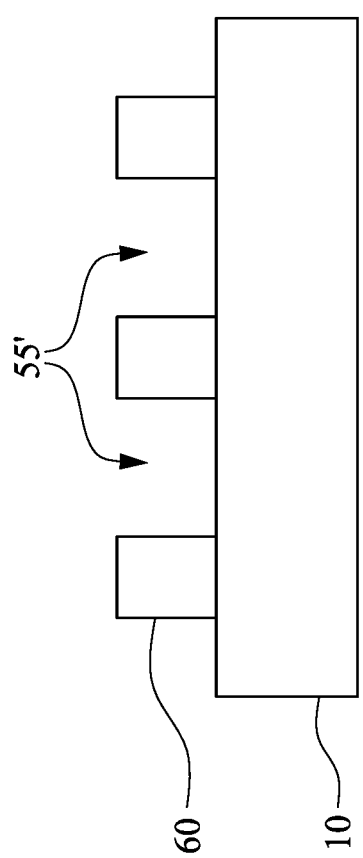

METHOD OF MANUFACTURING A SEMICONDUCTOR DEVICE

RELATED APPLICATIONS

This application claims priority to U.S. Provisional Patent Application No. 63/159,333 filed Mar. 10, 2021, the entire content of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing have become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7A, 7B, and 7C show sequential process stages of an operation according to an embodiment of the disclosure.

FIGS. 8A, 8B, 8C, 8D, and 8E show sequential process stages of an operation according to an embodiment of the disclosure.

FIGS. 9A, 9B, and 9C show sequential process stages of an operation according to an embodiment of the disclosure.

FIGS. 10A, 10B, 10C, and 10D show sequential process stages of an operation according to an embodiment of the disclosure.

FIGS. 11A, 11B, and 11C show sequential process stages of an operation according to an embodiment of the disclosure.

FIGS. 14A, 14B, 14C, and 14D show sequential process stages of an operation according to an embodiment of the disclosure.

FIGS. 15A and 15B show sequential process stages of an operation according to an embodiment of the disclosure.

FIGS. 16A, 16B, and 16C show a process stage of a sequential operation according to embodiments of the disclosure.

FIGS. 18A and 18B show a process stage of a sequential operation according to an embodiment of the disclosure.

FIGS. 26A, 26B, 26C, 26D, 26E, and 26F show sequential process stages of an operation according to an embodiment of the disclosure.

FIGS. 30A and 30B show a process stage of a sequential operation according to an embodiment of the disclosure.

FIG. 32 shows a process stage of a sequential operation according to an embodiment of the disclosure.

DETAILED DESCRIPTION

Figure 1:
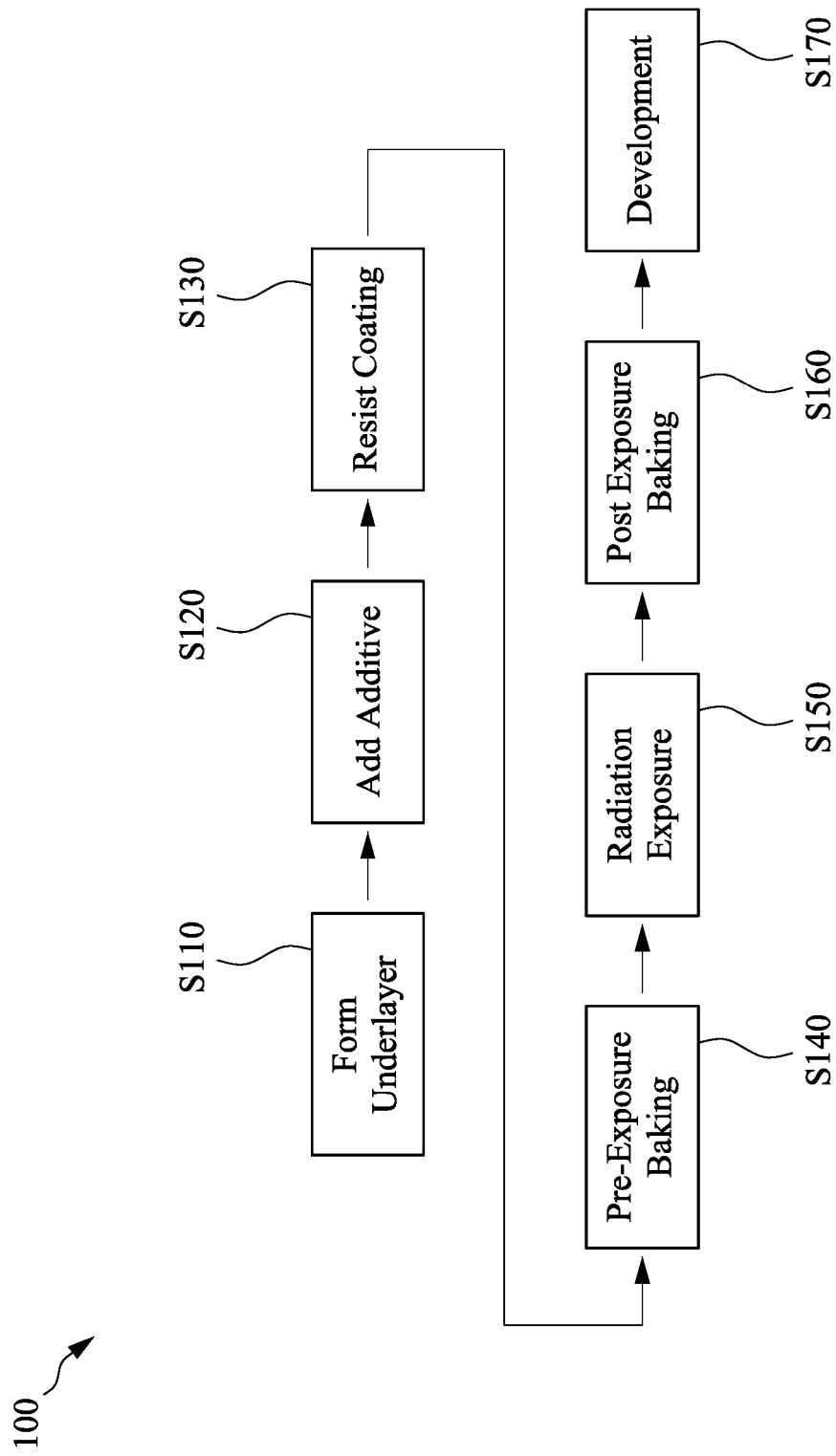
FIG. 1 illustrates a process flow of manufacturing a semiconductor device according to embodiments of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL, an increase in wafer exposure throughput is desirable. Wafer exposure throughput can be improved through increased exposure power or increased resist photospeed (sensitivity).

Highly charged tin ions are the atomic sources of narrowband extreme ultraviolet (EUV) light at 13.5 nm wavelength for nanolithography. Hydrogen is introduced into an EUV lithography tool to reduce mirror damage from tin (Sn) droplets. The hydrogen reacts with Sn to form stannane ($SnH_4$), which is a gas. However, the EUV radiation can interact with the hydrogen, forming hydrogen radicals. The hydrogen radicals can react with the photoresist on a photoresist-coated wafer in the lithography tool. Which, in turn, may cause a degradation in the photoresist patterning operation, thereby causing defects and increasing line width roughness (LWR).

In some embodiments, the resist layer is treated with an additive to inhibit or prevent degradation of the resist by free radicals, such as hydrogen radicals. In some embodiments, the additive is loaded, treated, doped, or copolymerized into the resist layer. In some embodiments, the additive is loaded, treated, doped, or copolymerized into an underlayer below or top layer above the resist layer. In some embodiments, the additive is added to a photoresist developer composition, and is introduced into the resist during the development operation. In some embodiments, the additive is mixed in a solvent; the mixture is applied to a resist underlayer, resist layer, or resist top layer; and the additive diffuses into the respective resist underlayer, resist layer, or resist top layer. In some embodiments, the underlayer includes a bottom layer and a middle layer of a tri-layer resist. In some embodiments, the additive is introduced in a middle layer of a tri-layer resist including a bottom layer and a photosensitive upper layer.

In some embodiments, the additive is one or more selected from the group consisting of (A) a radical inhibitor, (B) a thermal radical initiator, and (C) a photo radical initiator. The additive terminates hydrogen radicals or other radical species.

FIGS. 1-5 illustrate process flows of manufacturing a semiconductor device according to embodiments of the disclosure.

As shown in FIG. 1, a method 100 of manufacturing a semiconductor device includes an operation S110 of forming an underlayer 20 over a substrate 10 (see FIGS. 6A, 6B, 7A, and 8A) by coating an underlayer composition over the substrate 10. In some embodiments, the underlayer 20 is a bottom anti-reflective coating (BARC) layer. In some embodiments, the underlayer composition includes an additive to inhibit or prevent degradation of the resist by free radicals, such as hydrogen radicals. In other embodiments, the additive is subsequently added to the underlayer 20 in operation S120 (see FIG. 8B). A resist composition subsequently coated over the underlayer 20 in operation S130 to form a resist structure including the underlayer 20 and the resist layer 15 (see FIGS. 6A, 6B, 7B and 8D). In some embodiments, the resist is a metal-containing photoresist formed by chemical vapor deposition (CVD) or atomic layer deposition (ALD). In other embodiments, the metal-containing photoresist layer is formed by a spin-coating method.

In some embodiments, the resist layer 15 undergoes a pre-exposure baking operation S140 (or first heating operation) after the resist layer 15 is formed. In some embodiments, the first heating operation S140 includes heating the resist layer 15 at a temperature of between about 40° C. and about 150° C. for about 10 seconds to about 10 minutes. In some embodiments, the first heating operation S140 causes the additive to diffuse from the underlayer 20 into the resist layer 15. In some embodiments, the additive diffuses throughout the resist layer 15. In some embodiments, the additive is diffused uniformly throughout the resist layer 15. In other embodiments, the additive diffused into the resist layer forms a concentration gradient that is highest at the resist layer 15/underlayer 20 interface.

The resist layer 15 is subsequently selectively exposed to actinic radiation 45/97 (see FIGS. 12A and 12D) in operation S150. In some embodiments, the resist layer 15 is a photoresist layer. In some embodiments, the photoresist layer 15 is selectively or patternwise exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the resist layer 15 is selectively or patternwise exposed to an electron beam.

Photoresist layers according to the present disclosure are layers that undergo a chemical reaction upon absorption of the actinic radiation causing portions of the photoresist layer that are exposed to the actinic radiation to change solubility in a developer in contrast to portions of the photoresist layer that are not exposed to the actinic radiation. The layers that are not photosensitive to the actinic radiation do not substantially undergo a chemical reaction to change the layer's solubility in a developer upon exposure to the actinic radiation.

Figure 12B:
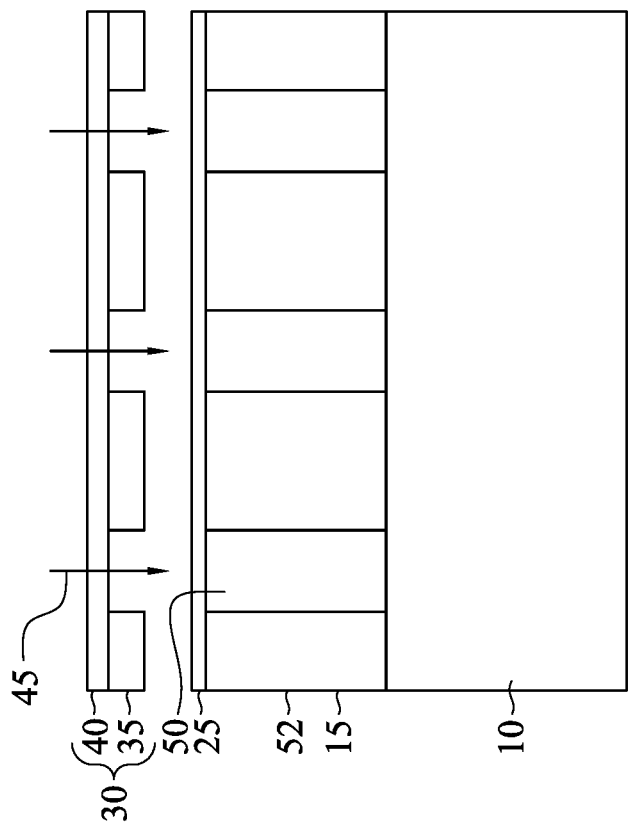
FIGS. 12A, 12B, 12C, 12D, 12E, and 12F show a process stage of a sequential operation according to embodiments of the disclosure.
Figure 12A:
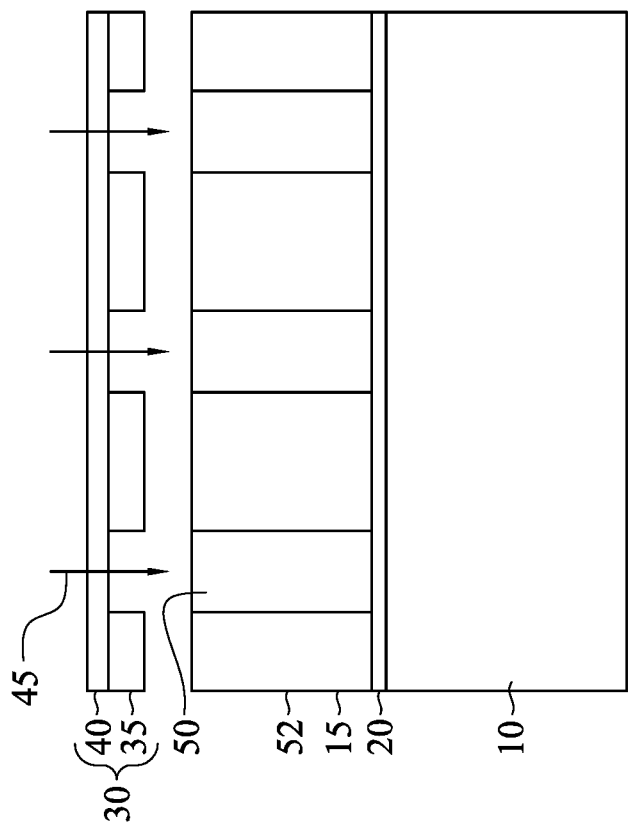
Figure 12C:
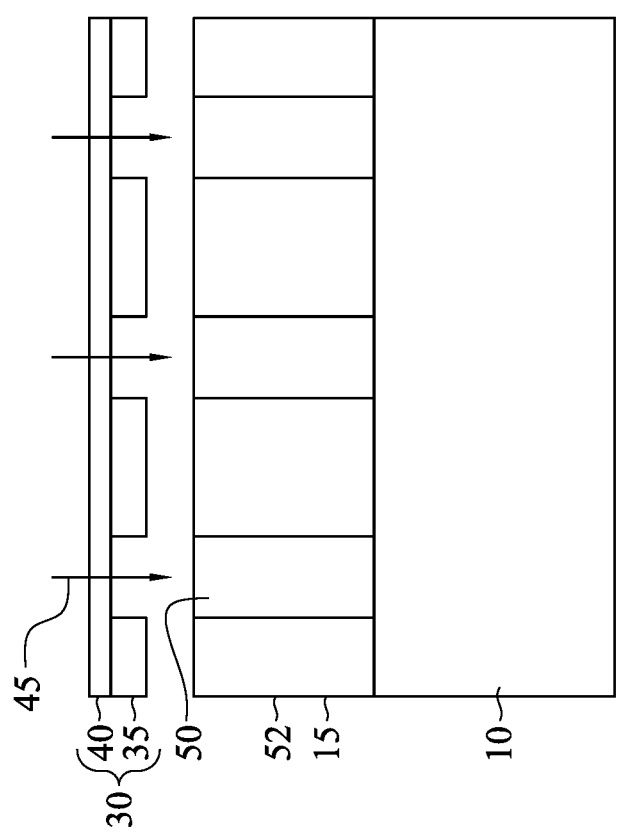

As shown in FIGS. 12A-12C, the exposure radiation 45 passes through a photomask 30 before irradiating the photoresist layer 15 in some embodiments. In some embodiments, the photomask 30 has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 12E:
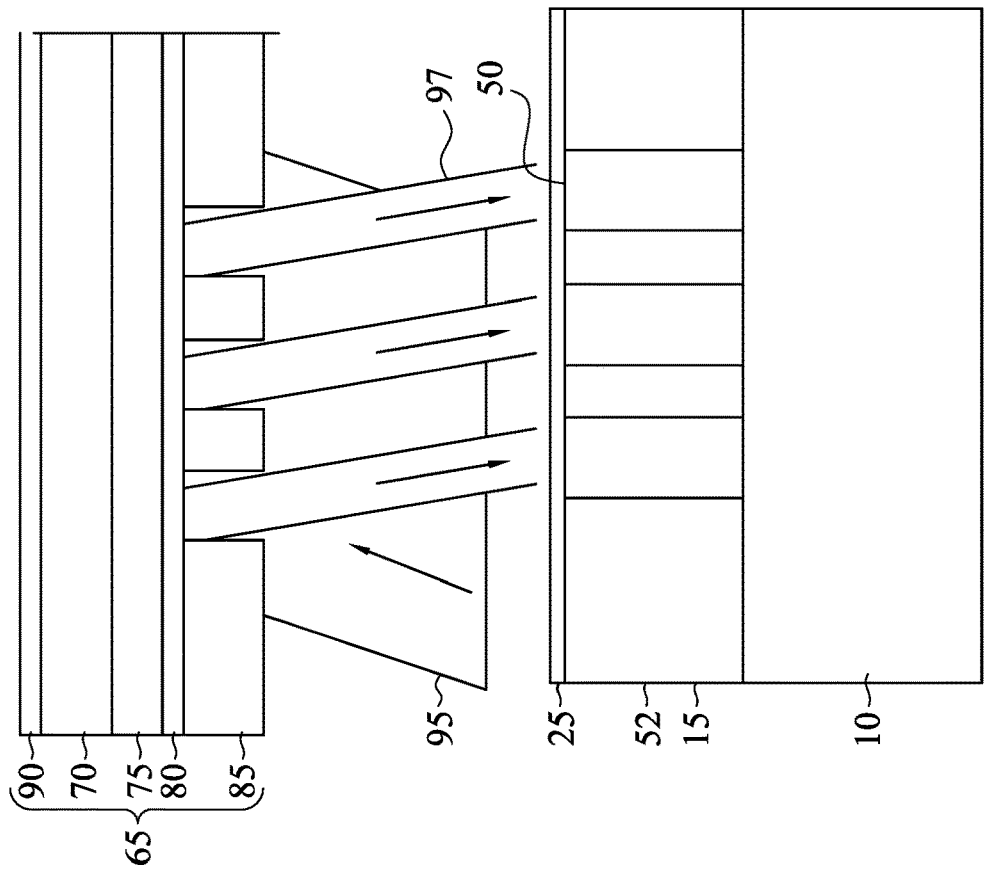
Figure 12D:
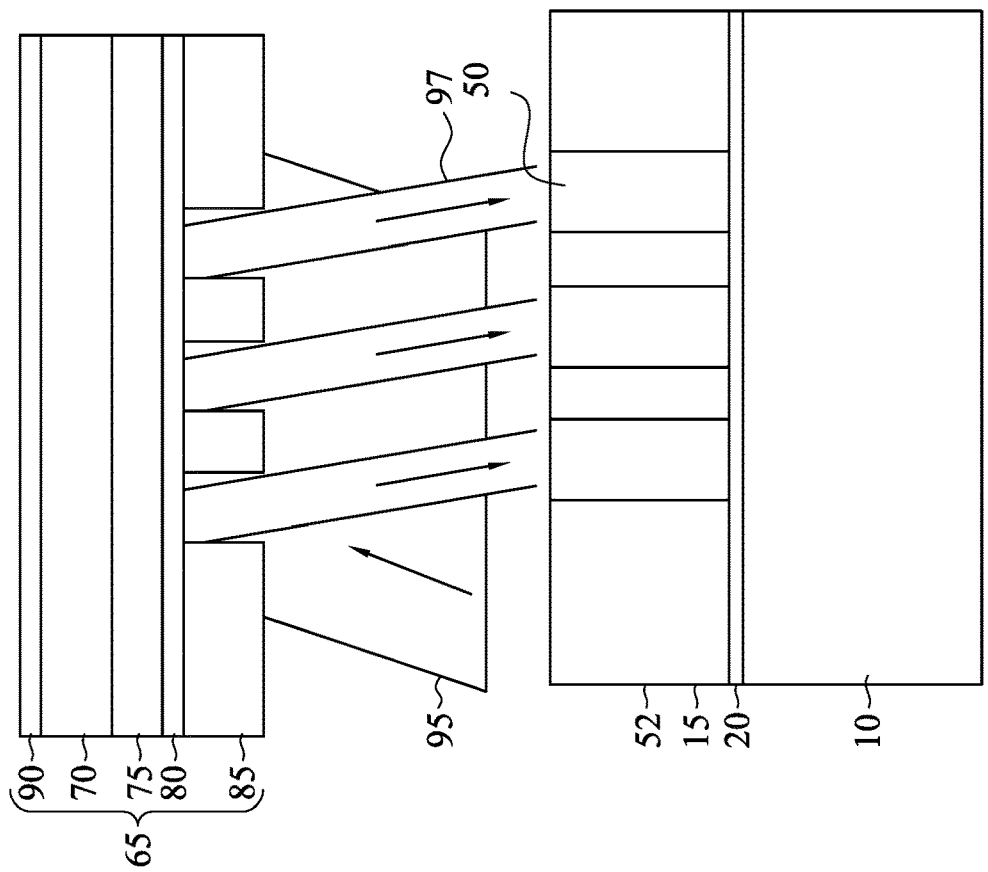
Figure 12F:
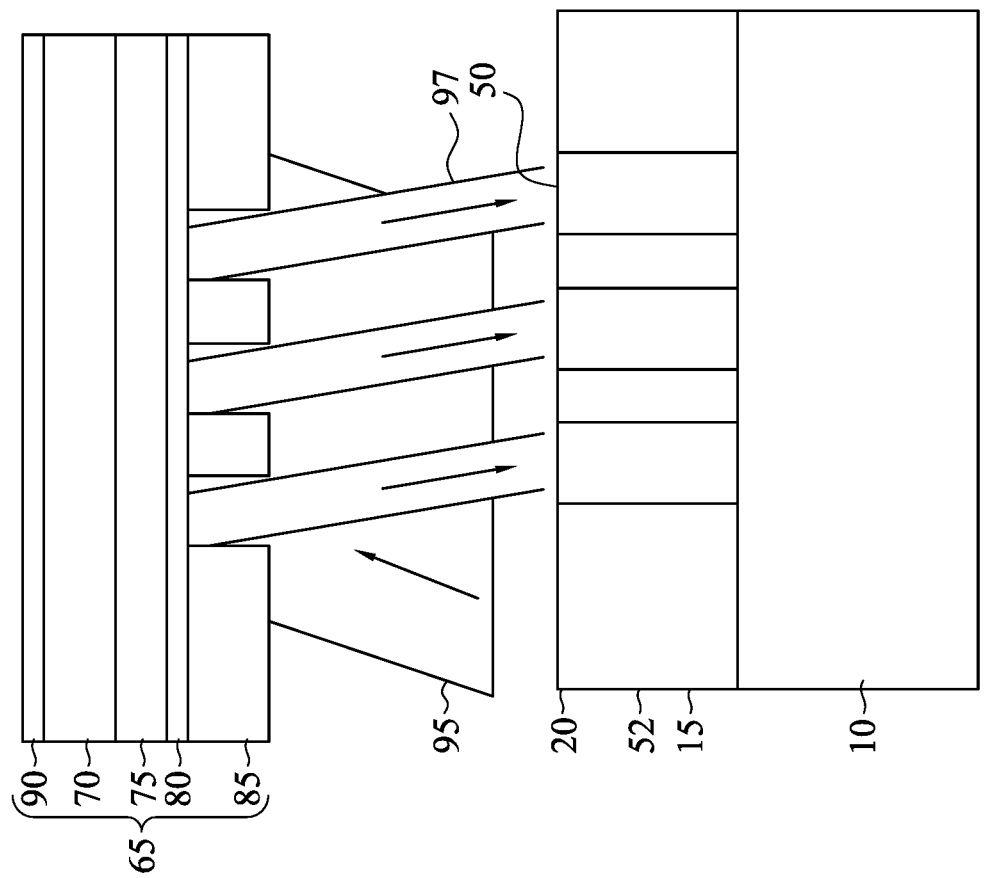

In some embodiments, the selective or patternwise exposure of the photoresist layer 15 to form exposed regions 50 and unexposed regions 52 is performed using extreme ultraviolet lithography. In an extreme ultraviolet lithography operation, a reflective photomask 65 is used to form the patterned exposure light in some embodiments, as shown in FIGS. 12D-12F. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. Extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are located between the reflective photomask 65 and the photoresist-coated substrate 10.

In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

The amount of electromagnetic radiation can be characterized by a fluence or dose, which is obtained by the integrated radiative flux over the exposure time. Suitable radiation fluences range from about 1 mJ/cm$^2$ to about 150 mJ/cm$^2$ in some embodiments, from about 2 mJ/cm$^2$ to about 100 mJ/cm$^2$ in other embodiments, and from about 3 mJ/cm$^2$ to about 50 mJ/cm$^2$ in other embodiments. A person of ordinary skill in the art will recognize that additional ranges of radiation fluences within the explicit ranges above are contemplated and are within the present disclosure.

In some embodiments, the selective or patternwise exposure is performed by a scanning electron beam. With electron beam lithography, the electron beam induces secondary electrons, which modify the irradiated material. High resolution is achievable using electron beam lithography and the metal-containing resists disclosed herein. Electron beams can be characterized by the energy of the beam, and suitable energies range from about 5 V to about 200 kV (kilovolt) in some embodiments, and from about 7.5 V to about 100 kV in other embodiments. In some embodiments, proximity-corrected beam doses at 30 kV range from about 0.1 µC/cm$^2$ to about 5 µC/cm$^2$ in some embodiments, from about 0.5 µC/cm$^2$ to about 1 µC/cm$^2$ in other embodiments, and in other embodiments from about 1 µC/cm$^2$ to about 100 µC/cm$^2$. A person of ordinary skill in the art can compute corresponding doses at other beam energies based on the teachings herein and will recognize that additional ranges of electron beam properties within the explicit ranges above are contemplated and are within the present disclosure.

In some embodiments, the exposure of the resist layer 15 uses an immersion lithography technique. In such a technique, an immersion medium (not shown) is placed between the final optics and the photoresist layer, and the exposure radiation 45 passes through the immersion medium.

The region of the resist layer exposed to radiation 50 undergoes a chemical reaction thereby changing its susceptibility to being removed in a subsequent development operation S170. In some embodiments, the portion of the resist layer exposed to radiation 50 undergoes a reaction making the exposed portion more easily removed during the development operation S150. In other embodiments, the portion of the resist layer exposed to radiation 50 undergoes a reaction making the exposed portion resistant to removal during the development operation S150.

Next, the resist layer 15 undergoes a second heating or a post-exposure bake (PEB) in operation S160. In some embodiments, the resist layer 15 is heated at a temperature of about 50° C. to about 250° C. for about 20 seconds to about 300 seconds. In some embodiments, the post-exposure baking is performed at a temperature ranging from about 100° C. to about 230° C., and at a temperature ranging from about 150° C. to about 200° C. in other embodiments. In some embodiments, the post-exposure baking operation S160 causes the reaction product of a first compound or first precursor and a second compound or second precursor in the resist layer to crosslink.

Figure 16A:
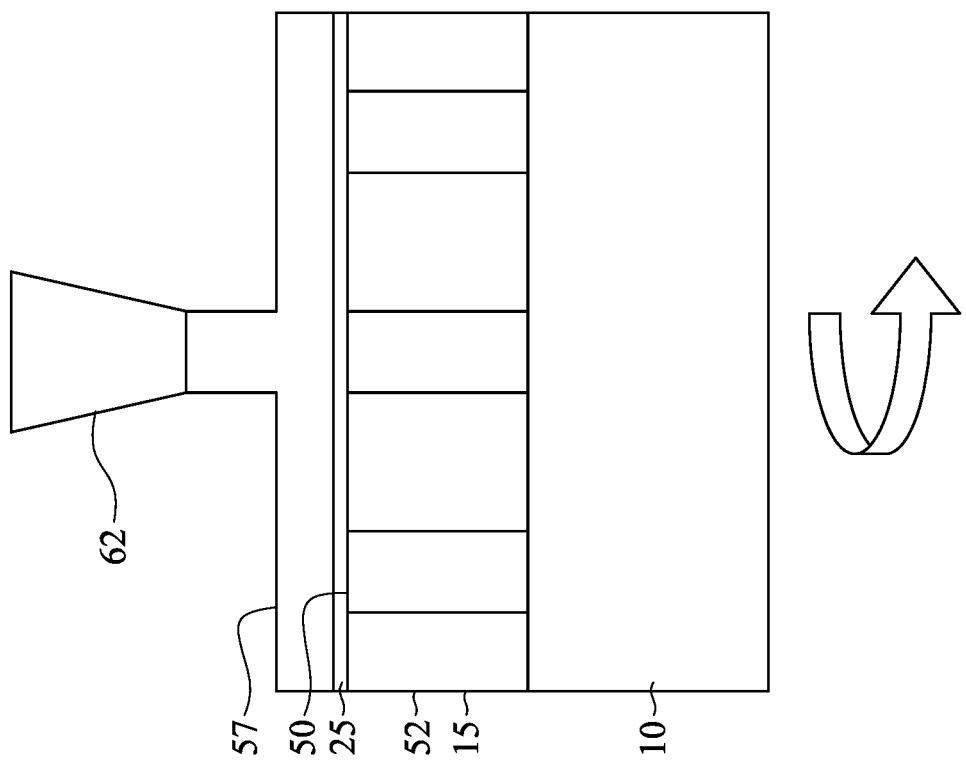

The selectively exposed resist layer 15 is subsequently developed in operation S170. In some embodiments, the resist layer 15 is developed by applying a solvent-based developer 57 to the selectively exposed resist layer. As shown in FIG. 16A, a liquid developer 57 is supplied from a dispenser 62 to the resist layer 15. In some embodiments, the exposed portions 50 of the photoresist layer undergo a crosslinking reaction as a result of the exposure to actinic radiation or the post-exposure bake, and the unexposed portion of the photoresist layer 52 is removed by the developer 57 forming a pattern of openings 55 in the photoresist layer 15 to expose the substrate 10, as shown in FIG. 18A. In some embodiments, the under layer 15 disposed under the unexposed portion of the photoresist layer 52 is removed during the development operation.

In some embodiments, the resist developer 57 includes a solvent, and an acid or a base. In some embodiments, the concentration of the solvent is from about 60 wt. % to about 99 wt. % based on the total weight of the resist developer. The acid or base concentration is from about 0.001 wt. % to about 20 wt. % based on the total weight of the resist developer. In certain embodiments, the acid or base concentration in the developer is from about 0.01 wt. % to about 15 wt. % based on the total weight of the developer.

Figure 16B:
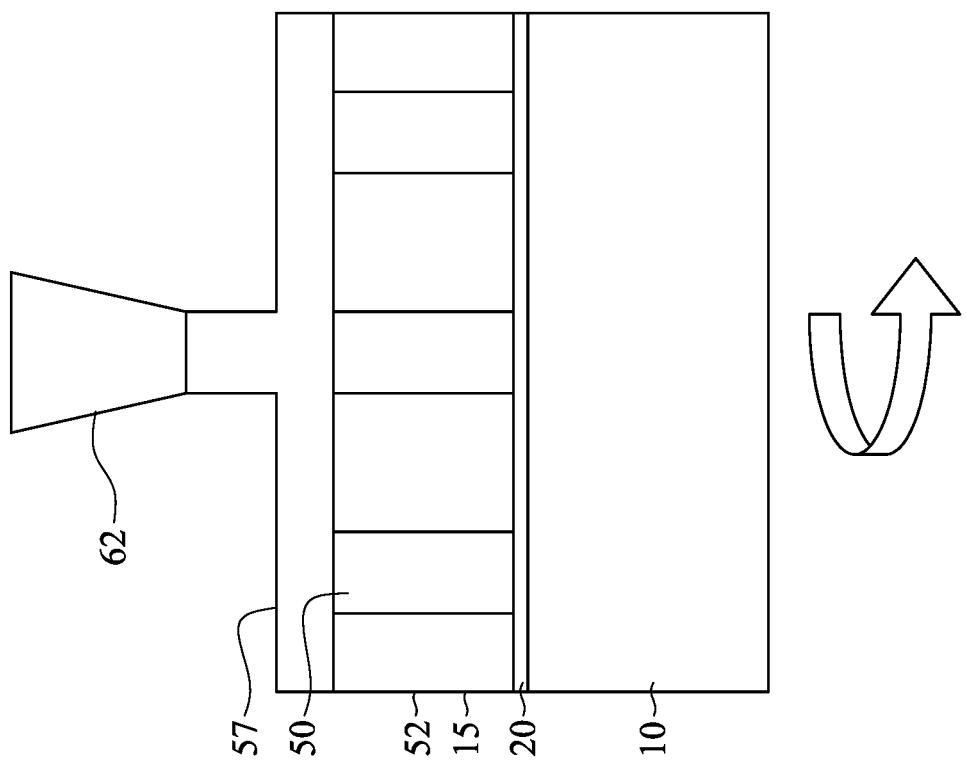

In some embodiments, the developer 57 is applied to the resist layer 15 using a spin-on process. In the spin-on process, the developer 57 is applied to the resist layer 15 from above the resist layer 15 while the resist-coated substrate is rotated, as shown in FIGS. 16A-16C. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

In some embodiments, the developer 57 includes an organic solvent. The organic solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, 4-methyl-2-pentanol, acetone, methyl ethyl ketone, dimethylformamide (DMF), isopropanol (IPA), tetrahydrofuran (THF), methyl isobutyl carbinol (MIBC), n-butyl acetate (nBA), 2-heptanone (MAK), and dioxane.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

Figure 17A:
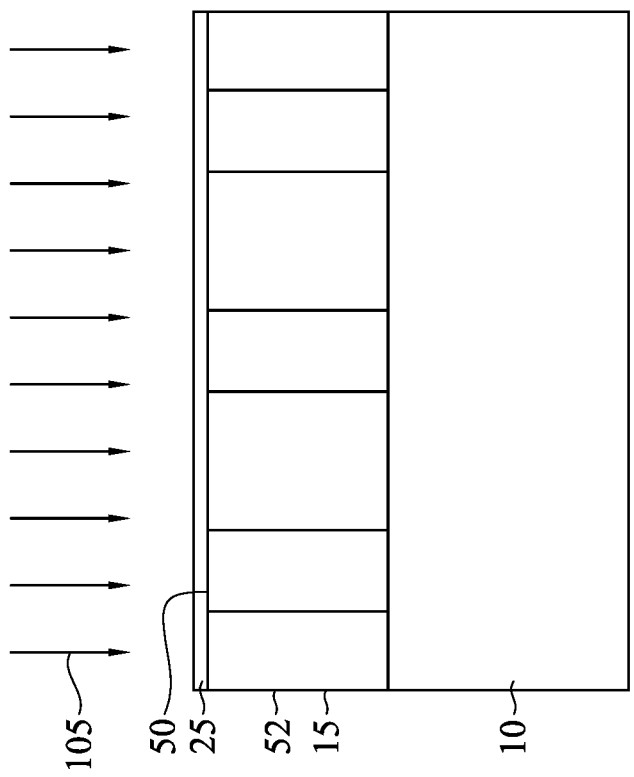
FIGS. 17A, 17B, and 17C show a process stage of a sequential operation according to embodiments of the disclosure.
Figure 17B:
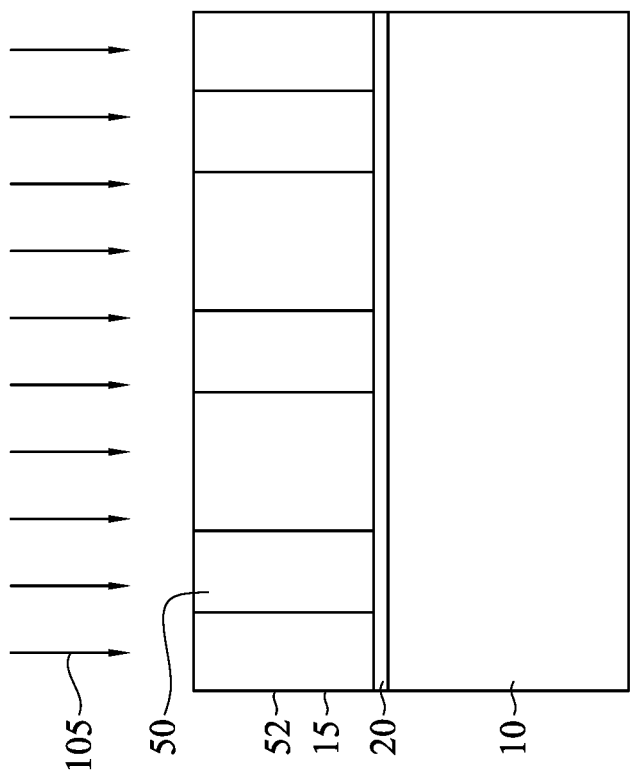
Figure 17C:
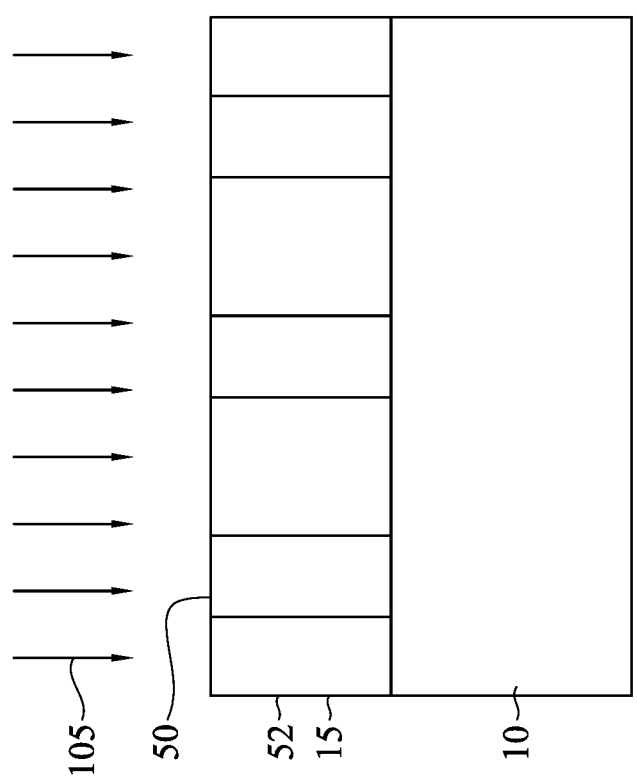

In some embodiments, a dry developer 105 is applied to the selectively exposed resist layer 15, as shown in FIGS. 17A, 17B, and 17C. In some embodiments, the dry developer 105 is a plasma or chemical vapor, and the dry development operation S170 is a plasma etching or chemical etching operation. The dry development uses the differences related to the composition, extent of cross-linking, and film density to selectively remove the desired portions of the resist. In some embodiments, the dry development processes uses either a gentle plasma (high pressure, low power) or a thermal process in a heated vacuum chamber while flowing a dry development chemistry, such as $BCl_3$, $BF_3$, or other Lewis Acid in the vapor state. In some embodiments, the $BCl_3$ removes the unexposed material, leaving behind a pattern of the exposed film that is transferred into the underlying layers by plasma-based etch processes.

In some embodiments, the dry development includes plasma processes, including transformer coupled plasma (TCP), inductively coupled plasma (ICP) or capacitively coupled plasma (CCP). In some embodiments, the plasma process is conducted at a pressure of ranging from about 5 mTorr to a pressure of about 20 mTorr, at a power level from about 250 W to about 1000 W, temperature ranging from about 0° C. to about 300° C., and at flow rate of about 100 to about 1000 sccm, for about 1 to about 3000 seconds.

Figure 19:
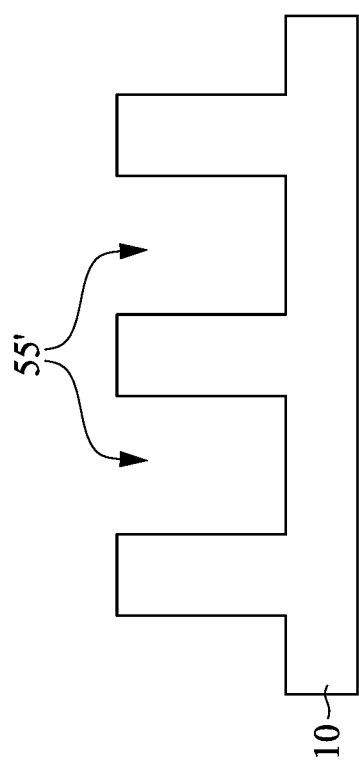
FIG. 19 show a sequential process stage of an operation according to an embodiment of the disclosure.

In some embodiments, the photoresist is a negative-tone resist, and the unexposed portions 52 of the resist layer 15 are removed by the development operation S170 providing a pattern 55 in the photoresist layer exposing portions of the substrate 10, as shown in FIG. 18A. In other embodiments, the photoresist is a positive-tone resist, and the exposed portions 50 of the resist layer 15 are removed by the development operation S170. After the development operation, additional processing is performed while the patterned photoresist layer 15, 50 is in place. For example, an etching operation, using dry or wet etching, is performed in some embodiments, to transfer the pattern 55 of the resist layer 15, 50 to the underlying substrate 10, forming recesses 55' as shown in FIG. 19. The substrate 10 has a different etch resistance than the resist layer 15. In some embodiments, the etchant is more selective to the substrate 10 than the resist layer 15. In some embodiments, the patterned resist layer 15, 50 is at least partially removed during the etching operation in some embodiments. In other embodiments, the patterned resist layer 15, 50 is removed after etching the substrate 10 by selective etching, using a suitable resist stripper solvent, or by a resist plasma ashing operation.

Figure 2:
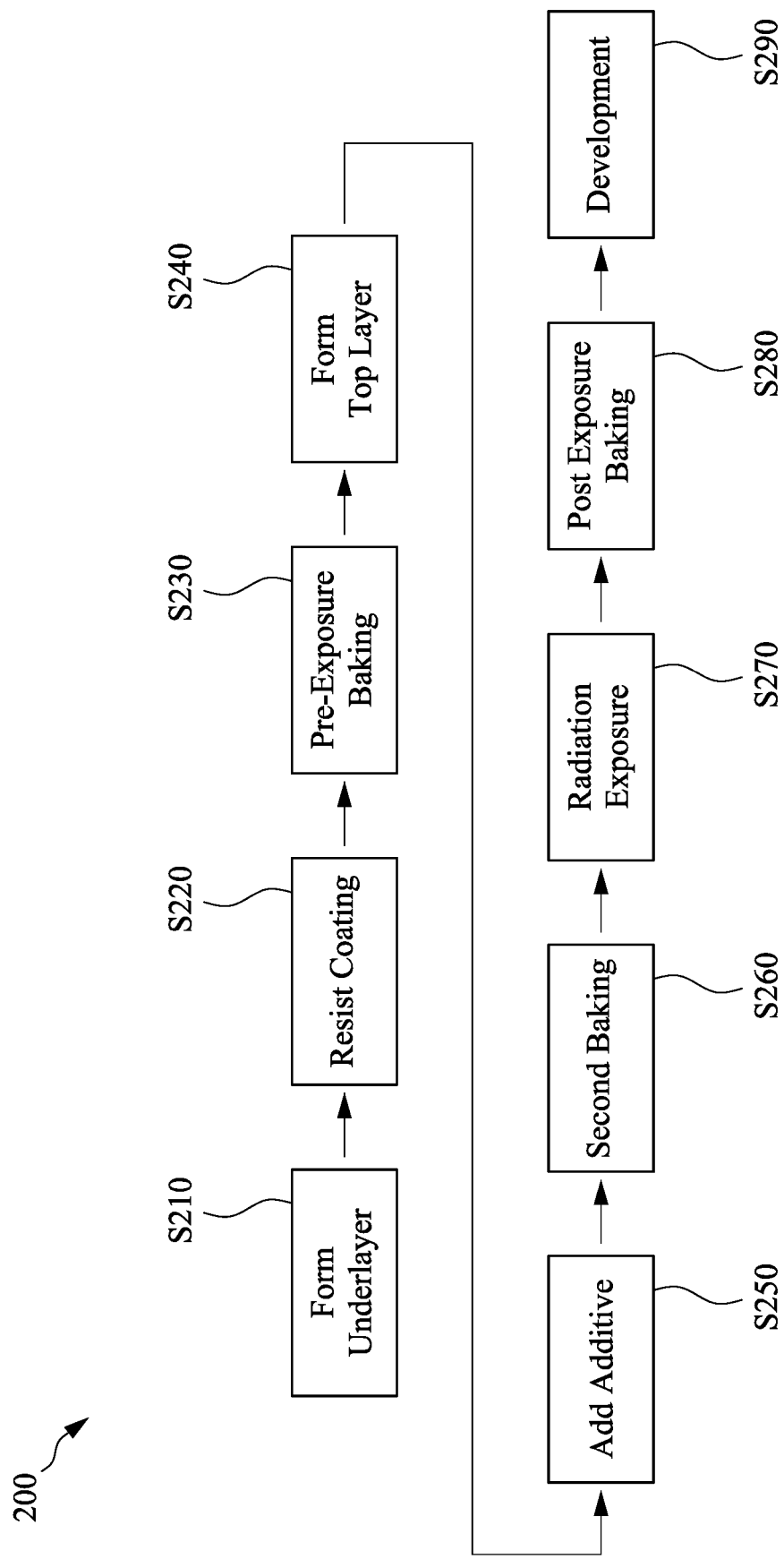
FIG. 2 illustrates a process flow of manufacturing a semiconductor device according to embodiments of the disclosure.

In other embodiments, as shown in FIG. 2, a method 200, of manufacturing a semiconductor device optionally includes an operation S210 of forming an underlayer 20 including a bottom layer 20a and a middle layer 20b over a substrate 10 (see FIG. 6B) by coating a bottom layer composition over the substrate 10, and then coating a middle layer composition over the bottom layer 20a. In some embodiments, a resist composition is subsequently coated over the underlayer 20 in operation S220 to form a resist layer 15 (see FIGS. 6A, 6B, 7B and 8D). In some embodiments, a heating (or baking) operation is performed after either or both of the coating the bottom layer composition and coating the middle layer composition. In some embodiments, the resist is a metal-containing photoresist formed by chemical vapor deposition (CVD) or atomic layer deposition (ALD). In other embodiments, the metal-containing photoresist layer is formed by a spin-coating method.

In some embodiments, the resist layer 15 undergoes a pre-exposure baking operation S230 (or first heating operation) after the resist layer 15 is formed. In some embodiments, the first heating operation S230 includes heating the resist layer 15 at a temperature of between about 40° C. and about 150° C. for about 10 seconds to about 10 minutes.

In some embodiments, a top layer 25 is optionally formed over the resist layer 15 in operation S240 (see FIG. 6D) by coating a top layer composition over the resist layer 15 to form a resist structure including the top layer 25 and the resist layer. In some embodiments, the top layer composition includes an additive to inhibit or prevent degradation of the resist by free radicals, such as hydrogen radicals. In other embodiments, the additive is subsequently added to the top layer 25 in operation S250 (see FIG. 10C).

A second baking or heating operation S260 is subsequently performed in some embodiments, the second heating operation S260 causes the additive to diffuse from the top layer 25 into the resist layer 15. In some embodiments, the additive diffuses throughout the resist layer 15. In some embodiments, the additive is diffused uniformly throughout the resist layer 15. In other embodiments, the additive diffused into the resist layer forms a concentration gradient that is highest at the resist layer 15/top layer 25 interface.

The resist layer 15 and top layer 25 are subsequently selectively exposed to actinic radiation 45/97 (see FIGS. 12B and 12E) in operation S270. In some embodiments, the photoresist layer 15 and top layer 25 are selectively or patternwise exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the resist layer 15 is selectively or patternwise exposed to an electron beam. In some embodiments, the resist layer 15 is a photoresist layer that is photosensitive to the actinic radiation 45/97. In some embodiments, the actinic radiation 45/97 is not substantially absorbed by the top layer 25.

As shown in FIG. 12B, the exposure radiation 45 passes through a photomask 30 before irradiating the photoresist layer 15 and top layer 25 in some embodiments. In some embodiments, the selective or patternwise exposure of the photoresist layer 15 to form exposed regions 50 and unexposed regions 52 is performed using extreme ultraviolet lithography. In an extreme ultraviolet lithography operation, a reflective photomask 65 is used to form the patterned exposure light in some embodiments, as shown in FIG. 12E. The photomasks, exposure radiation, and exposure conditions are the same as those described herein with reference to method 100 and operation S150.

Next, the resist layer 15 undergoes a post-exposure bake (PEB) in operation S280. In some embodiments, the resist layer 15 is heated at a temperature of about 50° C. to about 250° C. for about 20 seconds to about 300 seconds. In some embodiments, the post-exposure baking is performed at a temperature ranging from about 100° C. to about 230° C., and at a temperature ranging from about 150° C. to about 200° C. in other embodiments. In some embodiments, the post-exposure baking operation S280 causes the reaction product of a first compound or first precursor and a second compound or second precursor in the resist layer to crosslink.

The selectively exposed resist layer 15 and top layer 25 are subsequently developed in operation S290. In some embodiments, the resist layer 15 is developed by applying a solvent-based developer 57 to the selectively exposed resist layer. As shown in FIG. 16B, a liquid developer 57 is supplied from a dispenser 62 to the top layer 25 and the resist layer 15. In some embodiments, the photoresist is a negative-tone resist and the exposed portions 50 of the photoresist layer undergo a crosslinking reaction as a result of the exposure to actinic radiation or the post-exposure bake, and the unexposed portion of the photoresist layer 52 is removed by the developer 57 forming a pattern of openings 55 in the photoresist layer 15 to expose the substrate 10, as shown in FIG. 18B. In some embodiments, the top layer 25 is removed during the development operation. In some embodiments, a dry developer 105 is applied to the selectively exposed resist layer 15 and top layer 25, as shown in FIG. 17B. The development conditions and parameters in operation S290 are the same as those disclosed herein in reference to operation S170 in method 100 in some embodiments.

The development operation S290 provides a pattern 55 in the photoresist layer exposing portions of the substrate 10, as shown in FIG. 18B. After the development operation, additional processing is performed while the patterned photoresist layer 15, 50 is in place. For example, an etching operation, using dry or wet etching, is performed in some embodiments, to transfer the pattern 55 of the resist layer 15, 50 to the underlying substrate 10, forming recesses 55' as shown in FIG. 19. The substrate 10 has a different etch resistance than the resist layer 15. In some embodiments, the etchant is more selective to the substrate 10 than the resist layer 15. In some embodiments, the patterned resist layer 15, 50 is at least partially removed during the etching operation in some embodiments. In other embodiments, the patterned resist layer 15, 50 is removed, after etching the substrate 10, by selective etching, by using a suitable resist stripper solvent, or by a resist plasma ashing operation.

Figure 3:
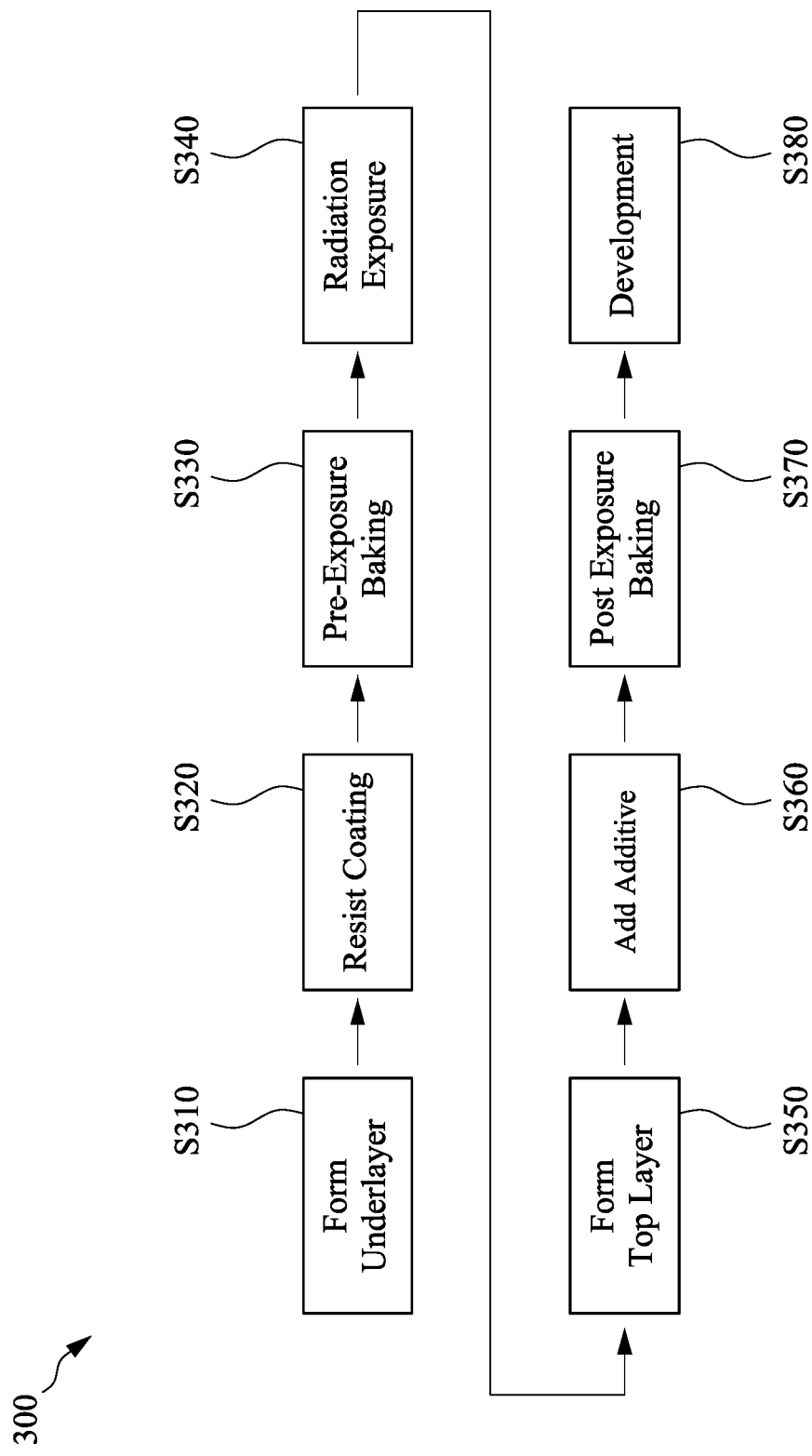
FIG. 3 illustrates a process flow of manufacturing a semiconductor device according to embodiments of the disclosure.

Another embodiment of the disclosure is illustrated in FIG. 3. A method 300 of manufacturing a semiconductor device optionally includes an operation S310 of forming an underlayer 20 including a bottom layer 20a and a middle layer 20b over a substrate 10 (see FIG. 6B) by coating a bottom layer composition over the substrate 10, and then coating a middle layer composition over the bottom layer 20a. In some embodiments, a resist composition is subsequently coated over the underlayer 20 in operation S320 to form a resist layer 15 (see FIGS. 6A, 6B, 7B and 8D). In some embodiments, a heating (or baking) operation is performed after either or both of the coating the bottom layer composition and coating the middle layer composition. In some embodiments, the resist is a metal-containing photoresist formed by chemical vapor deposition (CVD) or atomic layer deposition (ALD). In other embodiments, the metal-containing photoresist layer is formed by a spin-coating method.

In some embodiments, the resist layer 15 undergoes a pre-exposure baking operation S330 (or first heating operation) after the resist layer 15 is formed. In some embodiments, the first heating operation S330 includes heating the resist layer 15 at a temperature of between about 40° C. and about 150° C. for about 10 seconds to about 10 minutes.

The resist layer 15 is subsequently selectively exposed to actinic radiation 45/97 (see FIGS. 12C and 12F) in operation S340. In some embodiments, the photoresist layer 15 is selectively or patternwise exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the resist layer 15 is selectively or patternwise exposed to an electron beam. In some embodiments, the resist layer 15 is a photoresist layer that is photosensitive to the actinic radiation 45/97.

As shown in FIG. 12C, the exposure radiation 45 passes through a photomask 30 before irradiating the photoresist layer 15 in some embodiments. In some embodiments, the selective or patternwise exposure of the photoresist layer 15 to form exposed regions 50 and unexposed regions 52 is performed using extreme ultraviolet lithography. In an extreme ultraviolet lithography operation, a reflective photomask 65 is used to form the patterned exposure light in some embodiments, as shown in FIG. 12F. The photomasks, exposure radiation, and exposure conditions are the same as those described herein with reference to method 100 and operation S150.

A top layer 25 is subsequently formed over the selectively or patternwise exposed resist layer 15 in operation S350 (see FIGS. 13A and 13B) by coating a top layer composition over the resist layer 15. In some embodiments, the top layer composition includes an additive to inhibit or prevent degradation of the resist by free radicals, such as hydrogen radicals. In other embodiments, the additive is subsequently added to the top layer 25' in operation S360 (see FIG. 14C).

A post exposure baking (PEB) operation S370 is subsequently performed in some embodiments. In some embodiments, the resist layer 15 is heated at a temperature of about 50° C. to about 250° C. for about 20 seconds to about 300 seconds. In some embodiments, the post-exposure baking is performed at a temperature ranging from about 100° C. to about 230° C., and at a temperature ranging from about 150° C. to about 200° C. in other embodiments. In some embodiments, the post-exposure baking operation S370 causes the reaction product of a first compound or first precursor and a second compound or second precursor in the resist layer to crosslink. In addition to furthering the reaction initiated by the exposure of the resist layer 15 to actinic radiation, the post exposure baking operation S370 causes the additive to diffuse from the top layer 25 into the resist layer 15. In some embodiments, the additive diffuses throughout the resist layer 15. In some embodiments, the additive is diffused uniformly throughout the resist layer 15. In other embodiments, the additive diffused into the resist layer forms a concentration gradient that is highest at the resist layer 15/top layer 25 interface.

The selectively exposed resist layer 15 and the top layer 25 are subsequently developed in operation S380. In some embodiments, the resist layer 15 is developed by applying a solvent-based developer 57 to the selectively exposed resist layer. As shown in FIG. 16B, a liquid developer 57 is supplied from a dispenser 62 to the top layer 25 and the resist layer 15. In some embodiments, the photoresist is a negative-tone resist and the exposed portions 50 of the photoresist layer undergo a crosslinking reaction as a result of the exposure to actinic radiation or the post-exposure bake, and the unexposed portion of the photoresist layer 52 is removed by the developer 57 forming a pattern of openings 55 in the photoresist layer 15 to expose the substrate 10, as shown in FIG. 18B. In some embodiments, the top layer 25 is removed during the development operation. In some embodiments, a dry developer 105 is applied to the selectively exposed resist layer 15 and top layer 25, as shown in FIG. 17B. The development conditions and parameters in operation S380 are the same as those disclosed herein in reference to operation S170 in method 100 in some embodiments.

The development operation S380 provides a pattern 55 in the photoresist layer exposing portions of the substrate 10, as shown in FIG. 18B. After the development operation, additional processing is performed while the patterned photoresist layer 15, 50 is in place. For example, an etching operation, using dry or wet etching, is performed in some embodiments, to transfer the pattern of the resist layer 15, 50 to the underlying substrate 10, forming recesses 55' as shown in FIG. 19. The substrate 10 has a different etch resistance than the resist layer 15. In some embodiments, the etchant is more selective to the substrate 10 than the resist layer 15. In some embodiments, the patterned resist layer 15, 50 is at least partially removed during the etching operation in some embodiments. In other embodiments, the patterned resist layer 15, 50 is removed after etching the substrate 10 by selective etching, using a suitable resist stripper solvent, or by a resist plasma ashing operation.

Figure 4:
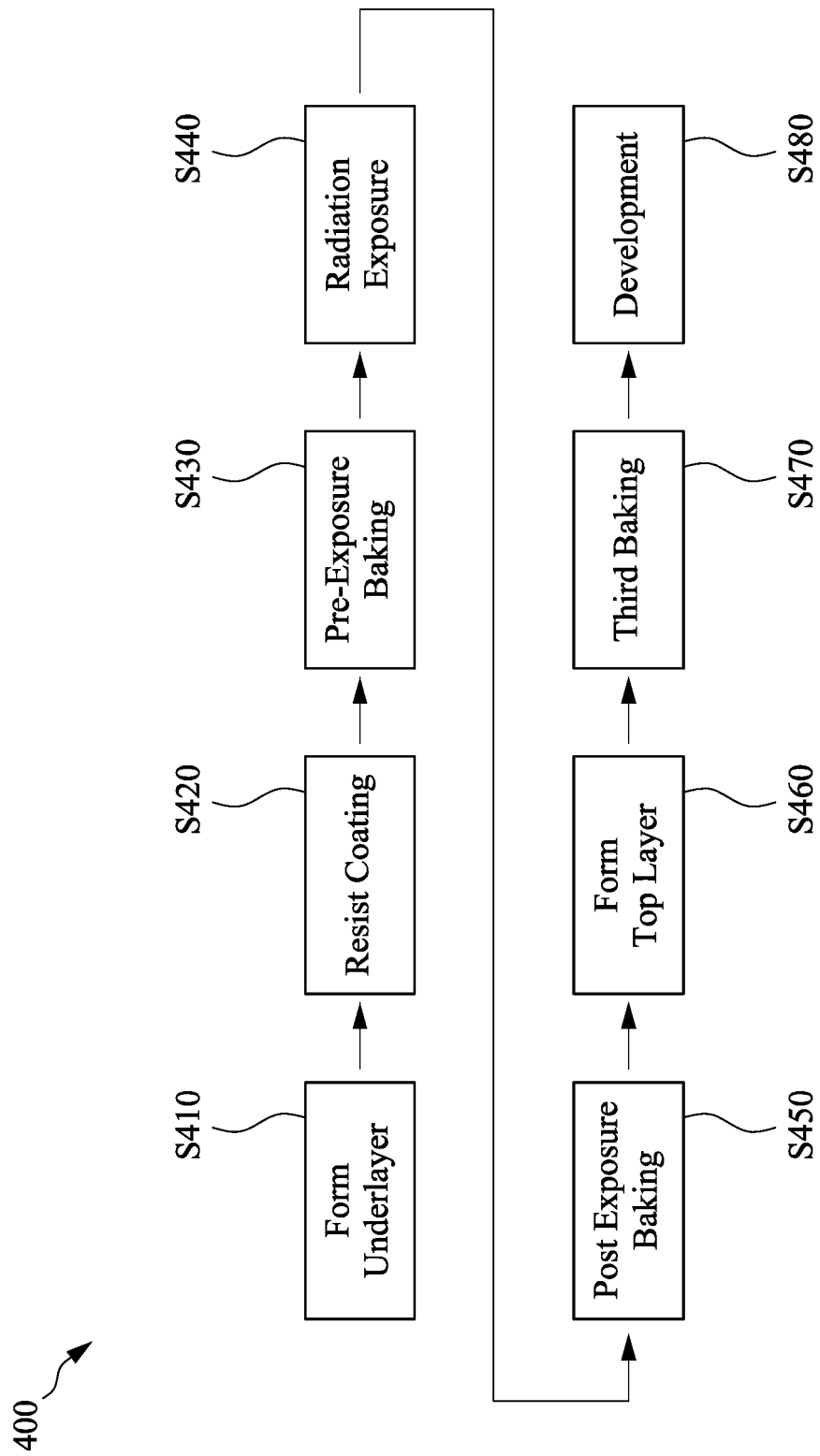
FIG. 4 illustrates a process flow of manufacturing a semiconductor device according to embodiments of the disclosure.

Another embodiment of the disclosure is illustrated in FIG. 4. A method 400 of manufacturing a semiconductor device optionally includes an operation S410 of forming an underlayer 20 including a bottom layer 20a and a middle layer 20b over a substrate 10 (see FIG. 6B) by coating a bottom layer composition over the substrate 10, and then coating a middle layer composition over the bottom layer 20a. In some embodiments, a resist composition is subsequently coated over the underlayer 20 in operation S420 to form a resist layer 15 (see FIGS. 6A, 6B, 7B and 8D). In some embodiments, a heating (or baking) operation is performed after either or both of the coating the bottom layer composition and coating the middle layer composition. In some embodiments, the resist is a metal-containing photoresist formed by chemical vapor deposition (CVD) or atomic layer deposition (ALD). In other embodiments, the metal-containing photoresist layer is formed by a spin-coating method.

In some embodiments, the resist layer 15 undergoes a pre-exposure baking operation S430 (or first heating operation) after the resist layer 15 is formed. In some embodiments, the first heating operation S430 includes heating the resist layer 15 at a temperature of between about 40° C. and about 150° C. for about 10 seconds to about 10 minutes.

The resist layer 15 is subsequently selectively exposed to actinic radiation 45/97 (see FIGS. 12C and 12F) in operation S440. In some embodiments, the photoresist layer 15 is selectively or patternwise exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the resist layer 15 is selectively or patternwise exposed to an electron beam. In some embodiments, the resist layer 15 is a photoresist layer that is photosensitive to the actinic radiation 45/97.

As shown in FIG. 12C, the exposure radiation 45 passes through a photomask 30 before irradiating the photoresist layer 15 in some embodiments. In some embodiments, the selective or patternwise exposure of the photoresist layer 15 to form exposed regions 50 and unexposed regions 52 is performed using extreme ultraviolet lithography. In an extreme ultraviolet lithography operation, a reflective photomask 65 is used to form the patterned exposure light in some embodiments, as shown in FIG. 12F. The photomasks, exposure radiation, and exposure 2 conditions are the same as those described herein with reference to method 100 and operation S150.

A post exposure baking (PEB) operation S450 is subsequently performed in some embodiments. In some embodiments, the resist layer 15 is heated at a temperature of about 50° C. to about 250° C. for about 20 seconds to about 300 seconds. In some embodiments, the post-exposure baking is performed at a temperature ranging from about 100° C. to about 230° C., and at a temperature ranging from about 150° C. to about 200° C. in other embodiments. In some embodiments, the post-exposure baking operation S450 causes the reaction product of a first compound or first precursor and a second compound or second precursor in the resist layer to crosslink.

A top layer 25 is subsequently formed over the post-exposure baked selectively or patternwise exposed resist layer 15 in operation S460 (see FIGS. 12A and 12B) by coating a top layer composition over the resist layer 15. In some embodiments, the top layer composition includes an additive to inhibit or prevent degradation of the resist by free radicals, such as hydrogen radicals. In other embodiments, the additive is subsequently added to the top layer 25 in operation.

The top layer 25 and the resist layer 15 subsequently undergo a third baking operation S470 that causes the additive to diffuse from the top layer 25 into the resist layer 15. In some embodiments, the additive diffuses throughout the resist layer 15. In some embodiments, the additive is diffused uniformly throughout the resist layer 15. In other embodiments, the additive diffused into the resist layer forms a concentration gradient that is highest at the resist layer 15/top layer 25 interface. In some embodiments, the third baking operation S470 includes heating the top layer 25 and the resist layer 15 at a temperature of between about 40° C. and about 150° C. for about 10 seconds to about 10 minutes.

The selectively exposed resist layer 15 and the top layer 25 are subsequently developed in operation S480. In some embodiments, the resist layer 15 is developed by applying a solvent-based developer 57 to the selectively exposed resist layer. As shown in FIG. 16B, a liquid developer 57 is supplied from a dispenser 62 to the top layer 25 and the resist layer 15. In some embodiments, the exposed portions 50 of the photoresist layer undergo a crosslinking reaction as a result of the exposure to actinic radiation or the post-exposure bake, and the unexposed portion of the photoresist layer 52 is removed by the developer 57 forming a pattern of openings 55 in the photoresist layer 15 to expose the substrate 10, as shown in FIG. 18B. In some embodiments, the top layer 25 is removed during the development operation. In some embodiments, a dry developer 105 is applied to the selectively exposed resist layer 15 and top layer 25, as shown in FIG. 17B. The development conditions and parameters in operation S480 are the same as those disclosed herein in reference to operation S170 in method 100 in some embodiments.

The development operation S480 provides a pattern 55 in the photoresist layer exposing portions of the substrate 10, as shown in FIG. 18B. After the development operation, additional processing is performed while the patterned photoresist layer 15, 50 is in place. For example, an etching operation, using dry or wet etching, is performed in some embodiments, to transfer the pattern 55 of the resist layer 15, 50 to the underlying substrate 10, forming recesses 55' as shown in FIG. 19. The substrate 10 has a different etch resistance than the resist layer 15. In some embodiments, the etchant is more selective to the substrate 10 than the resist layer 15. In some embodiments, the patterned resist layer 15, 50 is at least partially removed during the etching operation in some embodiments. In other embodiments, the patterned resist layer 15, 50 is removed after etching the substrate 10 by selective etching, using a suitable resist stripper solvent, or by a resist plasma ashing operation.

Figure 5:
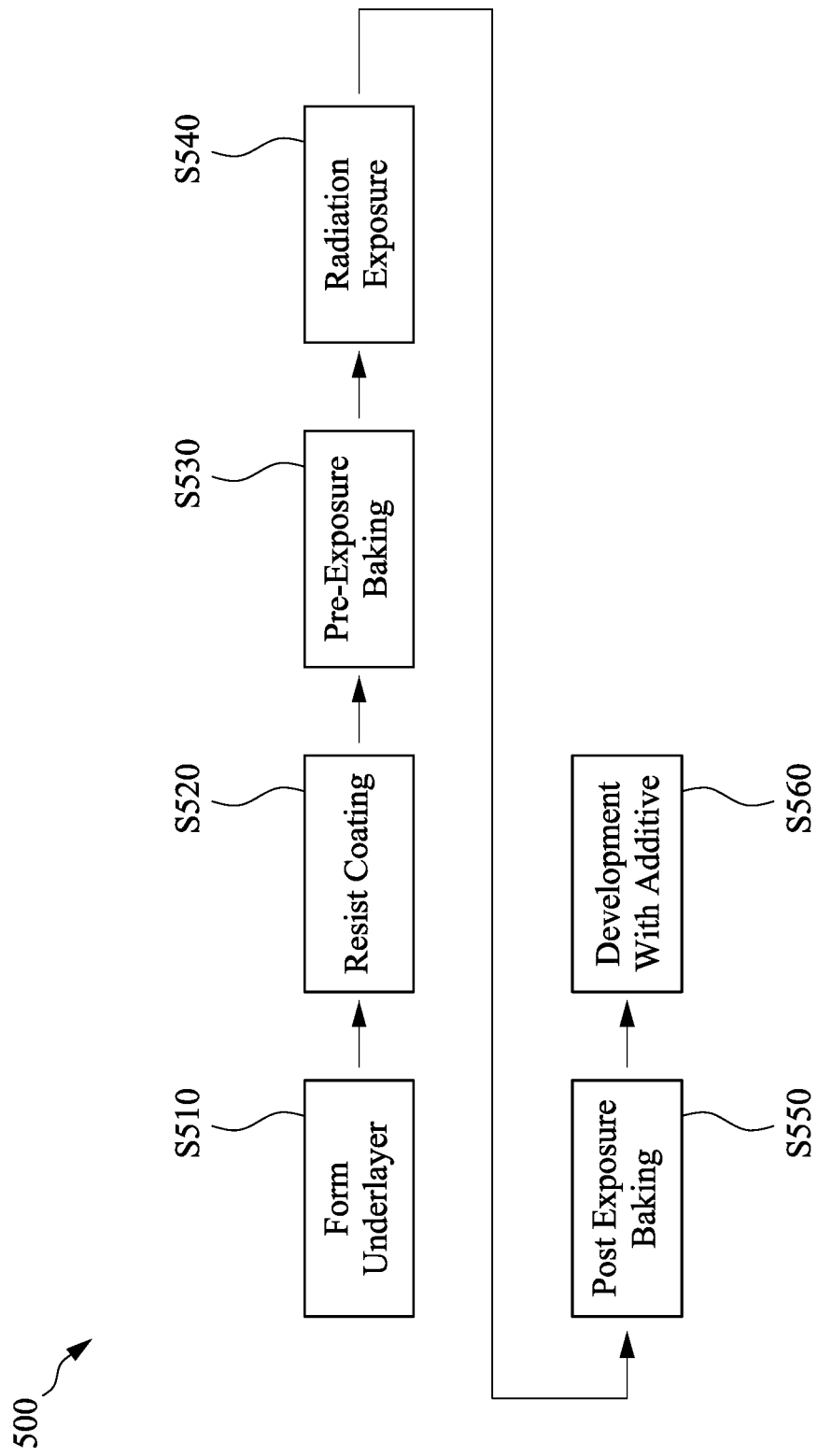
FIG. 5 illustrates a process flow of manufacturing a semiconductor device according to embodiments of the disclosure.

Another embodiment of the disclosure is illustrated in FIG. 5. A method 500 of manufacturing a semiconductor device optionally includes an operation S510 of forming an underlayer 20 including a bottom layer 20a and a middle layer 20b over a substrate 10 (see FIG. 6B) by coating a bottom layer composition over the substrate 10, and then coating a middle layer composition over the bottom layer 20a. In some embodiments, a resist composition is subsequently coated over the underlayer 20 in operation S520 to form a resist layer 15 (see FIGS. 6A, 6B, 7B and 8D). In some embodiments, a heating (or baking) operation is performed after either or both of the coating the bottom layer composition and coating the middle layer composition. In some embodiments, the resist is a metal-containing photoresist formed by chemical vapor deposition (CVD) or atomic layer deposition (ALD). In other embodiments, the metal-containing photoresist layer is formed by a spin-coating method.

In some embodiments, the resist layer 15 undergoes a pre-exposure baking operation S530 (or first heating operation) after the resist layer 15 is formed. In some embodiments, the first heating operation S530 includes heating the resist layer 15 at a temperature of between about 40° C. and about 150° C. for about 10 seconds to about 10 minutes.

The resist layer 15 is subsequently selectively exposed to actinic radiation 45/97 (see FIGS. 12C and 12F) in operation S540. In some embodiments, the photoresist layer 15 is selectively or patternwise exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the resist layer 15 is selectively or patternwise exposed to an electron beam. In some embodiments, the resist layer 15 is a photoresist layer that is photosensitive to the actinic radiation 45/97.

As shown in FIG. 12C, the exposure radiation 45 passes through a photomask 30 before irradiating the photoresist layer 15 in some embodiments. In some embodiments, the selective or patternwise exposure of the photoresist layer 15 to form exposed regions 50 and unexposed regions 52 is performed using extreme ultraviolet lithography. In an extreme ultraviolet lithography operation, a reflective photomask 65 is used to form the patterned exposure light in some embodiments, as shown in FIG. 12F. The photomasks, exposure radiation, and exposure conditions are the same as those described herein with reference to method 100 and operation S150.

A post exposure baking (PEB) operation S550 is subsequently performed in some embodiments. In some embodiments, the resist layer 15 is heated at a temperature of about 50° C. to about 250° C. for about 20 seconds to about 300 seconds. In some embodiments, the post-exposure baking is performed at a temperature ranging from about 100° C. to about 230° C., and at a temperature ranging from about 150° C. to about 200° C. in other embodiments. In some embodiments, the post-exposure baking operation S550 causes the reaction product of a first compound or first precursor and a second compound or second precursor in the resist layer to crosslink.

The selectively exposed resist layer 15 is subsequently developed in operation S560. The resist layer 15 is developed by applying a solvent-based developer 58 that includes an additive to inhibit or prevent degradation of the resist by free radicals, such as hydrogen radicals, to the selectively exposed resist layer. As shown in FIG. 16C, a liquid developer 58 is supplied from a dispenser 62 to the top layer 25 and the resist layer 15. In some embodiments, the exposed portions 50 of the photoresist layer undergo a crosslinking reaction as a result of the exposure to actinic radiation or the post-exposure bake, and the unexposed portion of the photoresist layer 52 is removed by the developer 58 forming a pattern of openings 55 in the photoresist layer 15 to expose the substrate 10, as shown in FIG. 18B.

In some embodiments, the resist developer 58 includes a solvent, the additive, and an acid or a base. In some embodiments, the concentration of the solvent is from about 60 wt. % to about 99 wt. % based on the total weight of the resist developer. In some embodiments, the concentration of the additive in the developer ranges from about 0.001 wt. % to about 40 wt. % based on the total weight of the developer. In some embodiments, the concentration of the additive in the developer ranges from about 0.1 wt. % to about 20 wt. % based on the total weight of the developer. The acid or base concentration is from about 0.001 wt. % to about 20 wt. % based on the total weight of the resist developer. In certain embodiments, the acid or base concentration in the developer is from about 0.01 wt. % to about 15 wt. % based on the total weight of the resist developer. At developer compositions outside the disclosed composition ranges line width roughness may increase or there may be insufficient development of the resist pattern.

In some embodiments, the developer 58 is applied to the resist layer 15 using a spin-on process. In the spin-on process, the developer 58 is applied to the resist layer 15 from above the resist layer 15 while the resist-coated substrate is rotated, as shown in FIG. 16C. In some embodiments, the developer 58 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 20° C. and about 150° C. The development operation continues for between about 30 seconds to about 10 minutes in some embodiments.

In some embodiments, the developer 58 includes an organic solvent. The organic solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, 4-methyl-2-pentanol, acetone, methyl ethyl ketone, dimethylformamide (DMF), isopropanol (IPA), tetrahydrofuran (THF), methyl isobutyl carbinol (MIBC), n-butyl acetate (nBA), 2-heptanone (MAK), and dioxane.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

The development operation S560 provides a pattern 55 in the photoresist layer exposing portions of the substrate 10, as shown in FIG. 18B. After the development operation, additional processing is performed while the patterned photoresist layer 15, 50 is in place. For example, an etching operation, using dry or wet etching, is performed in some embodiments, to transfer the pattern 55 of the resist layer 15, 50 to the underlying substrate 10, forming recesses 55' as shown in FIG. 19. The substrate 10 has a different etch resistance than the resist layer 15. In some embodiments, the etchant is more selective to the substrate 10 than the resist layer 15. In some embodiments, the patterned resist layer 15, 50 is at least partially removed during the etching operation in some embodiments. In other embodiments, the patterned resist layer 15, 50 is removed after etching the substrate 10 by selective etching, using a suitable resist stripper solvent, or by a resist plasma ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal-nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric material having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

Figure 6B:
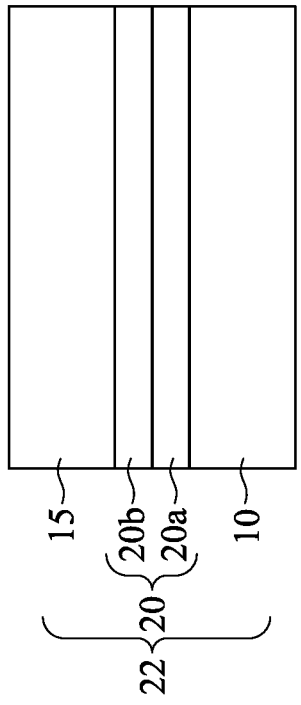
FIGS. 6A, 6B, 6C, and 6D show process stages of a sequential operation according to embodiments of the disclosure.
Figure 6A:
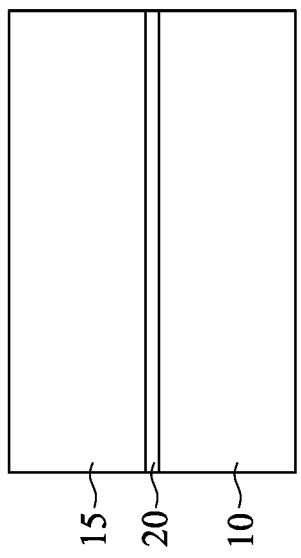
Figure 6D:
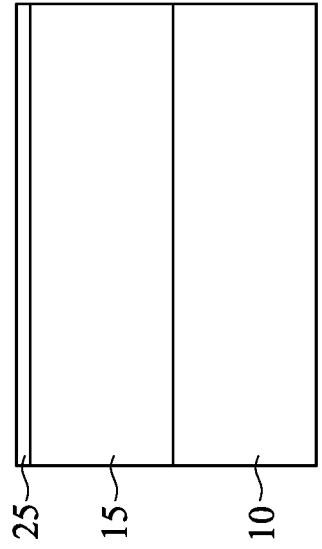
Figure 6C:
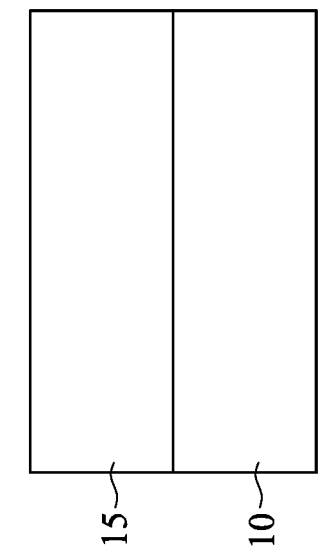

As shown in FIG. 6B, in some embodiments, the resist structure 22 is a tri-layer resist structure including a bottom layer 20a, middle layer 20b, and an upper layer 15. The upper layer 15 of the tri-layer resist structure 22 is a photosensitive layer or photoresist layer.

In some embodiments, the bottom layer 20a is an organic material having a substantially planar upper surface, and the middle layer 20b is an anti-reflective layer. In some embodiments, the organic material of the bottom layer 20a includes a plurality of monomers or polymers that are not cross-linked. In some embodiments, the bottom layer 20a contains a material that is patternable and/or has a composition tuned to provide anti-reflection properties. Exemplary materials for the bottom layer 20a include carbon backbone polymers. The bottom layer 20a is used to planarize the structure, as the underlying structure may be uneven depending on the structure of devices in an underlying device layer. In some embodiments, the bottom layer 20a is formed by a spin coating process. In certain embodiments, the thickness of the bottom layer 20a ranges from about 3 nm to about 500 nm.

The middle layer 20b of the tri-layer resist structure 22 may have a composition that provides anti-reflective properties for the photolithography operation and/or hard mask properties. In some embodiments, the middle layer 20b includes a silicon-containing layer (e.g., a silicon hard mask material). The middle layer 20b may include a silicon-containing inorganic polymer. In other embodiments, the middle layer 20b includes a siloxane polymer. In other embodiments, the middle layer 20b includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The middle layer 20b may be bonded to adjacent layers, such as by covalent bonding, hydrogen bonding, or hydrophilic-to-hydrophilic forces. In some embodiments, the middle layer 20b includes the additive at a concentration ranging from about 0.001 wt. % to about 30 wt. % based on the total weight of the middle layer 20b. At concentrations of the additive below the disclosed range, there may be no significant of the additive. At concentrations above the disclosed range, there may be no significant improvement in the desired effects, or there may be unacceptable degradation in the beneficial properties of the middle layer. In some embodiments, the thickness of the middle layer 20b ranges from about 10 nm to about 200 nm.

In some embodiments, the underlayer 20 or top layer 25 includes a composition including a binder, such as a hexamethyldisilazane (HMDS), a polymethylmethacrylate (PMMA), a polyhydroxystyrene (PHS), or a spin-on carbon (SOC); the additive; and a solvent. In some embodiments, the underlayer 20 or top layer 25 are formed by spin-coating. In some embodiments, the thickness of the underlayer 20 ranges from about 10 nm to about 200 nm. In some embodiments, the thickness of the top layer 25 ranges from about 3 nm to about 100 nm. Underlayer and top layer thicknesses below this range may not provide a significant improvement in the desired properties. Underlayer thicknesses above this range may not provide any additional benefit. Top layer thicknesses above the disclosed range may interfere with photolithographic patterning of the resist.

In some embodiments, the solvent in the underlayer or top layer composition is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, 4-methyl-2-pentanol, acetone, methyl ethyl ketone, dimethylformamide (DMF), isopropanol (IPA), tetrahydrofuran (THF), methyl isobutyl carbinol (MIBC), n-butyl acetate (nBA), 2-heptanone (MAK), and dioxane.

In some embodiments, the additive to inhibit or prevent degradation of the resist by free radicals includes one or more of a radical inhibitor, a thermal radical initiator, and a photo radical initiator.

Figure 20:
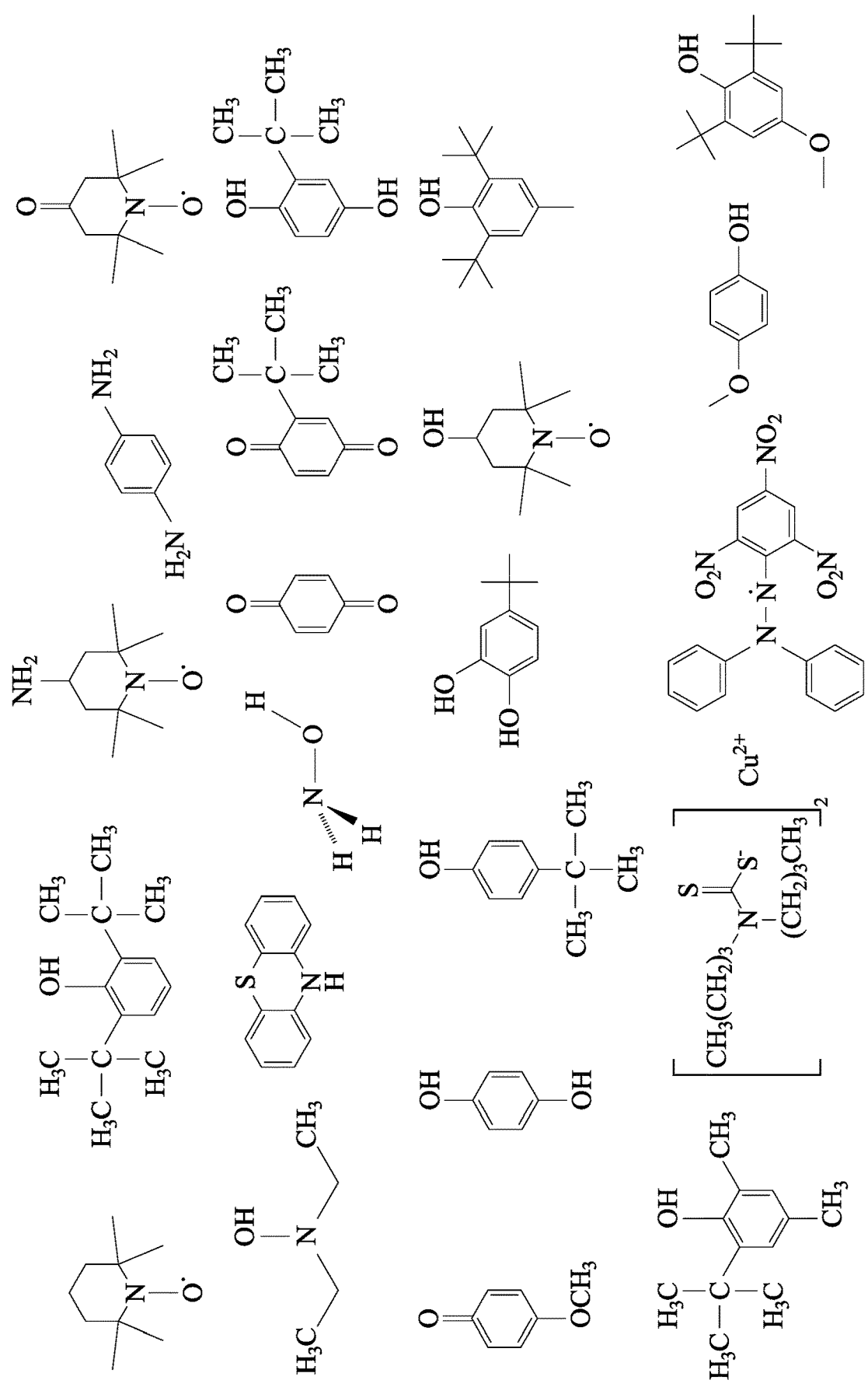
FIG. 20 shows examples of radical inhibitors according to embodiments of the disclosure.

In some embodiments, the radical inhibitor is one or more selected from the group consisting of phenothiazine, 2-tert-butyl-1,4-benzoquinone, 1,4-benzoquinone, hydroquinone, 4-tert-butylpyrocatechol, 2,6-di-tert-butylphenol, 4-methoxyphenol, p-phenylenediamines, phenothiazine, hydroxylamines, diethylhydroxylamine, 2,2,6,6-tetramethylpiperidine 1-oxyl, 4-amino-2,2,6,6-tetramethylpiperidine 1-oxyl, 1,1-diphenyl-2-picrylhydrazyl free radical, copper (II) dibutyldithiocarbamate, tert-butylhydroquinone, 6-tert-butyl-2,4-xylenol, 2,6-di-tert-butyl-p-cresol, 4-hydroxy-2,2,6,6-tetramethylpiperidine 1-oxyl (4-hydroxy-TEMPO, 97%), 4-oxo-2,2,6,6-tetramethylpiperidine 1-oxyl, 2,6-di-tert-butyl-4-methylphenol (BHT, (99%), tert-butyl hydroquinone (TBHQ, 97%), 2,6-di-tert-butyl-4-methoxyphenol (DTBMP, 98%), and 4-methoxyphenol. Examples of the radical inhibitor according to embodiments of the disclosure are shown in FIG. 20.

Figure 21:
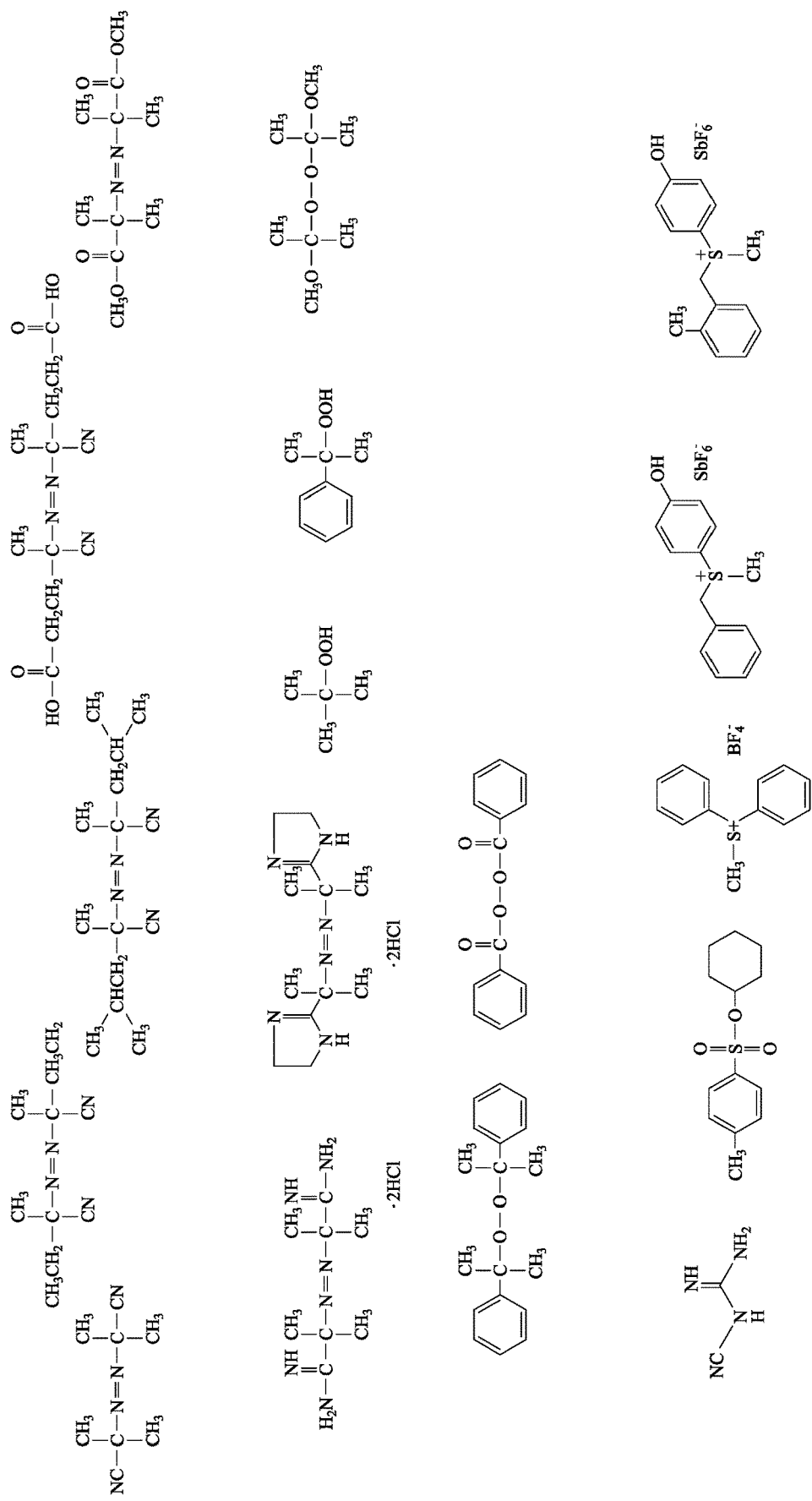
FIG. 21 shows examples of thermal radical initiators according to embodiments of the disclosure.

In some embodiments, the thermal radical initiator is one or more selected from the group consisting of azobisisobutyronitrile (AIBN), 2,2'-azodi(2-methylbutyronitrile) (AMBN), 2,2'-azobis(2,4-dimethyl)valeronitrile (ADVN), 4,4'-azobis(4-cyanopentanoic acid) (ACVA), dimethyl 2,2'-azobis(2-methylpropionate), 2,2'-azobis(2-amidinopropane) dihydrochloride (AAPH), 2,2'-azobis[2-(2-imidazolin-2-yl)-propane] dihydrochloride, tert-butyl-hydroperoxide (TBHP), cumene hydroperoxide, di-tert-butyl peroxide, dicumyl peroxide, benzoyl peroxide (BPO), dicyandiamide, cyclohexyl tosylate, diphenyl(methyl)sulfonium tetrafluoroborate, benzyl(4-hydroxyphenyl)-methylsulfonium hexafluoroantimonate, and (4-hydroxyphenyl)methyl-(2-methylbenzyl)sulfonium hexafluoroantimonate. Examples of the thermal radical initiator according to embodiments of the disclosure are shown in FIG. 21.

Figure 22A:
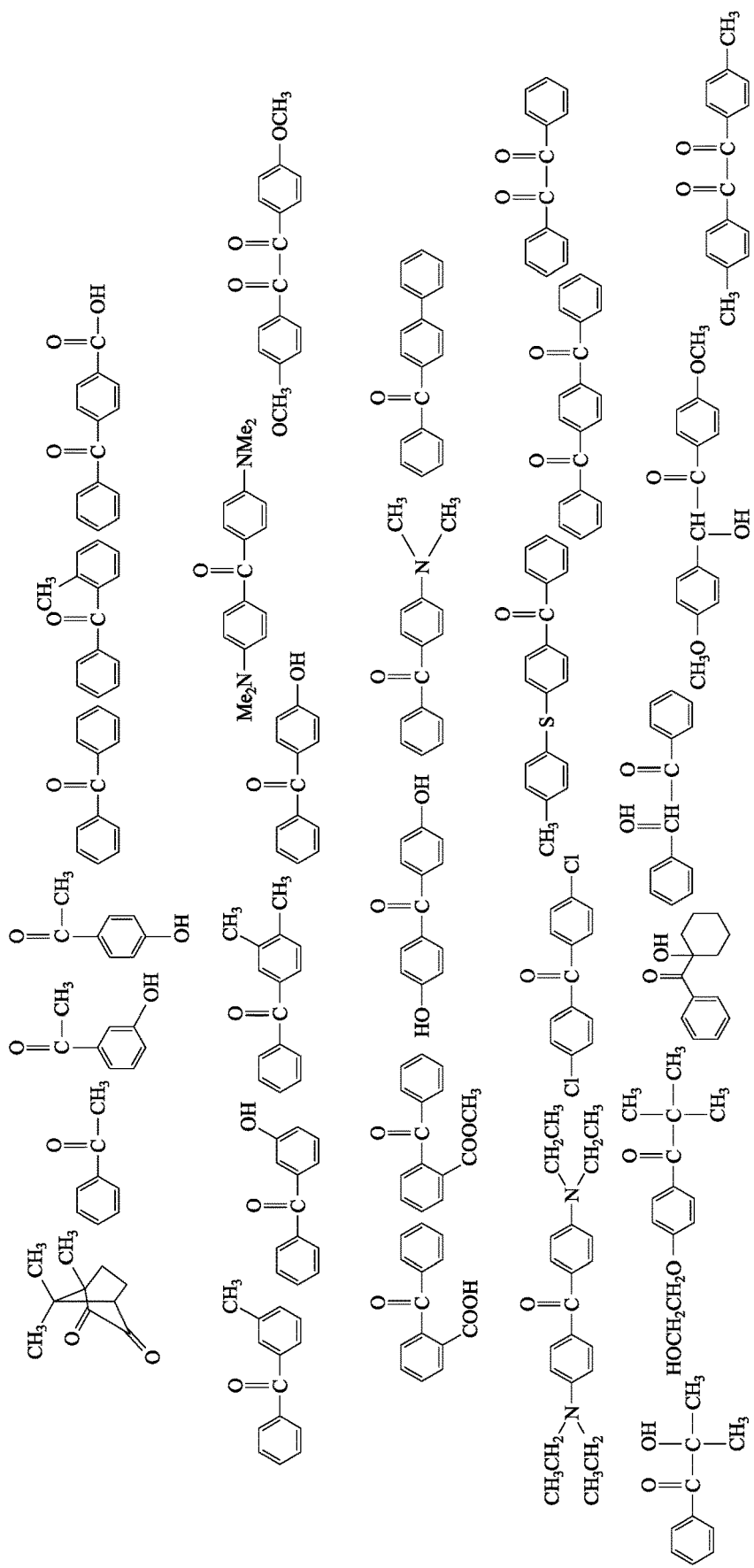
FIGS. 22A and 22B show examples of photo radical initiators according to embodiments of the disclosure.
Figure 22B:
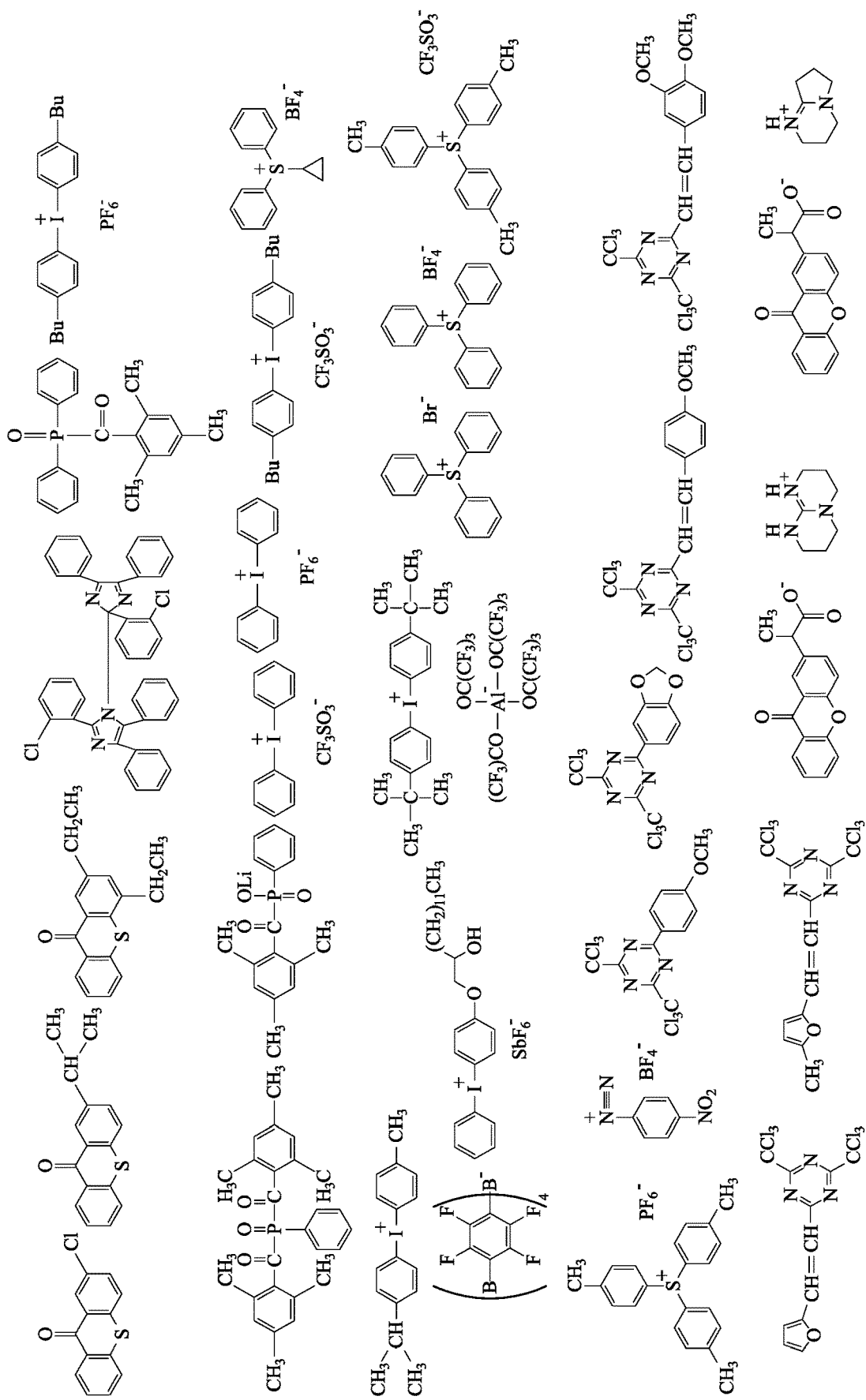

In some embodiments, the photo radical initiator is one or more selected from the group consisting of camphorquinone, acetophenone, 3-acetophenol, 4-acetophenol, benzophenone, 2-methylbenzophenone, 3-methylbenzophenone, 3-hydroxybenzophenone, 3,4-dimethylbenzophenone, 4-hydroxybenzophenone, 4-benzoylbenzoic acid, 2-benzoylbenzoic acid, methyl 2-benzoylbenzoate, 4,4'-dihydroxybenzophenone, 4-(dimethylamino)-benzophenone, 4,4'-bis(dimethylamino)-benzophenone, 4,4'-bis(diethylamino)-benzophenone, 4,4'-dichlorobenzophenone, 4-(p-tolylthio)benzophenone, 4-phenylbenzophenone, 1,4-dibenzoylbenzene, benzil, 4,4'-dimethylbenzil, p-anisil, 2-benzoyl-2-propanol, 2-hydroxy-4'-(2-hydroxyethoxy)-2-methylpropiophenone, 1-benzoylcyclohexanol, benzoin, and anisoin. Examples of the thermal radical initiator according to embodiments of the disclosure are shown in FIGS. 22A and 22 B.

In some embodiments, the concentration of the additive is about 0.001 wt. % to about 30 wt. % based on a total weight of the underlayer 20 or top layer 25. At concentrations of the additive below the disclosed range there may not be a significant improvement in resist properties. At concentrations of the additive above the disclosed range there may be no additional significant improvement in resist properties, and there may be a deleterious impact on the resist properties.

The resist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

In some embodiments, the photoresist layer includes a high sensitivity photoresist composition. In some embodiments, the high sensitivity photoresist composition includes a metal that has a high absorbance of extreme ultraviolet (EUV) radiation.

Figure 23A:
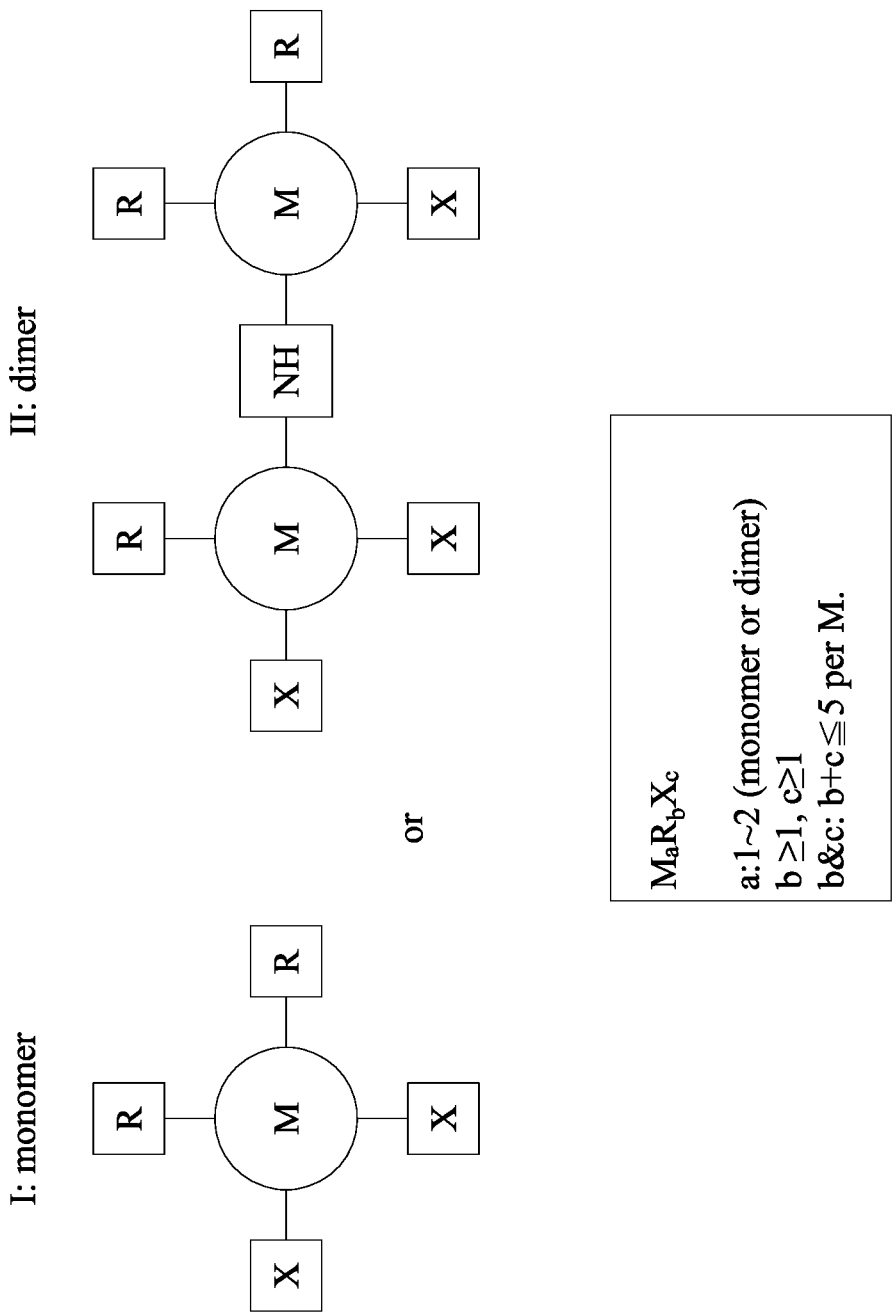
FIGS. 23A, 23B, and 23C show organometallic precursors according to embodiments of the disclosure.

In some embodiments, the photoresist layer 15 is made of a photoresist composition, including a first compound or a first precursor and a second compound or a second precursor combined in a vapor state. The first precursor or first compound is an organometallic having a formula: $M_aR_bX_c$, as shown in FIG. 23A, where M is at least one of Sn, Bi, Sb, In, Te, Ti, Zr, Hf, V, Co, Mo, W, Al, Ga, Si, Ge, P, As, Y, La, Ce, or Lu; and R is a substituted or unsubstituted alkyl, alkenyl, or carboxylate group. In some embodiments, M is selected from the group consisting of Sn, Bi, Sb, In, Te, and combinations thereof. In some embodiments, R is a C3-C6 alkyl, alkenyl, or carboxylate. In some embodiments, R is selected from the group consisting of propyl, isopropyl, butyl, iso-butyl, sec-butyl, tert-butyl, pentyl, isopentyl, sec-pentyl, tert-pentyl, hexyl, iso-hexyl, sec-hexyl, tert-hexyl, and combinations thereof. X is a ligand, ion, or other moiety, which is reactive with the second compound or second precursor; and $1 \leq a \leq 2$, $b \geq 1$, $c \geq 1$, and $b+c \leq 5$ in some embodiments. In some embodiments, the alkyl, alkenyl, or carboxylate group is substituted with one or more fluoro groups. In some embodiments, the organometallic precursor is a dimer, as shown in FIG. 23A, where each monomer unit is linked by an amine group. Each monomer has a formula: $M_aR_bX_c$, as defined above.

In some embodiments, R is alkyl, such as $C_nH_{2n+1}$ where $n \geq 3$. In some embodiments, R is fluorinated, e.g., having the formula $C_nF_xH_{((2n+1)-x)}$. In some embodiments, R has at least one beta-hydrogen or beta-fluorine. In some embodiments, R is selected from the group consisting of i-propyl, n-propyl, t-butyl, i-butyl, n-butyl, sec-butyl, n-pentyl, i-pentyl, t-pentyl, and sec-pentyl, and combinations thereof.

In some embodiments, X is any moiety readily displaced by the second compound or second precursor to generate an M-OH moiety, such as a moiety selected from the group consisting of amines, including dialkylamino and monalkylamino; alkoxy; carboxylates, halogens, and sulfonates. In some embodiments, the sulfonate group is substituted with one or more amine groups. In some embodiments, the halide is one or more selected from the group consisting of F, Cl, Br, and I. In some embodiments, the sulfonate group includes a substituted or unsubstituted C1-C3 group.

Figure 23B:
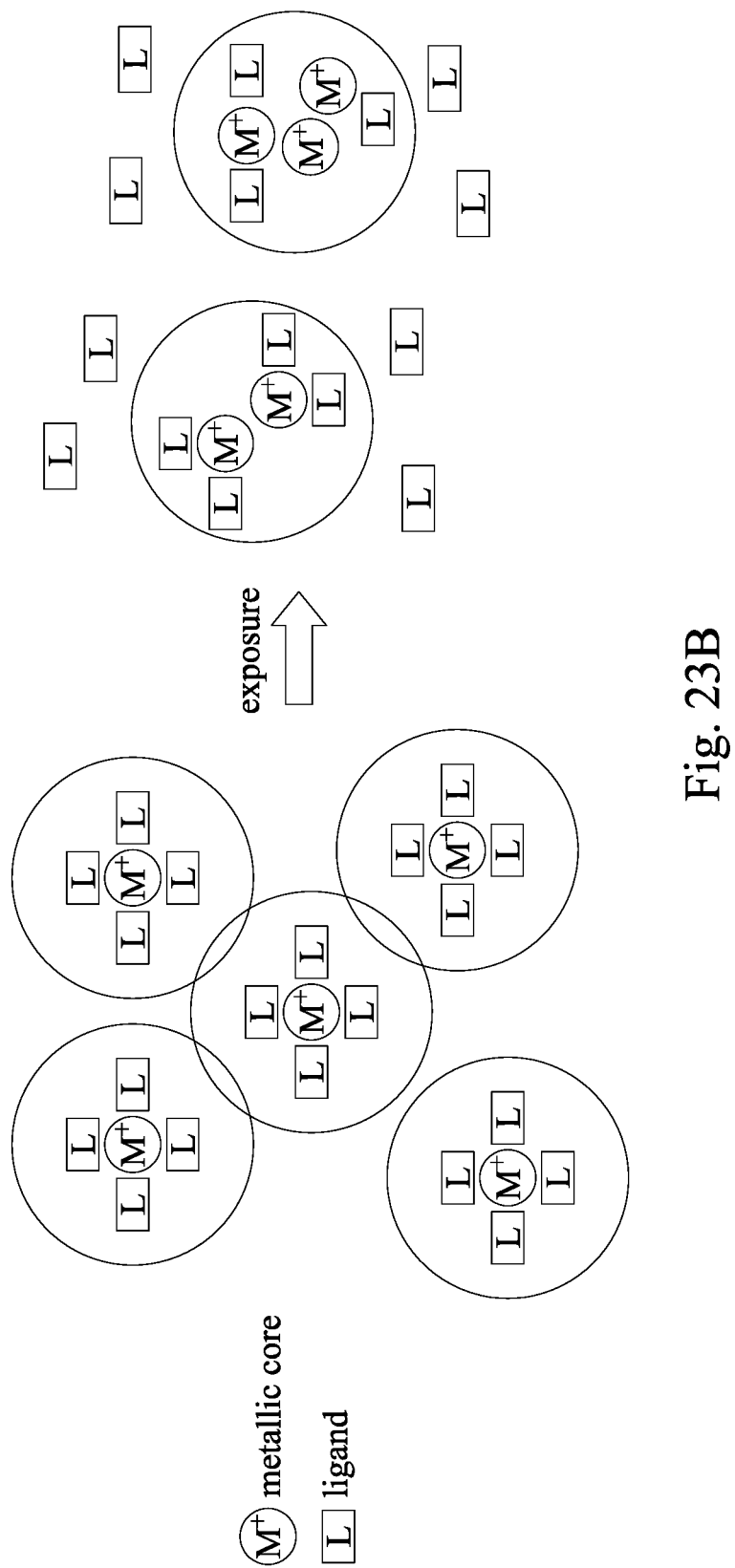

In some embodiments, the first organometallic compound or first organometallic precursor includes a metallic core $M^+$ with ligands L attached to the metallic core $M^+$, as shown in FIG. 23B. In some embodiments, the metallic core $M^+$ is a metal oxide. The ligands L include C3-C12 aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In some embodiments, the C3-C12 aliphatic or aromatic groups include nitrite and sulfonate substituents.

In some embodiments, the organometallic precursor or organometallic compound include a sec-hexyl tris(dimethylamino) tin, t-hexyl tris(dimethylamino) tin, i-hexyl tris(dimethylamino) tin, n-hexyl tris(dimethylamino) tin, sec-pentyl tris(dimethylamino) tin, t-pentyl tris(dimethylamino) tin, i-pentyl tris(dimethylamino) tin, n-pentyl tris(dimethylamino) tin, sec-butyl tris(dimethylamino) tin, t-butyl tris(dimethylamino) tin, i-butyl tris(dimethylamino) tin, n-butyl tris(dimethylamino) tin, sec-butyl tris(dimethylamino) tin, i-propyl(tris)dimethylamino tin, n-propyl tris(diethylamino) tin, and analogous alkyl(tris)(t-butoxy) tin compounds, including sec-hexyl tris(t-butoxy) tin, t-hexyl tris(t-butoxy) tin, i-hexyl tris(t-butoxy) tin, n-hexyl tris(t-butoxy) tin, sec-pentyl tris(t-butoxy) tin, t-pentyl tris(t-butoxy) tin, i-pentyl tris(t-butoxy) tin, n-pentyl tris(t-butoxy) tin, t-butyl tris(t-butoxy) tin, i-butyl tris(butoxy) tin, n-butyl tris(butoxy) tin, sec-butyl tris(butoxy) tin, i-propyl(tris)dimethylamino tin, or n-propyl tris(butoxy) tin. In some embodiments, the organometallic precursors or organometallic compounds are fluorinated. In some embodiments, the organometallic precursors or compounds have a boiling point less than about 200° C.

In some embodiments, the first compound or first precursor includes one or more unsaturated bonds that can be coordinated with a functional group, such as a hydroxyl group, on the surface of the substrate or an intervening underlayer to improve adhesion of the photoresist layer to the substrate or underlayer.

In some embodiments, the second precursor or second compound is at least one of an amine, a borane, a phosphine, or water. In some embodiments, the amine has a formula $N_pH_nX_m$, where $0 \le n \le 3$, $0 \le m \le 3$, $n+m=3$ when p is 1, and $n+m=4$ when p is 2, and each X is independently a halogen selected from the group consisting of F, Cl, Br, and I. In some embodiments, the borane has a formula $B_pH_nX_m$, where $0 \le n \le 3$, $0 \le m \le 3$, $n+m=3$ when p is 1, and $n+m=4$ when p is 2, and each X is independently a halogen selected from the group consisting of F, Cl, Br, and I. In some embodiments, the phosphine has a formula $P_pH_nX_m$, where $0 \le n \le 3$, $0 \le m \le 3$, $n+m=3$, when p is 1, or $n+m=4$ when p is 2, and each X is independently a halogen selected from the group consisting of F, Cl, Br, and I.

In some embodiments, the second precursor or compound is water, ammonia, or hydrazine. The reaction product of the water, ammonia, or hydrazine and the organometallic precursor or compound may form hydrogen bonds that increase the boiling point of the reaction product and prevent emission of the metal photoresist material, thereby preventing metal contamination. The hydrogen bonds can also help prevent moisture effects to the photoresist layer quality.

FIG. 23B shows a reaction metallic precursors undergo as a result of exposure to actinic radiation in some embodiments. As a result of exposure to the actinic radiation, ligand groups L are split off from the metallic core $M^+$ of the metallic precursors, and two or more metallic precursor cores bond with each other.

Figure 23C:
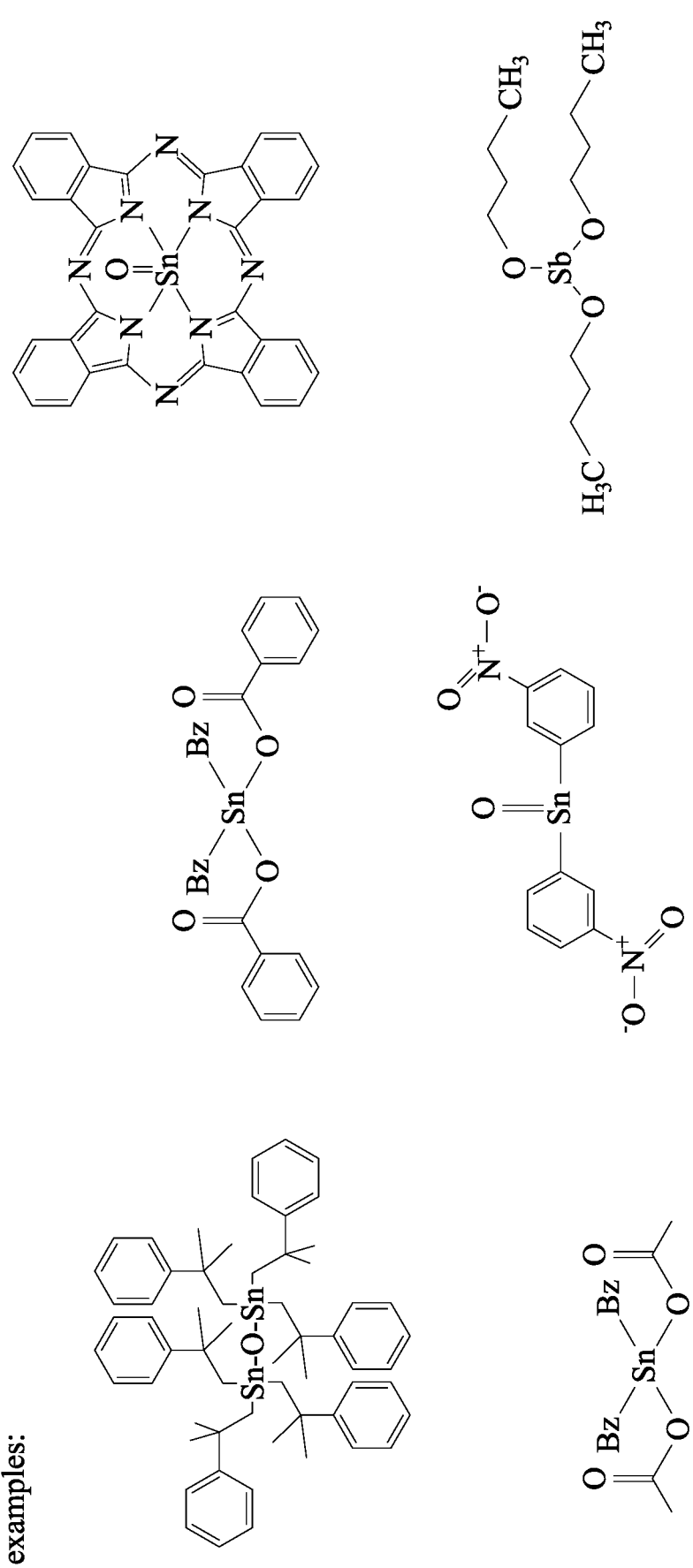

FIG. 23C shows examples of organometallic precursors according to embodiments of the disclosure. In FIG. 23C Bz is a benzene group.

In some embodiments, the operation S130, S220, S320, S420, S520 of coating a resist over a substrate or underlying layer is performed by a vapor phase deposition operation. In some embodiments, the vapor phase deposition operation includes atomic layer deposition (ALD) or chemical vapor deposition (CVD). In some embodiments, the ALD includes plasma-enhanced atomic layer deposition (PE-ALD), and the CVD includes plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD).

Figure 24:
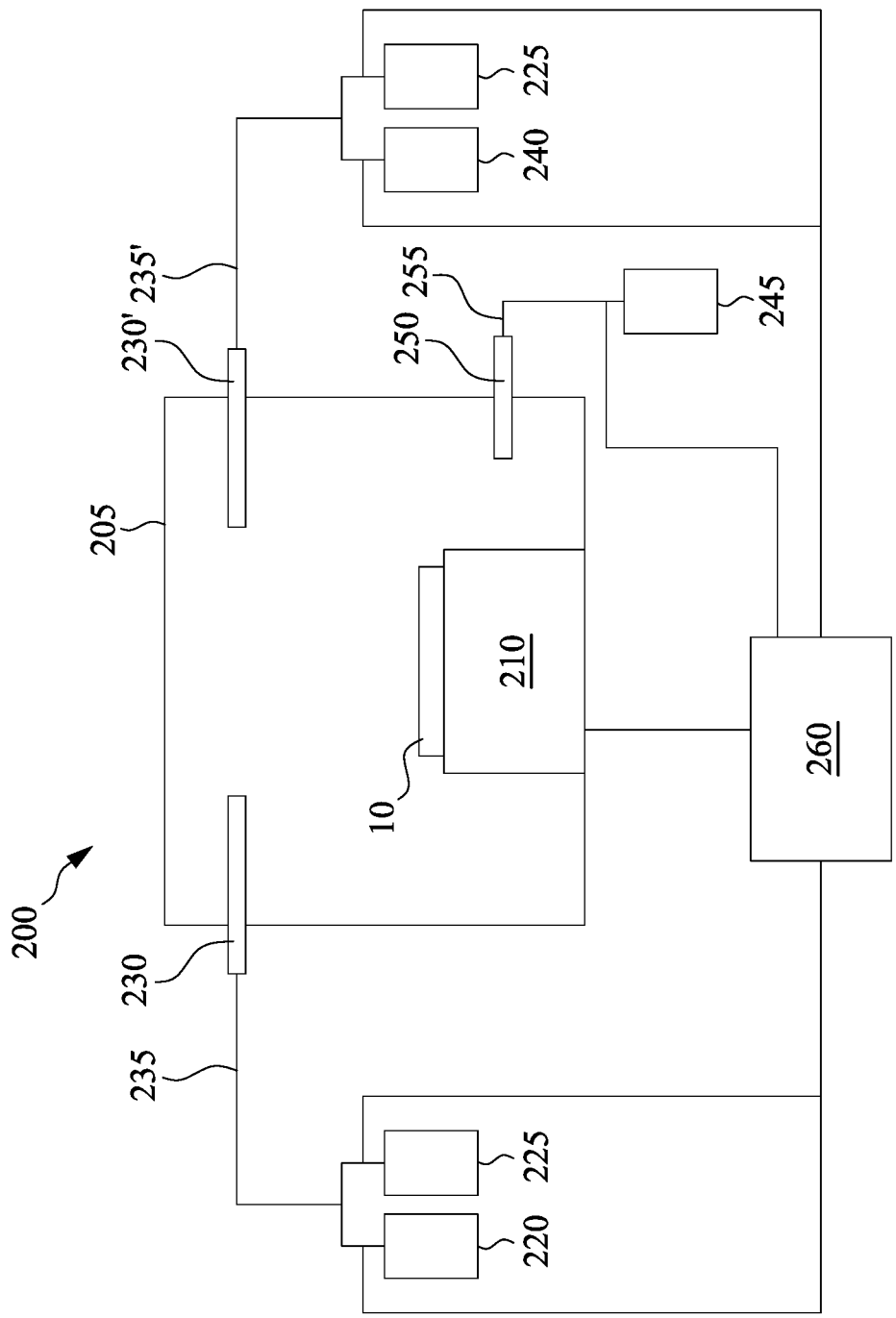
FIG. 24 shows a photoresist deposition apparatus according to some embodiments of the disclosure.

A resist layer deposition apparatus 200 according to some embodiments of the disclosure is shown in FIG. 24. In some embodiments, the deposition apparatus 200 is an ALD or CVD apparatus. The deposition apparatus 200 includes a vacuum chamber 205. A substrate support stage 210 in the vacuum chamber 205 supports a substrate 10, such as silicon wafer. In some embodiments, the substrate support stage 210 includes a heater. A first precursor or compound gas supply 220 and carrier/purge gas supply 225 are connected to an inlet 230 in the chamber via a gas line 235, and a second precursor or compound gas supply 240 and carrier/purge gas supply 225 are connected to another inlet 230' in the chamber via another gas line 235' in some embodiments. The chamber is evacuated, and excess reactants and reaction byproducts are removed by a vacuum pump 245 via an outlet 250 and exhaust line 255. In some embodiments, the flow rate or pulses of precursor gases and carrier/purge gases, evacuation of excess reactants and reaction byproducts, pressure inside the vacuum chamber 205, and temperature of the vacuum chamber 205 or wafer support stage 210 are controlled by a controller 260 configured to control each of these parameters.

Depositing a photoresist layer includes combining the first compound or first precursor and the second compound or second precursor in a vapor state to form the photoresist composition in some embodiments. In some embodiments, the first compound or first precursor and the second compound or second precursor of the photoresist composition are introduced into the deposition chamber 205 (CVD chamber) at about the same time via the inlets 230, 230'. In some embodiments, the first compound or first precursor and second compound or second precursor are introduced into the deposition chamber 205 (ALD chamber) in an alternating manner via the inlets 230, 230', i.e.—first one compound or precursor then a second compound or precursor, and then subsequently alternately repeating the introduction of the one compound or precursor followed by the second compound or precursor.

In some embodiments, the deposition chamber temperature ranges from about 30° C. to about 400° C. during the deposition operation, and between about 50° C. to about 250° C. in other embodiments. In some embodiments, the pressure in the deposition chamber ranges from about 5 mTorr to about 100 Torr during the deposition operation, and between about 100 mTorr to about 10 Torr in other embodiments. In some embodiments, the plasma power is less than about 1000 W. In some embodiments, the plasma power ranges from about 100 W to about 900 W. In some embodiments, the flow rate of the first compound or precursor and the second compound or precursor ranges from about 100 sccm to about 1000 sccm. In some embodiments, the ratio of the flow of the organometallic compound precursor to the second compound or precursor ranges from about 1:1 to about 1:5. At operating parameters outside the above-recited ranges, unsatisfactory photoresist layers result in some embodiments. In some embodiments, the photoresist layer formation occurs in a single chamber (a one-pot layer formation).

In a CVD process according to some embodiments of the disclosure, two or more gas streams, in separate inlet paths 230, 235 and 230', 235', of an organometallic precursor and a second precursor are introduced to the deposition chamber 205 of a CVD apparatus, where they mix and react in the gas phase, to form a reaction product. The streams are introduced using separate injection inlets 230, 230' or a dual-plenum showerhead in some embodiments. The deposition apparatus is configured so that the streams of organometallic precursor and second precursor are mixed in the chamber, allowing the organometallic precursor and second precursor to react to form a reaction product. Without limiting the mechanism, function, or utility of the disclosure, it is believed that the product from the vapor-phase reaction becomes heavier in molecular weight, and is then condensed or otherwise deposited onto the substrate 10.

In some embodiments, an ALD process is used to deposit the photoresist layer. During ALD, a layer is grown on a substrate 10 by exposing the surface of the substrate to alternate gaseous compounds (or precursors). In contrast to CVD, the precursors are introduced as a series of sequential, non-overlapping pulses. In each of these pulses, the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In an embodiment of an ALD process, an organometallic precursor is pulsed to deliver the metal-containing precursor to the substrate 10 surface in a first half reaction. In some embodiments, the organometallic precursor reacts with a suitable underlying species (for example OH or NH functionality on the surface of the substrate) to form a new self-saturating surface. Excess unused reactants and the reaction by-products are removed, by an evacuation-pump down using a vacuum pump 245 and/or by a flowing an inert purge gas in some embodiments. Then, a second precursor, such as ammonia ($NH_3$), is pulsed to the deposition chamber in some embodiments. The $NH_3$ reacts with the organometallic precursor on the substrate to obtain a reaction product photoresist on the substrate surface. The second precursor also forms self-saturating bonds with the underlying reactive species to provide another self-limiting and saturating second half reaction. A second purge is performed to remove unused reactants and the reaction by-products in some embodiments. Pulses of the first precursor and second precursor are alternated with intervening purge operations until a desired thickness of the photoresist layer is achieved.

In some embodiments, the photoresist layer 15 is formed to a thickness of about 5 nm to about 50 nm, and to a thickness of about 10 nm to about 30 nm in other embodiments. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the photoresist layers. In some embodiments, each photoresist layer thickness is relatively uniform to facilitate processing. In some embodiments, the variation in thickness of the deposited photoresist layer varies by no more than ±25% from the average thickness, in other embodiments each photoresist layer thickness varies by no more than ±10% from the average photoresist layer thickness. In some embodiments, such as high uniformity depositions on larger substrates, the evaluation of the photoresist layer uniformity may be evaluated with a 1 centimeter edge exclusion, i.e., the layer uniformity is not evaluated for portions of the coating within 1 centimeter of the edge. A person of ordinary skill in the art will recognize that additional ranges within the explicit ranges above are contemplated and are within the present disclosure.

In some embodiments, the first and second compounds or precursors are delivered into the deposition chamber 205 with a carrier gas. The carrier gas, a purge gas, a deposition gas, or other process gas may contain nitrogen, hydrogen, argon, neon, helium, or combinations thereof.

In some embodiments, the organometallic compound includes tin (Sn), antimony (Sb), bismuth (Bi), indium (In), and/or tellurium (Te) as the metal component, however, the disclosure is not limited to these metals. In other embodiments, additional suitable metals include titanium (Ti), zirconium (Zr), hafnium (Hf), vanadium (V), cobalt (Co), molybdenum (Mo), tungsten (W), aluminum (Al), gallium (Ga), silicon (Si), germanium (Ge), phosphorus (P), arsenic (As), yttrium (Y), lanthanum (La), cerium (Ce), lutetium (Lu), or combinations thereof. The additional metals can be as alternatives to or in addition to the Sn, Sb, Bi, In, and/or Te.

The particular metal used may significantly influence the absorption of radiation. Therefore, the metal component can be selected based on the desired radiation and absorption cross section. Tin, antimony, bismuth, tellurium, and indium provide strong absorption of extreme ultraviolet light at 13.5 nm. Hafnium provides good absorption of electron beam and extreme UV radiation. Metal compositions including titanium, vanadium, molybdenum, or tungsten have strong absorption at longer wavelengths, to provide, for example, sensitivity to 248 nm wavelength ultraviolet light.

Figure 25:
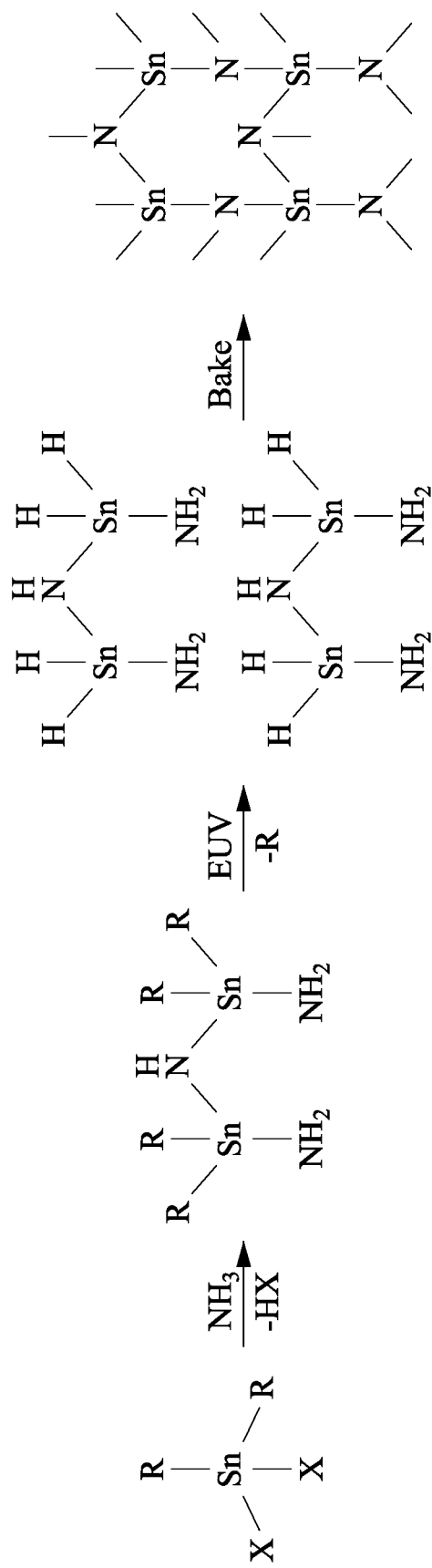
FIG. 25 shows a reaction the photoresist layer undergoes as a result of exposure to actinic radiation and heating according to an embodiment of the disclosure.

FIG. 25 shows a reaction the photoresist composition components undergo as a result of exposure to actinic radiation and heating according to an embodiment of the disclosure. FIG. 25 shows an exemplary chemical structure of the photoresist layer at various stages of the photoresist patterning method according to embodiments of the disclosure. As shown in FIG. 25, the photoresist composition includes an organometallic compound, for example $SnX_2R_2$, and a second compound, for example ammonia ($NH_3$). When the organometallic compound and the ammonia are combined, the organometallic compound reacts with some of the ammonia in the vapor phase to form a reaction product with amine groups attached to the metal (Sn) of the organometallic compound. The amine groups in the as deposited photoresist layer have hydrogen bonds that can substantially increase the boiling point of the deposited photoresist layer and prevent the outgassing of metal-containing photoresist material, thereby preventing contamination of the deposition chamber and semiconductor device processing equipment by the metal in the metal-containing photoresist. Moreover, the hydrogen bonds of the amine groups can control the effect moisture has on photoresist layer quality.

In some embodiments, the photoresist composition is an organic polymer-based composition in a solvent deposited by a spin-on coating procedure, followed by a first heating to remove the solvent.

When subsequently exposed to extreme ultraviolet radiation, the organometallic compound absorbs the extreme ultraviolet radiation and one or more organic R groups are cleaved from the organometallic compound to form an amino metallic compound in the radiation exposed areas. Then, when the post-exposure bake (PEB) S160, S280, S370, S450, S550 is performed, the amino metallic compounds crosslink through the amine groups in some embodiments, as shown in FIG. 25. In some embodiments, partial crosslinking of the amino metallic compounds occurs as a result of the exposure to extreme ultraviolet radiation.

FIGS. 7A-7C show sequential process stages of an operation to introduce the additive to inhibit or prevent degradation of the resist by radicals into the resist layer 15 according to an embodiment of the disclosure. An underlayer 20 including the additive is formed over a substrate 10, as shown in FIG. 7A. The underlayer composition can be any of the compositions disclosed herein and the method of forming the underlayer 20 can be any suitable method disclosed herein. A resist layer 15 is subsequently formed over the underlayer 20, as shown in FIG. 7B. The resist layer composition can be any of the compositions disclosed herein and the method of forming the resist layer 15 can be any suitable method disclosed herein. The resist layer 15 and underlayer 20 are subsequently heated or baked using a heater 21, as shown in FIG. 7C. In some embodiments, the heater 21 is a resistive heating element, an infrared heating element, or a hot plate. In some embodiments, the heating or baking operation (S140, S260, S370, S450) includes heating the resist layer 15 and underlayer 20 at a temperature of between about 40° C. and about 250° C. for about 10 seconds to about 10 minutes. The heating or baking operation causes the additive to diffuse from the underlayer 20 into the resist layer 15. In some embodiments, the additive diffuses throughout the resist layer 15. In some embodiments, the additive is diffused uniformly throughout the resist layer 15. In other embodiments, the additive diffused into the resist layer forms a concentration gradient that is highest at the resist layer 15/underlayer 20 interface.

FIGS. 8A-8E show sequential process stages of an operation to introduce the additive to inhibit or prevent degradation of the resist by radicals into the resist layer 15 according to an embodiment of the disclosure. An underlayer 20' is formed over a substrate 10, as shown in FIG. 8A. The underlayer composition can be any of the compositions disclosed herein without the additive and the method of forming the underlayer 20' can be any suitable method disclosed herein. The additive 19 is subsequently added to the underlayer 20', as shown in FIG. 8B. The additive 19 is introduced into the underlayer 20' by diffusing the additive from a vapor including the additive into the underlayer 20'. In some embodiments, a vapor including the additive is generated by evaporation of the additive, ALD, CVD, PE-ALD, PE-CVD, MO-CVD, AP-CVD, or LP-CVD. The concentration of the additive 19 in the vapor ranges from about 0.001 wt. % to about 100 wt. % based on the total weight of the vapor in some embodiments. In other embodiments, the additive 19 is dissolved in a solvent and the additive/solvent mixture is applied to the underlayer 20', and then solvent is removed by heating the underlayer 20' at a temperature ranging from about 60° C. to about 300° C. to form the underlayer 20 containing the additive, as shown in FIG. 8C. In some embodiments, the solvent is one or more organic or aqueous/inorganic solvents. The organic solvents include: PGMEA (propylene glycol methyl ether acetate), PGME (propylene glycol monomethyl ether), PGEE (1-ethoxy-2-propanol), GBL (gamma-butyrolactone), CHN (cyclohexanone), EL (ethyl lactate), methanol, ethanol, propanol, n-butanol, acetone, DMF (dimethylformamide), IPA (isopropyl alcohol), THF (tetrahydrofuran), methyl isobutyl carbinol (MIBC), nBA (n-butyl acetate), MAK(2-heptanone), TMAH (tetramethylammonium hydroxide), and TBAH (tetrabutylammonium hydroxide), combinations thereof, or the like. In some embodiments, the organic solvent is a low polarity solvent, including linear or branched alkanes, such as octane and 2-methylheptane; or an ether, including dipropyl ether and isoamyl ether. In some embodiments, the organic solvent is a liquid at room temperature, and has a boiling point ranging from about 60° C. to about 280° C. In some embodiments, the aqueous/inorganic solvent is one or more of water, KOH, NaOH, HCl, HF, or the like.

A resist layer 15 is subsequently formed over the underlayer 20, as shown in FIG. 8D. The resist layer composition can be any of the compositions disclosed herein and the method of forming the resist layer 20 can be any suitable method disclosed herein. The resist layer 15 and underlayer 20 are subsequently heated or baked using a heater 21, as shown in FIG. 8E. In some embodiments, the heater 21 is a resistive heating element, an infrared heating element, or a hot plate. In some embodiments, the heating or baking operation (S140, S260, S370, S450) includes heating the resist layer 15 and underlayer 20 at a temperature of between about 40° C. and about 250° C. for about 10 seconds to about 10 minutes. The heating or baking operation causes the additive to diffuse from the underlayer 20 into the resist layer 15. In some embodiments, the additive diffuses throughout the resist layer 15. In some embodiments, the additive is diffused uniformly throughout the resist layer 15. In other embodiments, the additive diffused into the resist layer forms a concentration gradient that is highest at the resist layer 15/underlayer 20 interface.

FIGS. 9A-9C show sequential process stages of an operation to introduce the additive to inhibit or prevent degradation of the resist by radicals into the resist layer 15 according to an embodiment of the disclosure. A resist layer 15 is formed over the substrate 10, as shown in FIG. 9A. The resist layer composition can be any of the compositions disclosed herein and the method of forming the resist layer 15 can be any suitable method disclosed herein. A top layer 25 including the additive is formed over a resist layer 15, as shown in FIG. 9B. The top layer composition can be any of the compositions disclosed herein and the method of forming the top layer 25 can be any suitable method disclosed herein. The resist layer 15 and top layer 25 are subsequently heated or baked using a heater 21, as shown in FIG. 9C. In some embodiments, the heater 21 is a resistive heating element, an infrared heating element, or a hot plate. In some embodiments, the heating or baking operation (S140, S260, S370, S450) includes heating the resist layer 15 and top layer 25 at a temperature of between about 40° C. and about 250° C. for about 10 seconds to about 10 minutes. The heating or baking operation causes the additive to diffuse from the top layer 25 into the resist layer 15. In some embodiments, the additive diffuses throughout the resist layer 15. In some embodiments, the additive is diffused uniformly throughout the resist layer 15. In other embodiments, the additive diffused into the resist layer forms a concentration gradient that is highest at the resist layer 15/top layer 25 interface.

FIGS. 10A-10D show sequential process stages of an operation to introduce the additive to inhibit or prevent degradation of the resist by radicals into the resist layer 15 according to an embodiment of the disclosure. A resist layer 15 is formed over the substrate 10, as shown in FIG. 10A. The resist layer composition can be any of the compositions disclosed herein and the method of forming the resist layer 15 can be any suitable method disclosed herein. A top layer 25' is subsequently formed over a substrate resist layer, as shown in FIG. 10B. The top layer composition can be any of the compositions disclosed herein without the additive and the method of forming the top layer 25' can be any suitable method disclosed herein. The additive 19 is subsequently added to the top layer 20', as shown in FIG. 10C. The additive 19 is introduced into the top layer 25' to form a top layer 25 with the additive by any of techniques disclosed herein in reference to FIG. 8B. The resist layer 15 and top layer 25 are subsequently heated or baked using a heater 21, as shown in FIG. 10D. In some embodiments, the heater 21 is a resistive heating element, an infrared heating element, or a hot plate. In some embodiments, the heating or baking operation (S140, S260, S370, S450) includes heating the resist layer 15 and top layer 25 at a temperature of between about 40° C. and about 250° C. for about 10 seconds to about 10 minutes. The heating or baking operation causes the additive to diffuse from the top layer 25 into the resist layer 15. In some embodiments, the additive diffuses throughout the resist layer 15. In some embodiments, the additive is diffused uniformly throughout the resist layer 15. In other embodiments, the additive diffused into the resist layer forms a concentration gradient that is highest at the resist layer 15/top layer 25 interface.

FIGS. 11A-11C show sequential process stages of an operation to introduce the additive to inhibit or prevent degradation of the resist by radicals into the resist layer 15 according to an embodiment of the disclosure. A resist layer 15 is formed over the substrate 10, as shown in FIG. 10A. The resist layer composition can be any of the compositions disclosed herein and the method of forming the resist layer 15 can be any suitable method disclosed herein. The additive 19 is introduced directly into the resist layer 15 by any of techniques disclosed herein in reference to FIG. 8B, as shown FIG. 11B. The resist layer 15 is subsequently heated or baked using a heater 21, as shown in FIG. 11C in some embodiments. In some embodiments, the heater 21 is a resistive heating element, an infrared heating element, or a hot plate. In some embodiments, the heating or baking operation includes heating the resist layer 15 at a temperature of between about 40° C. and about 250° C. for about 10 seconds to about 10 minutes. The heating or baking operation causes the additive to diffuse throughout the resist layer 15. In some embodiments, the additive is diffused uniformly throughout the resist layer 15. In other embodiments, the additive diffused into the resist layer forms a concentration gradient from the top of the resist layer to the bottom of the resist layer. Two or more embodiments shown by FIGS. 7A to 11C are combinable, and the detailed description thereof are omitted.

FIGS. 12A-12F illustrate the operation of selectively or patternwise exposing the photoresist layer 15 (see FIGS. 1-5, S150, S270, S340, S440, S540) according to various embodiments of the disclosure. FIG. 12A illustrates exposing a photoresist layer 15 overlying an underlayer 20 to actinic radiation 45 passing through a photomask 30 according to embodiments of the disclosure to form exposed portions 50 and unexposed portions of the photoresist layer 15. FIG. 12B illustrates exposing a photoresist layer 15 having a top layer 25 to actinic radiation 45 passing through a photomask 30 according to embodiments of the disclosure to form exposed portions 50 and unexposed portions 52 of the photoresist layer 15. FIG. 12C illustrates exposing a photoresist layer 15 to actinic radiation 45 passing through a photomask 30 according to embodiments of the disclosure to form exposed portions 50 and unexposed portions 52 of the photoresist layer 15. FIG. 12D illustrates exposing a photoresist layer 15 overlying an underlayer 20 to extreme ultraviolet radiation 97 reflecting off a reflective photomask 65 according to embodiments of the disclosure to form exposed portions 50 and unexposed portions of the photoresist layer 15. FIG. 12E illustrates exposing a photoresist layer 15 having a top layer 25 to extreme ultraviolet radiation 97 reflecting off a reflective photomask 65 according to embodiments of the disclosure to form exposed portions 50 and unexposed portions 52 of the photoresist layer 15. FIG. 12F illustrates exposing a photoresist layer 15 to extreme ultraviolet radiation 97 reflecting off a reflective photomask 65 according to embodiments of the disclosure to form exposed portions 50 and unexposed portions 52 of the photoresist layer 15.

Figure 13B:
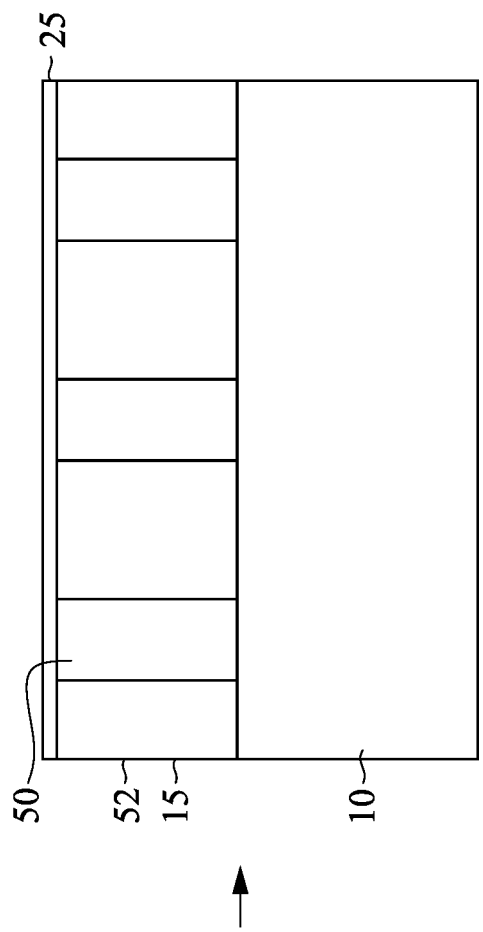
FIGS. 13A and 13B show sequential process stages of an operation according to an embodiment of the disclosure.
Figure 13A:
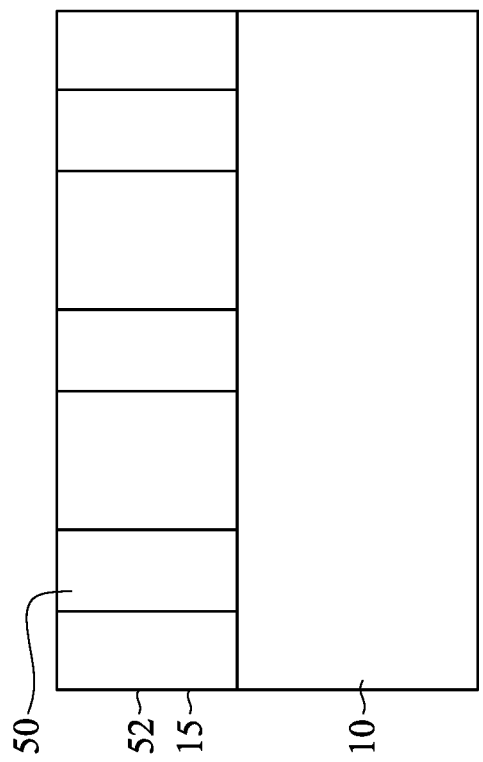
Figure 14B:
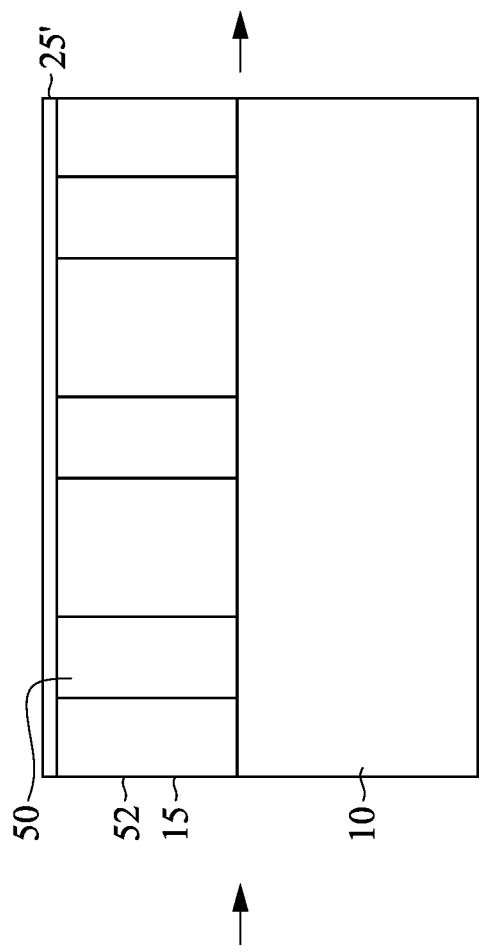
Figure 14A:
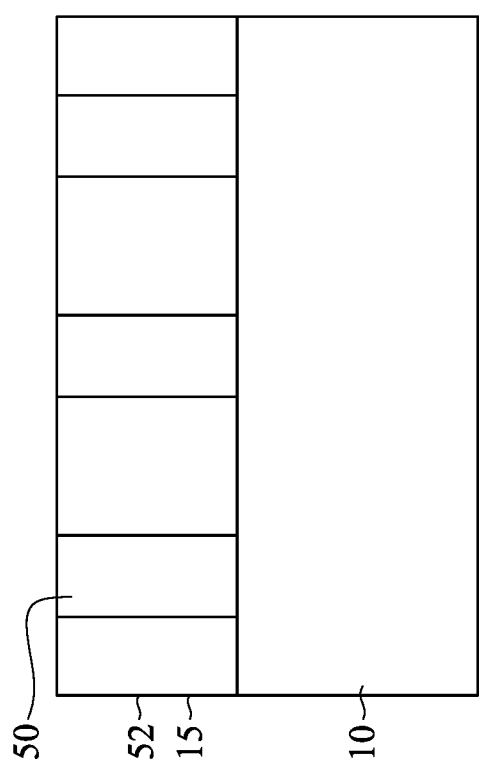

In some other embodiments, the top layer 25 with the additive to inhibit or prevent degradation of the resist by free radicals is formed over the selectively or patternwise exposed photoresist layer 15, as shown in FIGS. 13A and 13B (see FIG. 4, S460). The top layer 25 is formed of any suitable composition and by any suitable method disclosed herein. In some embodiments, the top layer 25' without the additive is formed over the selectively or patternwise exposed photoresist layer, as shown in FIGS. 14A and 14B (see FIG. 3, S350). The additive 19 to inhibit or prevent degradation of the resist by free radicals is subsequently introduced into the top layer 25', as shown in FIG. 14C (see FIG. 3, S360) to form the top layer 25 with the additive, as shown in FIG. 14D. The top layer 25' without the additive is formed of any suitable composition and by any suitable method disclosed herein. The additive 19 is introduced into the top layer 25' by any suitable method disclosed herein.

In some embodiments, the additive 19 to inhibit or prevent degradation of the resist by free radicals is introduced directly into the photoresist layer 15 after selective or patternwise exposure of the photoresist layer, as shown in FIGS. 15A and 15B. The additive 19 is introduced into the selectively or patternwise exposed photoresist layer 15 by any of the techniques disclosed herein in reference to FIG. 8B.

FIGS. 16A-17C illustrate the operation of developing the selectively or patternwise exposed photoresist layer 15 (see FIGS. 1-5, S170, S290, S380, S480, S560) according to various embodiments of the disclosure. FIG. 16A illustrates the development of a photoresist layer selectively or patternwise exposed to actinic radiation disposed over an underlayer 20 using a liquid developer composition 57 dispensed from a dispenser 62. The developer composition and development operation can be any of the suitable developers and operations disclosed herein with reference to operation S170. FIG. 16B illustrates the development of a photoresist layer selectively or patternwise exposed to actinic radiation having a top layer 25 disposed over the photoresist layer 15 using a liquid developer composition 57 dispensed from a dispenser 62. The developer composition and development operation can be any of the suitable developers and operations disclosed herein with reference to operation S170. FIG. 16C illustrates the development of a photoresist layer selectively or patternwise exposed to actinic radiation using a liquid developer composition 58 including the additive to inhibit or prevent degradation of the resist by free radicals dispensed from a dispenser 62. The developer composition 58 includes a solvent and the additive. The solvent can be any of the solvents disclosed herein with reference to S170 and the development operations can be any of the operations disclosed herein with reference to S170. The additive can be any of the additives disclosed herein with reference to FIGS. 20-22B.

FIG. 17A illustrates dry development of the selectively or patternwise exposed photoresist layer 15 overlying the underlayer 20. FIG. 17B illustrates dry development of the selectively or patternwise exposed photoresist layer 15 having a top layer 25. FIG. 17C illustrates dry development of the selectively or patternwise exposed photoresist layer 15 where the additive is introduced directly into the photoresist layer without an underlayer or a top layer. The dry developer composition and dry development operations can be any suitable dry developer composition or dry development operation disclosed herein.

Figure 26B:
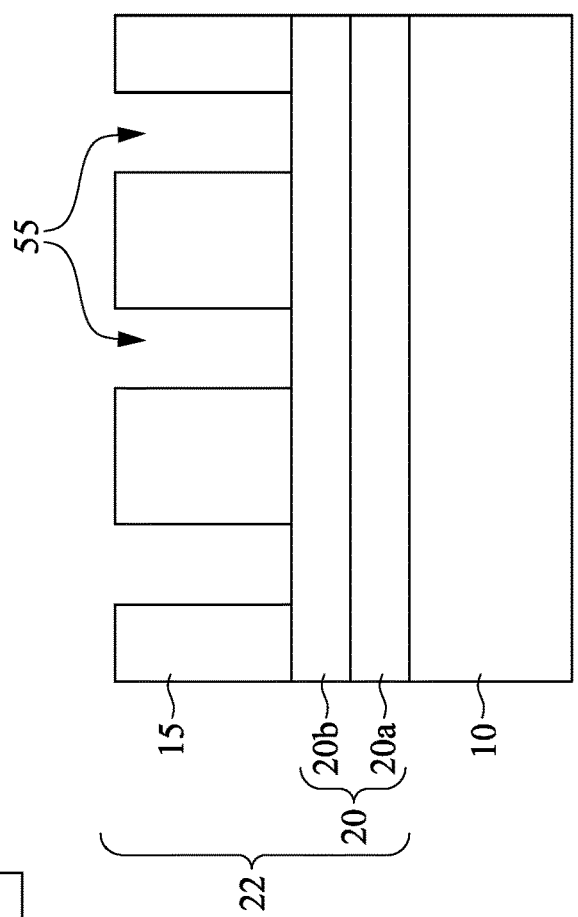
Figure 26A:
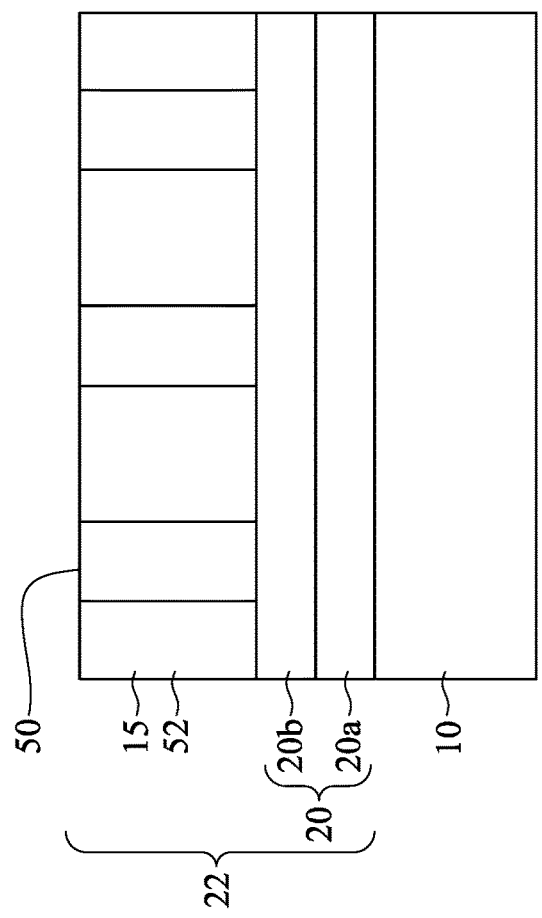

Patterning of a tri-layer resist structure 22 according to some embodiments of the disclosure is illustrated in FIGS. 26A-26E. In some embodiments, an underlayer 20 including a bottom layer 20a and a middle layer 20b of a tri-layer resist structure 22 is formed over a substrate 10. The bottom layer 20a and the middle layer 20b can be made of any of the materials disclosed herein in reference to FIG. 6B. A photoresist layer 15 is subsequently formed over the underlayer and the photoresist layer 15 is selectively exposed to form exposed portions 50 and unexposed portions 52 by any of the photoresist formation and exposure operations disclosed herein, as shown in FIG. 26A.

Figure 26C:
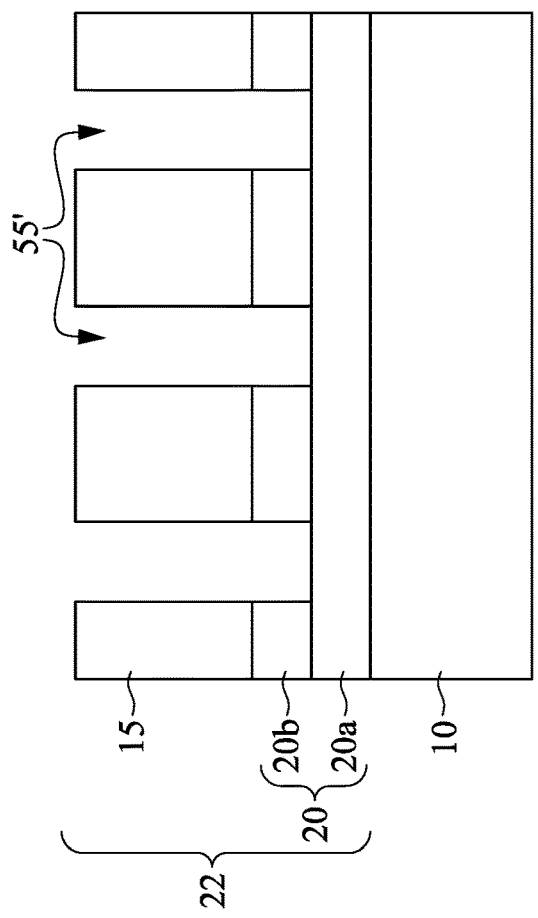
Figure 26D:
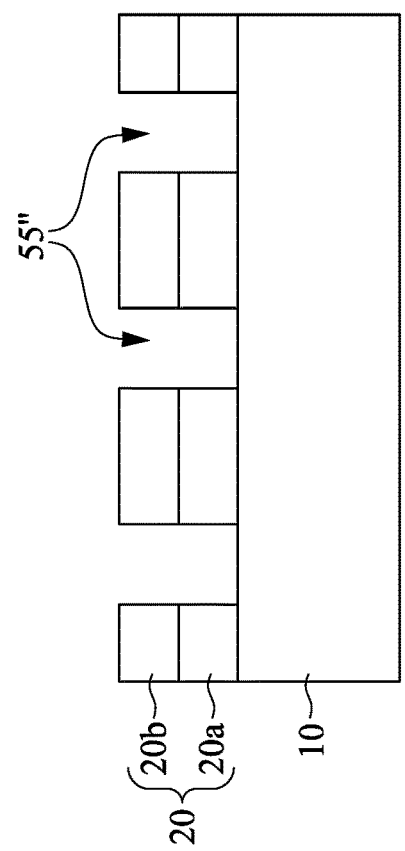

As shown in FIG. 26B, the photoresist layer 15 is subsequently developed by any of the development operations disclosed herein to form a photoresist layer with a pattern 55 exposing the middle layer 20b. In some embodiments, the resist layer 15 is a positive-tone photoresist, as shown in FIG. 26B. In other embodiments, the resist layer 15 is a negative-tone photoresist. Then as shown in FIG. 26C, the pattern 55 in the photoresist layer 15 is transferred to middle layer 20b using an etching operation to expose the bottom layer 20a through the pattern 55' in the middle layer. The photoresist layer is subsequently removed by a suitable photoresist stripping operation, and the pattern 55' in the middle layer 20b is transferred to the bottom layer 20a using a suitable etching operation to expose the substrate 10 through the pattern 55" in the bottom layer 20a, as shown in FIG. 26D. The pattern 55" in the middle layer is subsequently transferred into the substrate 10 using a suitable etching operation to form pattern 55''' in the substrate, and the middle layer 20b and bottom layer 20a are removed by suitable etching operations as shown in FIG. 26E.

In some embodiments, the resist structure 22 includes both an underlayer 20' and a top layer 25, as shown in FIG. 26F. In some embodiments, the underlayer 20' includes a bottom layer 20a and a middle layer 20b. In some embodiments, the underlayer 20' does not contain the additive. In some embodiments including an underlayer 20', the resist structure includes a top layer including the additive.

In other embodiments, both the underlayer 20 and the top layer 25 includes the additive, and when the resist structure is heated, the additive diffuses into the resist layer 15 from both the underlayer 20 and the top layer 25.

Figure 27:
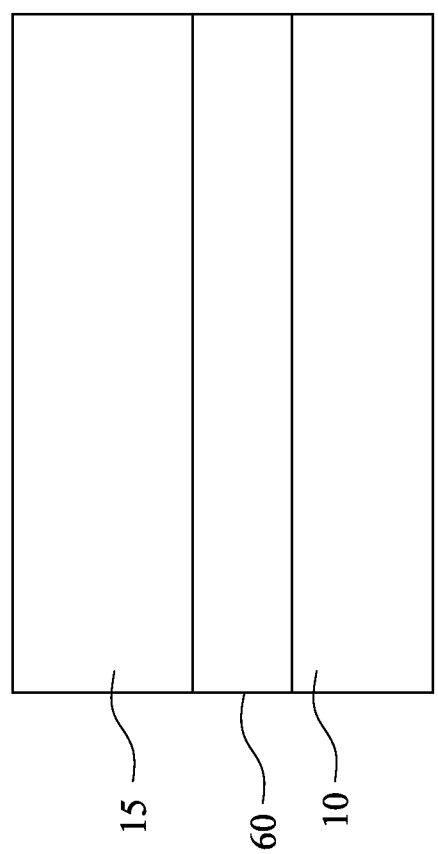
FIG. 27 shows a process stage of a sequential operation according to an embodiment of the disclosure.

In some embodiments, a layer to be patterned (or target layer) 60 is disposed over the substrate prior to forming the resist layer 15, as shown in FIG. 27. In some embodiments, the target layer is a metallization layer or a dielectric layer, such as a passivation layer, disposed over a metallization layer. In embodiments where the target layer 60 is a metallization layer, the target layer 60 is formed of a conductive material using metallization processes, and metal deposition techniques, including chemical vapor deposition, atomic layer deposition, and physical vapor deposition (sputtering). Likewise, if the target layer 60 is a dielectric layer, the target layer 60 is formed by dielectric layer formation techniques, including thermal oxidation, chemical vapor deposition, atomic layer deposition, and physical vapor deposition.

Figure 28:
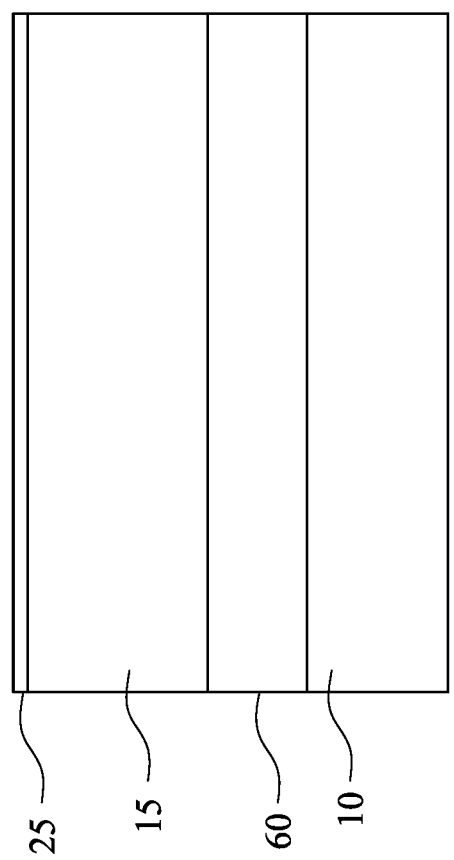
FIG. 28 shows a process stage of a sequential operation according to an embodiment of the disclosure.

A top layer 25 including the additive to inhibit or prevent degradation of the resist layer by free radicals is formed over the resist layer in some embodiments, as shown in FIG. 28. The top layer 25 and the methods for forming the top layer 25 can be any suitable top layer composition and formation methods disclosed herein. In some embodiments, an underlayer 20 including the additive is formed over the target layer prior to forming the resist layer according to any suitable method of forming the underlayer disclosed herein.

Figure 29A:
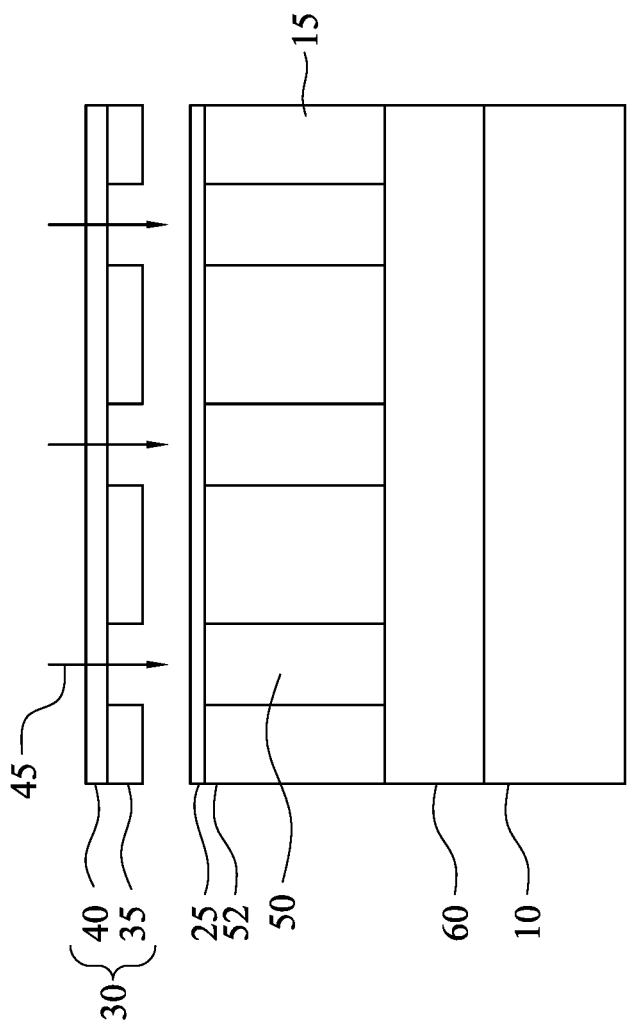
FIGS. 29A and 29B show a process stage of a sequential operation according to embodiments of the disclosure.
Figure 29B:
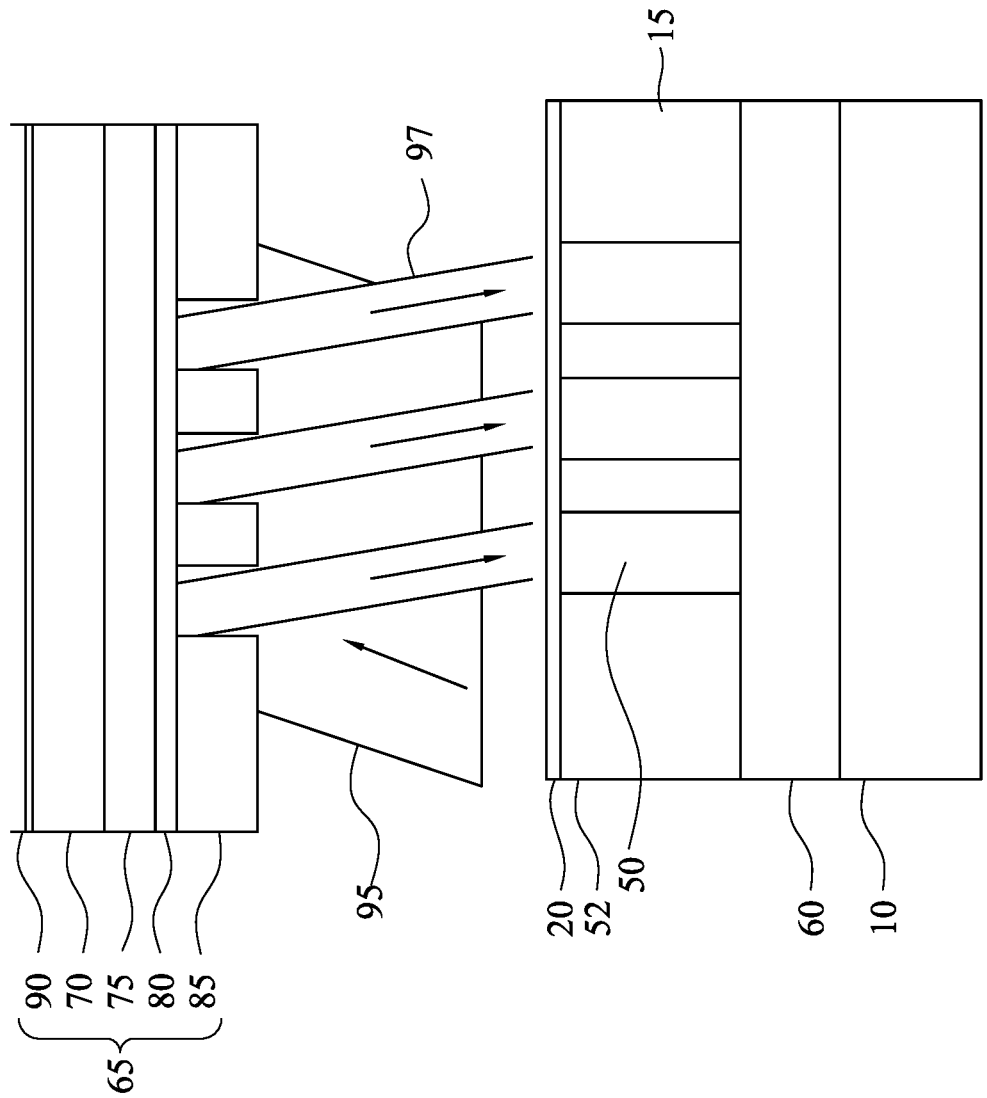

FIGS. 29A and 29B illustrate embodiments of selectively exposing the top layer 25 and photoresist layer 15 to actinic radiation 45/97. The exposure can be by any of the exposure operations disclosed herein in reference to operations S150, S270, S340, S440, and S540.

Figure 30B:
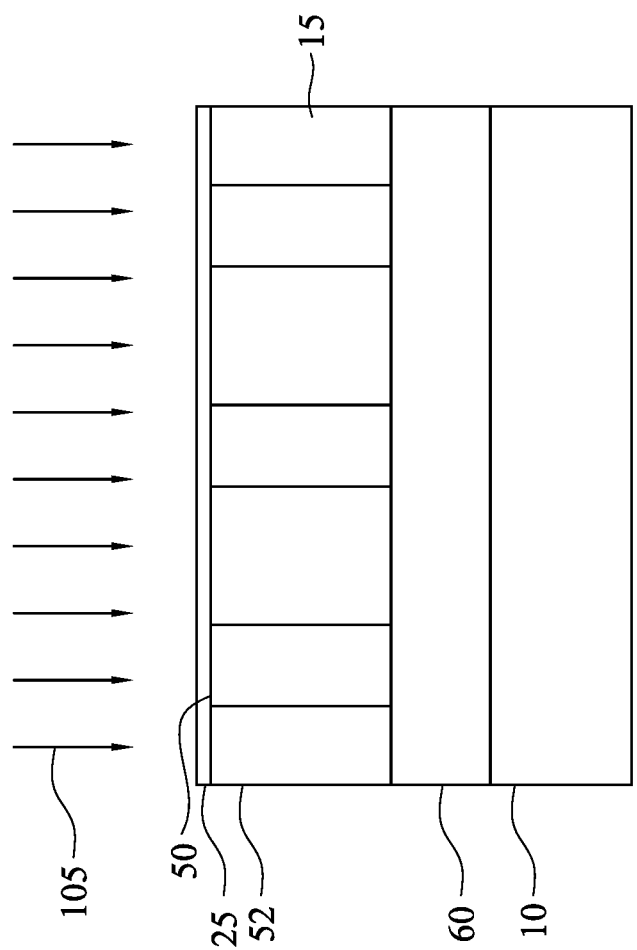
Figure 31:
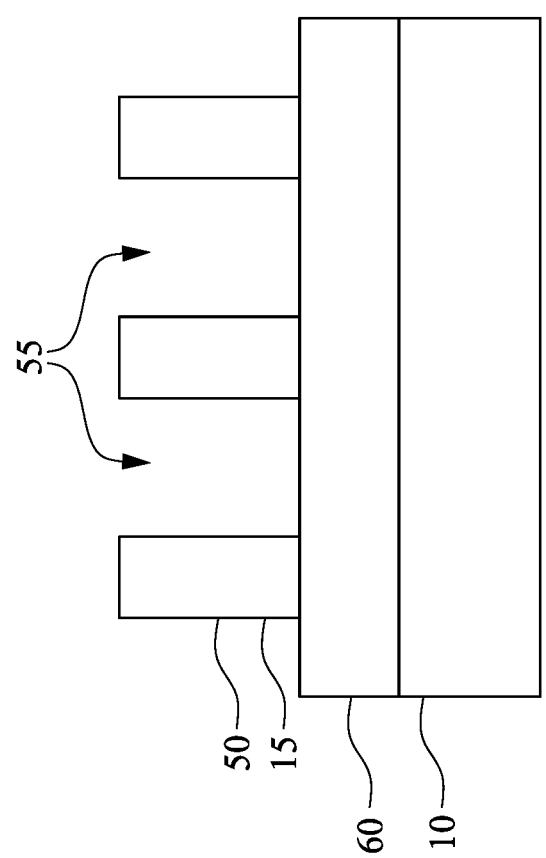
FIG. 31 shows a process stage of a sequential operation according to an embodiment of the disclosure.

As shown in FIGS. 30A and 30B, the photoresist layer is subsequently developed by any of development operations disclosed herein to form a photoresist layer with a pattern 55 exposing the target layer 60 are developed, as explained herein in reference to operations S170, S290, S380, S480, S560 to form a pattern of photoresist openings 55 exposing the target layer 60, as shown in FIG. 31. FIG. 30A illustrates a liquid development operation, and FIG. 30B illustrates a dry development operation. As shown in FIG. 31, in some embodiments, the resist is a negative-tone resist, wherein the exposed portions 50 of the photoresist remain after development. In other embodiments, the resist is a positive-tone resist.

Then, as shown in FIG. 32, the pattern 55 in the photoresist layer 15 is transferred to the target layer 60 using an etching operation and the photoresist layer is removed to form pattern 55' in the target layer.

Embodiments of the disclosure include resist structures including: an underlayer with the additive, a bi-layer underlayer including a bottom layer and a middle layer with the additive in the middle layer, a top layer with the additive, both an underlayer with the additive and a top layer with the additive, an underlayer without the additive and a top layer with the additive, a bi-layer underlayer with no additive and a top layer with the additive, and no underlayer and top layer.

Other embodiments include other operations before, during, or after the operations described above. In some embodiments, the disclosed methods include forming fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD)

layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

The novel treatment of the resist layer with the additive according to embodiments of the disclosure inhibits or prevents degradation of the resist layer by free radicals, such as hydrogen radicals. Embodiments, according to the present disclosure provide higher semiconductor device feature resolution and density at higher wafer exposure throughput with reduced defects in a higher efficiency process than conventional exposure techniques. Embodiments of the disclosure provide over a 3% improvement in line width roughness and critical dimension uniformity over comparable semiconductor manufacturing methods not employing the disclosed additive treatment of the resist layer. Moreover, embodiments of the present disclosure provide over a 5% reduction in defects, and allow photolithographic exposure dose to be reduced by over 3%. In some embodiments, the methods according to the disclosure forms resist patterns with a pitch of less than about 40 nm. In some embodiments, the line width roughness of resist patterns formed according to this disclosure is less than about 5.0 nm, and an exposure dose to form such patterns is less than about 70 mj.

An embodiment of the disclosure is a method for manufacturing a semiconductor device, including forming a resist structure including forming a resist layer including a resist composition over a substrate. After forming the resist layer, the resist layer is treated with an additive. The additive is one or more selected from the group consisting of a radical inhibitor, a thermal radical initiator, and a photo radical initiator. In an embodiment, the resist composition includes a metal. In an embodiment, the resist composition includes an organometallic compound. In an embodiment, the forming the resist structure includes forming an underlayer including an underlayer composition over the substrate before forming the resist layer, wherein the underlayer composition comprises the additive, and during the treating the resist layer with an additive, the additive diffuses from the underlayer to the resist layer. In an embodiment, the forming the resist structure includes forming a top layer including a top layer composition over the resist layer after forming the resist layer, wherein the top layer composition includes the additive, and during the treating the resist layer with an additive, the additive diffuses from the top layer to the resist layer. In an embodiment, the forming the resist structure includes forming a tri-layer resist structure including: forming a bottom layer over the substrate, forming a middle layer over the bottom layer, and forming an upper layer over the middle layer, wherein the upper layer is the resist layer. In an embodiment, the middle layer includes the additive, and during the treating the resist layer with an additive, the additive diffuses from the middle layer to the resist layer. In an embodiment, the forming the resist structure includes forming a top layer over the upper layer, the top layer includes the additive, and during the treating the resist layer with an additive, the additive diffuses from the top layer to the resist layer. In an embodiment, the bottom layer includes an organic polymer and the middle layer includes a silicon-containing compound. In an embodiment, the method includes selectively exposing the resist layer to actinic radiation, and applying a developer to the resist layer after selectively exposing the resist layer to actinic radiation. In an embodiment, the treating the resist layer with an additive includes applying the developer, and the developer includes the additive.

Another embodiment of the disclosure is a method for manufacturing a semiconductor device, including forming a metal-containing resist layer over a substrate. A first layer is formed over the substrate before forming the metal-containing resist layer or over the metal-containing resist layer after forming the metal-containing resist layer. An additive is diffused from the first layer into the metal-containing resist layer. The additive is one or more selected from the group consisting of a radical inhibitor, a thermal radical initiator, and a photo radical initiator. In an embodiment, the diffusing the additive from the first layer into the metal-containing resist layer includes heating the first layer and the metal-containing resist layer. In an embodiment, the additive is added to the first layer by one or more of mixing it in a first layer composition before forming the first layer, treating the first layer with a solvent mixture including the additive, doping the first layer with the additive, diffusing the additive from a vapor containing the additive into the first layer, or copolymerizing the additive with the first layer.

Another embodiment of the disclosure is a method for manufacturing a semiconductor device, including forming photoresist layer over a substrate. The photoresist layer includes a metallic photoresist composition. A top layer is formed over the photoresist layer. The top layer includes a polymer and a free radical-inhibiting compound. The photoresist layer is exposed to actinic radiation. The patternwise exposed photoresist layer is developed to form a pattern in the photoresist layer. In an embodiment, the method includes forming an underlayer over the substrate before forming the photoresist layer. In an embodiment, the top layer is formed by coating the photoresist layer with a top layer composition comprising a solvent and the free radical-inhibiting compound. In an embodiment, the top layer is formed by a vapor phase deposition over the photoresist layer. In an embodiment, the method includes heating the top layer to diffuse the free radical-inhibiting compound from the top layer into the photoresist layer. In an embodiment, the free radical-inhibiting compound is one or more selected from the group consisting of a radical inhibitor, a thermal radical initiator, and a photo radical initiator.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a resist structure including forming a resist layer comprising a resist composition over a substrate;
   selectively exposing the resist layer to actinic radiation;
   after selectively exposing the resist layer to actinic radiation, treating the resist layer with an additive,
   wherein the treating the resist layer with an additive further comprises forming a top layer comprising a top layer composition over an entire upper surface of the selectively exposed resist layer,
   wherein the top layer composition comprises the additive, and
   wherein the additive is one or more selected from the group consisting of a radical inhibitor, a thermal radical initiator, and a photo radical initiator; and
   after treating the resist layer with the additive, developing the resist layer.

2. The method according to claim 1, wherein the resist composition includes a metal.

3. The method according to claim 1, wherein the resist composition includes an organometallic compound.

4. The method according to claim 1, wherein the forming the resist structure further comprises forming an underlayer comprising an underlayer composition over the substrate before forming the resist layer,
   wherein the underlayer composition comprises the additive, and
   the additive diffuses from the underlayer to the resist layer.

5. The method according to claim 1, wherein
   during the treating the resist layer with an additive, the additive diffuses from the top layer to the resist layer.

6. The method according to claim 1, wherein the forming the resist structure comprises forming a tri-layer resist structure including:
   forming a bottom layer over the substrate;
   forming a middle layer over the bottom layer; and
   forming an upper layer over the middle layer, wherein the upper layer is the resist layer.

7. The method according to claim 6, wherein the middle layer further includes the additive, and the additive diffuses from the middle layer to the resist layer.

8. The method according to claim 6, wherein the bottom layer comprises an organic polymer and the middle layer comprises a silicon-containing compound.

9. The method according to claim 1,
   wherein the developing the resist layer comprises applying a developer to the resist layer.

10. The method according to claim 9, wherein the developer includes the additive.

11. A method for manufacturing a semiconductor device, comprising:
    forming a metal-containing resist layer over a substrate;
    selectively exposing the metal-containing resist layer to actinic radiation;
    forming a first layer over actinic radiation exposed and unexposed regions of the metal-containing resist layer after selectively exposing the metal-containing resist layer to actinic radiation;
    diffusing an additive from the first layer into the metal-containing resist layer, wherein the additive is one or more selected from the group consisting of a radical inhibitor, a thermal radical initiator, and a photo radical initiator; and
    applying a developer to the selectively exposed metal-containing resist layer after diffusing the additive.

12. The method according to claim 11, wherein the diffusing the additive from the first layer into the metal-containing resist layer comprises heating the first layer and the metal-containing resist layer.

13. The method according to claim 11, wherein the additive is added to the first layer by one or more selected from mixing the additive in a first layer composition before forming the first layer, treating the first layer with a solvent mixture including the additive, doping the first layer with the additive, diffusing the additive from a vapor containing the additive into the first layer, or copolymerizing the additive with the first layer.

14. A method for manufacturing a semiconductor device, comprising:
    forming photoresist layer over a substrate,
    wherein the photoresist layer comprises a metallic photoresist composition;
    patternwise exposing the photoresist layer to actinic radiation;
    forming a top layer over actinic radiation exposed and unexposed regions of the patternwise exposed photoresist layer, wherein the top layer comprises a polymer and a free radical-inhibiting additive; and
    developing the patternwise exposed photoresist layer to form a pattern in the photoresist layer after forming the top layer.

15. The method according to claim 14, further comprising forming an underlayer over the substrate before forming the photoresist layer.

16. The method according to claim 14, wherein the top layer is formed by coating the photoresist layer with a top layer composition comprising a solvent, the polymer, and the free radical-inhibiting additive.

17. The method according to claim 14, wherein the top layer is formed by a vapor phase deposition over the photoresist layer.

18. The method according to claim 14, further comprising heating the top layer to diffuse the free radical-inhibiting additive from the top layer into the photoresist layer.

19. The method according to claim 14, wherein the free radical-inhibiting additive is one or more selected from the group consisting of a radical inhibitor, a thermal radical initiator, and a photo radical initiator.

20. The method according to claim 11, wherein the metal-containing resist layer includes an organometallic compound.

* * * * *